United States Patent
Arditi et al.

(10) Patent No.: US 9,401,439 B2
(45) Date of Patent: Jul. 26, 2016

(54) ENHANCED SYSTEMS AND METHODS FOR USING A POWER CONVERTER FOR BALANCING MODULES IN SINGLE-STRING AND MULTI-STRING CONFIGURATIONS

(75) Inventors: Shmuel Arditi, Los Gatos, CA (US); Maxym Makhota, Campbell, CA (US)

(73) Assignee: TIGO ENERGY, INC., Los Gatos, CA (US)

( * ) Notice: Subject to any disclaimer, the term of this patent is extended or adjusted under 35 U.S.C. 154(b) by 443 days.

(21) Appl. No.: 12/612,641

(22) Filed: Nov. 4, 2009

(65) Prior Publication Data

US 2012/0255591 A1     Oct. 11, 2012

Related U.S. Application Data

(60) Provisional application No. 61/273,931, filed on Aug. 10, 2009, provisional application No. 61/273,932, filed on Aug. 10, 2009.

(51) Int. Cl.
*H02J 1/00*     (2006.01)
*H01L 31/02*     (2006.01)
*H02J 3/38*     (2006.01)

(52) U.S. Cl.
CPC ............. *H01L 31/02021* (2013.01); *H02J 1/00* (2013.01); *H02J 3/382* (2013.01); *H02J 3/383* (2013.01); *H02J 3/385* (2013.01); *H02J 3/386* (2013.01); *H02J 3/387* (2013.01);
(Continued)

(58) Field of Classification Search
CPC ........................................................... H02J 1/00
USPC .......... 307/43, 51–52, 63, 71–72, 75, 82, 151
See application file for complete search history.

(56) References Cited

U.S. PATENT DOCUMENTS

| | | |
|---|---|---|
| 3,696,286 A | 10/1972 | Ule |
| 4,580,090 A | 4/1986 | Bailey et al. |
| 4,604,567 A | 8/1986 | Chetty |

(Continued)

FOREIGN PATENT DOCUMENTS

| | | |
|---|---|---|
| AU | 2005262278 | 7/2005 |
| DE | 4232356 | 3/1994 |

(Continued)

OTHER PUBLICATIONS

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

(Continued)

*Primary Examiner* — Adi Amrany
(74) *Attorney, Agent, or Firm* — Greenberg Traurig LLP

(57) ABSTRACT

Apparatuses and methods include a solar array having one or more string buses of series-connected solar modules. The current outputs from the solar modules on each string bus can be balanced along with the voltage output from the string buses. Local management units coupled between the solar modules and the string buses are configured to control the voltage output from each solar module. When the solar modules on each string are balanced, and when the string buses are balanced (or before the solar modules and string buses are balanced), an inverter or other device connected to the solar array can find the array's maximum power point via a maximum power point tracking algorithm.

13 Claims, 36 Drawing Sheets

(52) U.S. Cl.
CPC .............. *Y02E 10/563* (2013.01); *Y02E 10/58* (2013.01); *Y02E 10/763* (2013.01)

(56) References Cited

U.S. PATENT DOCUMENTS

| | | | |
|---|---|---|---|
| 4,873,480 A | 10/1989 | Lafferty | |
| 5,027,051 A | 6/1991 | Lafferty | |
| 5,144,222 A | 9/1992 | Herbert | |
| 5,235,266 A | 8/1993 | Schaffrin | |
| 5,268,832 A | 12/1993 | Kandatsu | |
| 5,327,071 A | 7/1994 | Frederick et al. | |
| 5,504,418 A | 4/1996 | Ashley | |
| 5,604,430 A | 2/1997 | Decker et al. | |
| 5,648,731 A | 7/1997 | Decker et al. | |
| 5,747,967 A | 5/1998 | Muljadi et al. | |
| 5,923,158 A | 7/1999 | Kurokami et al. | |
| 5,932,994 A | 8/1999 | Jo et al. | |
| 6,275,016 B1 | 8/2001 | Ivanov | |
| 6,281,485 B1* | 8/2001 | Siri | 250/203.4 |
| 6,448,489 B2 | 9/2002 | Kimura et al. | |
| 6,650,031 B1 | 11/2003 | Goldack | |
| 6,844,739 B2 | 1/2005 | Kasai et al. | |
| 6,894,911 B2 | 5/2005 | Telefus et al. | |
| 6,919,714 B2 | 7/2005 | Delepaut | |
| 6,984,970 B2 | 1/2006 | Capel | |
| 6,987,444 B2 | 1/2006 | Bub et al. | |
| 7,061,214 B2 | 6/2006 | Mayega | |
| 7,068,017 B2 | 6/2006 | Willner et al. | |
| 7,248,946 B2 | 7/2007 | Bashaw et al. | |
| 7,256,566 B2 | 8/2007 | Bhavaraju et al. | |
| 7,259,474 B2 | 8/2007 | Blanc | |
| 7,276,886 B2 | 10/2007 | Kinder | |
| 7,336,004 B2 | 2/2008 | Lai | |
| 7,378,820 B2 | 5/2008 | Liu et al. | |
| 7,394,237 B2 | 7/2008 | Chou et al. | |
| 7,462,955 B2 | 12/2008 | McNamara | |
| 7,518,266 B2 | 4/2009 | Eckroad | |
| 7,518,346 B2 | 4/2009 | Prexl | |
| 7,538,451 B2 | 5/2009 | Nomoto | |
| 7,545,053 B2 | 6/2009 | Yoshikawa | |
| 7,560,906 B2 | 7/2009 | Liu et al. | |
| 7,595,616 B2 | 9/2009 | Prexl | |
| 7,602,080 B1* | 10/2009 | Hadar et al. | 307/20 |
| 7,605,498 B2 | 10/2009 | Ledenev et al. | |
| 7,709,727 B2* | 5/2010 | Roehrig et al. | 136/243 |
| 7,719,140 B2 | 5/2010 | Ledenev et al. | |
| 7,839,022 B2 | 11/2010 | Wolfs | |
| 7,900,361 B2 | 3/2011 | Adest et al. | |
| 7,969,133 B2* | 6/2011 | Zhang et al. | 323/283 |
| 8,013,472 B2 | 9/2011 | Adest et al. | |
| 8,058,747 B2* | 11/2011 | Avrutsky et al. | 307/43 |
| 8,058,752 B2* | 11/2011 | Erickson et al. | 307/150 |
| 8,093,757 B2 | 1/2012 | Wolfs | |
| 8,102,074 B2 | 1/2012 | Hadar et al. | |
| 8,138,631 B2* | 3/2012 | Allen et al. | 307/82 |
| 8,212,408 B2* | 7/2012 | Fishman | 307/77 |
| 8,212,409 B2* | 7/2012 | Bettenwort et al. | 307/82 |
| 8,279,644 B2* | 10/2012 | Zhang et al. | 363/55 |
| 8,314,375 B2* | 11/2012 | Arditi et al. | 250/203.4 |
| 8,344,548 B2 | 1/2013 | Stern | |
| 8,686,333 B2 | 4/2014 | Arditi et al. | |
| 8,860,246 B2 | 10/2014 | Hadar et al. | |
| 8,963,518 B2 | 2/2015 | Wolfs | |
| 9,142,965 B2 | 9/2015 | Grana | |
| 2001/0038277 A1 | 11/2001 | Burstein et al. | |
| 2004/0223351 A1 | 11/2004 | Kurokami et al. | |
| 2005/0057214 A1 | 3/2005 | Matan | |
| 2005/0057215 A1 | 3/2005 | Matan | |
| 2005/0105224 A1* | 5/2005 | Nishi | 361/18 |
| 2005/0121067 A1 | 6/2005 | Toyomura et al. | |
| 2005/0139258 A1 | 6/2005 | Liu et al. | |
| 2005/0172995 A1* | 8/2005 | Rohrig et al. | 136/243 |
| 2006/0001406 A1 | 1/2006 | Matan | |
| 2006/0017327 A1* | 1/2006 | Siri et al. | 307/43 |
| 2006/0162772 A1 | 7/2006 | Presher, Jr. et al. | |
| 2006/0174939 A1 | 8/2006 | Matan | |
| 2006/0185727 A1 | 8/2006 | Matan | |
| 2007/0019613 A1 | 1/2007 | Frezzolini | |
| 2007/0211888 A1 | 9/2007 | Corcoran et al. | |
| 2007/0273351 A1 | 11/2007 | Matan | |
| 2008/0030305 A1 | 2/2008 | O'Connor | |
| 2008/0036440 A1 | 2/2008 | Garmer | |
| 2008/0097655 A1 | 4/2008 | Hadar et al. | |
| 2008/0106241 A1 | 5/2008 | Deaver et al. | |
| 2008/0121272 A1 | 5/2008 | Besser et al. | |
| 2008/0122449 A1 | 5/2008 | Besser et al. | |
| 2008/0122518 A1 | 5/2008 | Besser et al. | |
| 2008/0143188 A1 | 6/2008 | Adest et al. | |
| 2008/0147335 A1* | 6/2008 | Adest et al. | 702/64 |
| 2008/0150366 A1* | 6/2008 | Adest et al. | 307/77 |
| 2008/0164766 A1* | 7/2008 | Adest et al. | 307/80 |
| 2008/0179949 A1 | 7/2008 | Besser et al. | |
| 2008/0191560 A1 | 8/2008 | Besser et al. | |
| 2008/0191675 A1 | 8/2008 | Besser et al. | |
| 2008/0238372 A1 | 10/2008 | Cintra et al. | |
| 2008/0272653 A1 | 11/2008 | Inoue et al. | |
| 2008/0303503 A1 | 12/2008 | Wolfs | |
| 2009/0059630 A1 | 3/2009 | Williams | |
| 2009/0242522 A1 | 10/2009 | Baird et al. | |
| 2009/0284232 A1 | 11/2009 | Zhang et al. | |
| 2009/0284240 A1* | 11/2009 | Zhang et al. | 323/285 |
| 2010/0127570 A1* | 5/2010 | Hadar et al. | 307/77 |
| 2010/0127571 A1 | 5/2010 | Hadar et al. | |
| 2010/0132757 A1 | 6/2010 | He et al. | |
| 2010/0133911 A1* | 6/2010 | Williams et al. | 307/82 |
| 2010/0277001 A1* | 11/2010 | Wagoner | 307/82 |
| 2010/0327659 A1* | 12/2010 | Lisi et al. | 307/82 |
| 2011/0025130 A1 | 2/2011 | Hadar et al. | |
| 2011/0062784 A1 | 3/2011 | Wolfs | |
| 2011/0210610 A1 | 9/2011 | Mitsuoka et al. | |
| 2011/0245989 A1* | 10/2011 | Makhota et al. | 700/297 |
| 2012/0044014 A1* | 2/2012 | Stratakos et al. | 327/530 |
| 2012/0080955 A1 | 4/2012 | Fishman et al. | |
| 2012/0119584 A1 | 5/2012 | Hadar et al. | |
| 2012/0146420 A1 | 6/2012 | Wolfs | |
| 2012/0240490 A1 | 9/2012 | Gangemi | |
| 2012/0253541 A1* | 10/2012 | Arditi et al. | 700/298 |
| 2013/0026839 A1* | 1/2013 | Grana | 307/71 |
| 2013/0026840 A1* | 1/2013 | Arditi et al. | 307/77 |
| 2013/0026842 A1* | 1/2013 | Arditi et al. | 307/82 |
| 2013/0026843 A1* | 1/2013 | Arditi et al. | 307/82 |
| 2015/0028683 A1 | 1/2015 | Hadar et al. | |
| 2015/0168984 A1 | 6/2015 | Wolfs | |
| 2015/0357821 A1 | 12/2015 | Grana | |

FOREIGN PATENT DOCUMENTS

| | | |
|---|---|---|
| DE | 19961705 | 7/2001 |
| DE | 10136147 | 2/2003 |
| EP | 0178757 | 4/1986 |
| EP | 1388774 | 2/2004 |
| ES | 2249147 | 3/2006 |
| JP | 07016552 | 3/1995 |
| JP | 11046457 | 2/1999 |
| JP | 11103538 | 4/1999 |
| JP | 2000166097 | 4/2008 |
| WO | 03012569 | 2/2003 |
| WO | 2005069096 | 7/2005 |
| WO | 2005112551 | 12/2005 |
| WO | 2006005125 | 1/2006 |
| WO | 2008097591 | 8/2008 |
| WO | 2008125915 | 10/2008 |
| WO | 2008132553 | 11/2008 |
| WO | 2010062662 | 6/2010 |

OTHER PUBLICATIONS

Quaschning, V. et al., "Cost Effectiveness of Shadow Tolerant Photovoltaic Systems," Euronsun 96, pp. 819-824, Sep. 16, 1996.

Uriarte, S. et al., "Energy Integrated Management System for PV Applications," 20th European Photovoltaic Solar Energy Conference, Jun. 6, 2005.

(56) References Cited

OTHER PUBLICATIONS

Walker, G. R. et al., "Cascaded DC-DC Converter Connection of Photovoltaic Modules," 33rd IEEE Power Electronics Specialists Conference (PESC'02), vol. 1, pp. 24-29, 2002.

Alonso, R. et al., "A New Distributed Converter Interface for PV Panels," 20th European Photovoltaic Solar Energy Conference, Barcelona, Spain, pp. 2288-2291, Jun. 6-10, 2005.

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Roman, Eduardo, et al., "Intelligent PV Module for Grid-Connectred PV Systems," IEEE Transactions on Industrial Electronics, vol. 53, No. 4, pp. 1066-1073, Aug. 2006.

Walker, Jeffrey R. et al., "Cascaded DC-DC Converter Connection of Photovoltaic Modules," IEEE Transactions on Power Electronics, vol. 19, No. 4, pp. 1130-1139, Jul. 2004.

International Patent Application No. PCT/US2009/047734, International Search Report, mailed May 4, 2010.

European Patent Application No. 09829487.9, Extended Search Report, Apr. 21, 2011.

International Application No. PCT/US12/44045, International Preliminary Examination Report, Feb. 6, 2014.

International Patent Application No. PCT/AU2005/001017, International Search Report and Written Opinion, Aug. 18, 2005.

International Patent Application No. PCT/US2009/062536, International Search Report & Written Opinion, Jun. 17, 2010.

International Patent Application No. PCT/US2010/029915, International Search Report and Written Opinion, Oct. 21, 2010.

International Patent Application No. PCT/US2012/044045, International Search Report and Written Opinion, Jan. 2, 2013.

Title: Systems and Methods to Balance Solar Panels in a Multi-panel System, U.S. Appl. No. 14/512,786, filed Oct. 13, 2014, Inventor(s): Ron Hadar, et al., Status: Application Dispatched from Preexam, Not yet Docketed, Status Date: Oct. 17, 2014.

Title: Device for Distributed Maximum Power Tracking for Solar Arrays, U.S. Appl. No. 13/316,388, filed Dec. 9, 2011, Inventor(s): Peter Wolfs, Status: Notice of Allowance Mailed—Application Received in Office of Publications, Status Date: Oct. 14, 2014.

Title: Systems and Methods to Combine Strings of Solar Panels, U.S. Appl. No. 13/332,299, filed Dec. 20, 2011, Inventor(s): Paul Grana, Status: Docketed New Case—Ready for Examination, Status Date: May 17, 2012.

Title: Systems and Methods to Reduce the Number and Cost of Management Units of Distributed Power Generators, U.S. Appl. No. 13/346,482, filed Jan. 9, 2012, Inventor(s): Shmuel Arditi, et al., Status: Docketed New Case—Ready for Examination, Status Date: Mar. 6, 2012.

Title: Enhanced Systems and Method for String-balancing, U.S. Appl. No. 13/418,279, filed Mar. 12, 2012, Inventor(s): Shmuel Arditi, et al., Status: Non Final Action Mailed, Status Date: Aug. 29, 2014.

* cited by examiner

ENHANCED SYSTEMS AND METHODS FOR USING A POWER CONVERTER FOR BALANCING MODULES IN SINGLE-STRING AND MULTI-STRING CONFIGURATIONS

CROSS-REFERENCE TO RELATED APPLICATIONS

The present application claims the benefit of Provisional U.S. Application Ser. No. 61/273,931, filed Aug. 10, 2009, entitled, "ENHANCED SYSTEMS AND METHODS FOR USING A POWER CONVERTER FOR BALANCING PANELS IN SINGLE-STRING AND MULTI-STRING CONFIGURATIONS," and Provisional U.S. Application Ser. No. 61/273,932, filed Aug. 10, 2009, entitled, "ENHANCED SYSTEMS AND METHODS FOR USING A POWER CONVERTER FOR BALANCING PANELS IN SINGLE-STRING AND MULTI-STRING CONFIGURATIONS." Both applications are incorporated herein by reference.

The following applications are also incorporated herein by reference: U.S. patent application Ser. No. 12/506,929, filed Jul. 21, 2009 and titled "SYSTEMS AND METHODS FOR USING A POWER CONVERTER FOR TRANSMISSION OF DATA OVER THE POWER FEED," and U.S. patent application Ser. No. 12/411,317, filed Mar. 25, 2009 and titled "SYSTEMS AND METHODS TO BALANCE SOLAR PANELS IN A MULTI-PANEL SYSTEM."

FIELD OF THE TECHNOLOGY

At least some embodiments of the disclosure relate to photovoltaic systems in general, and more particularly but not limited to, improving the energy production performance of photovoltaic systems.

BACKGROUND

A traditional maximum power point tracking (MPPT) algorithm sees a solar array as if it were a single solar module (MPPT may pull and push current on all string buses and solar modules in a solar array in an equivalent fashion). As such, if solar modules in the solar array operate at different working points on the I-V curve, due to differences in installation, fabrication, or degradation over time, then an MPPT algorithm may not be able to find the maximum power point (MPP) for the solar array.

SUMMARY OF THE DESCRIPTION

Systems and methods in accordance with the present invention are described herein. Some embodiments are summarized in this section.

In one embodiment, a solar array is described. The solar array may comprise one or more string buses of series-connected solar modules. Each solar module may produce a current, and each string bus may produce a voltage. The solar array may also comprise a controller. The controller may be configured to balance the currents produced by the solar modules in each string. The controller may also be configured to balance the voltages produced by the strings in the solar array.

In another embodiment, a method is described comprising balancing currents produced by solar modules in each of one or more string buses of a solar array, and balancing voltages produced by the one or more string buses of the solar array.

In another embodiment, a solar array is described. The solar array may comprise a string of series-connected solar modules, each solar module producing a current. The solar array may also include a controller configured to balance the currents produced by the solar modules.

Other embodiments and features of the present invention will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

When solar modules are connected in series or mesh configuration, there can be a problem in which weaker modules not only produce less energy but also affect other modules in the same string or wiring section. By measuring one can determine that a few modules are weaker than the others in most commercially installed strings. Thus, the string is generating less power than the sum available at each module if modules were operated separately.

At least one embodiment of the present disclosure provides methods and systems to switch on and off weak modules in the string in a way that the current on the string bus from the good modules won't be affected by the weak modules.

The present invention allows transmission of data from solar modules to a central (or system controller management) unit and other local management units in an energy production or photovoltaic system without adding significant cost. One embodiment of the present invention involves using the typically undesired electrical noise produced when operating local management units (sometimes referred to as "controllers" or "converters") to act as a carrier system for data to be transferred. As there are a multitude of solar modules, each can be run on a slightly different frequency. Such an approach allows a receiver in the energy production or photovoltaic system to identify the carrier signal of each local management unit separately. This approach has the added benefit of reducing the overall system noise, because each local management unit sends "noise energy" in a different part of the spectrum, thus helping to avoid peaks.

Figure 1:
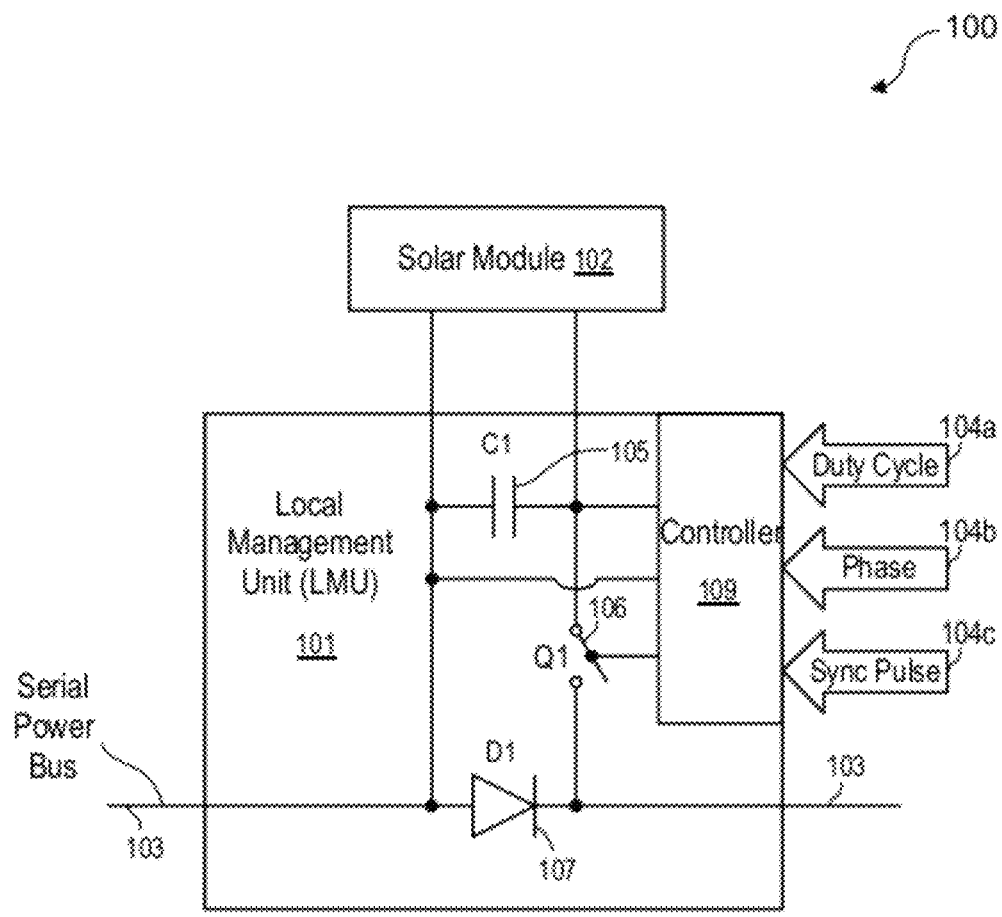
FIGS. 1-3A illustrate local management units according to some embodiments.
Figure 2:
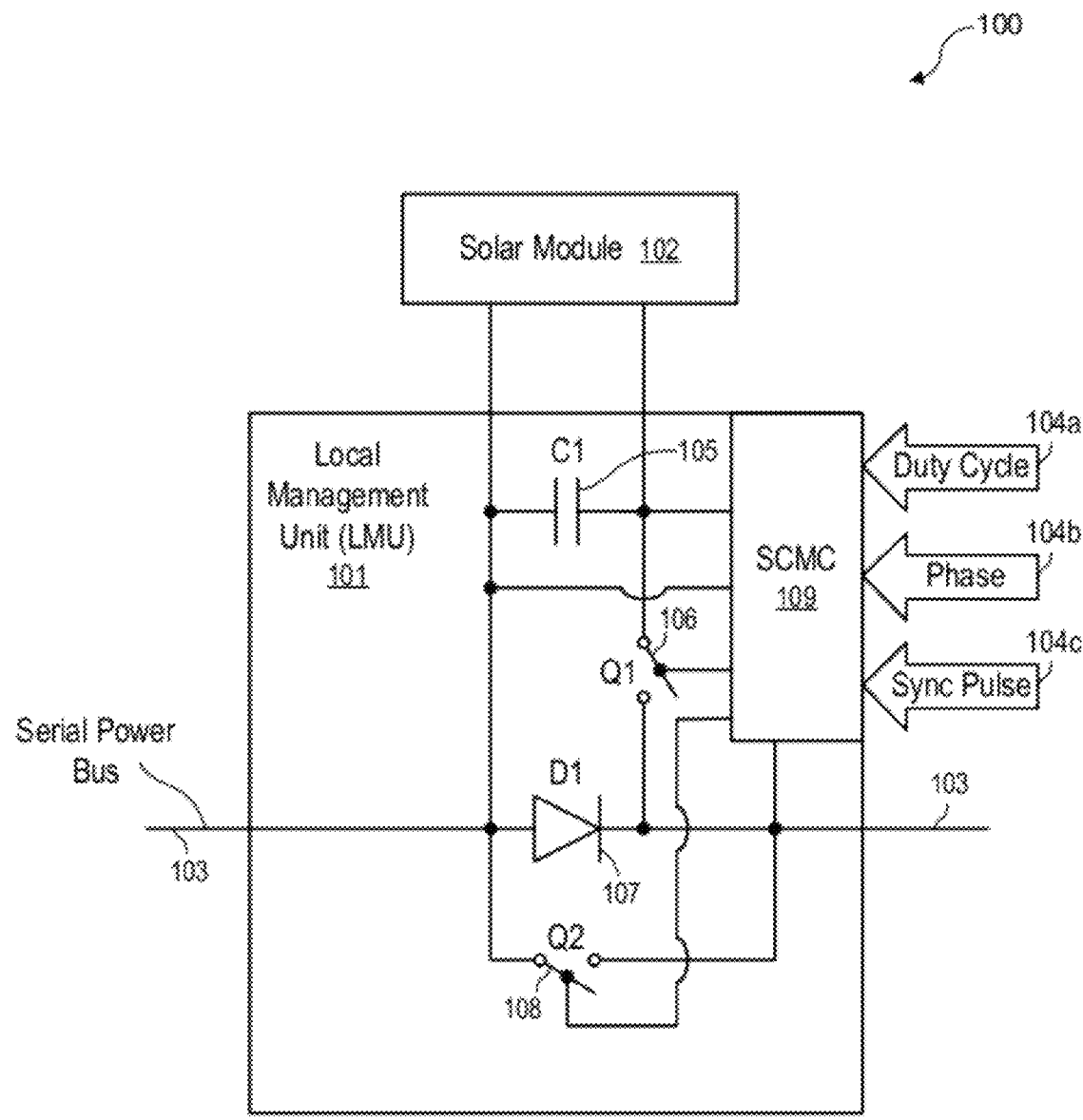
Figure 3:
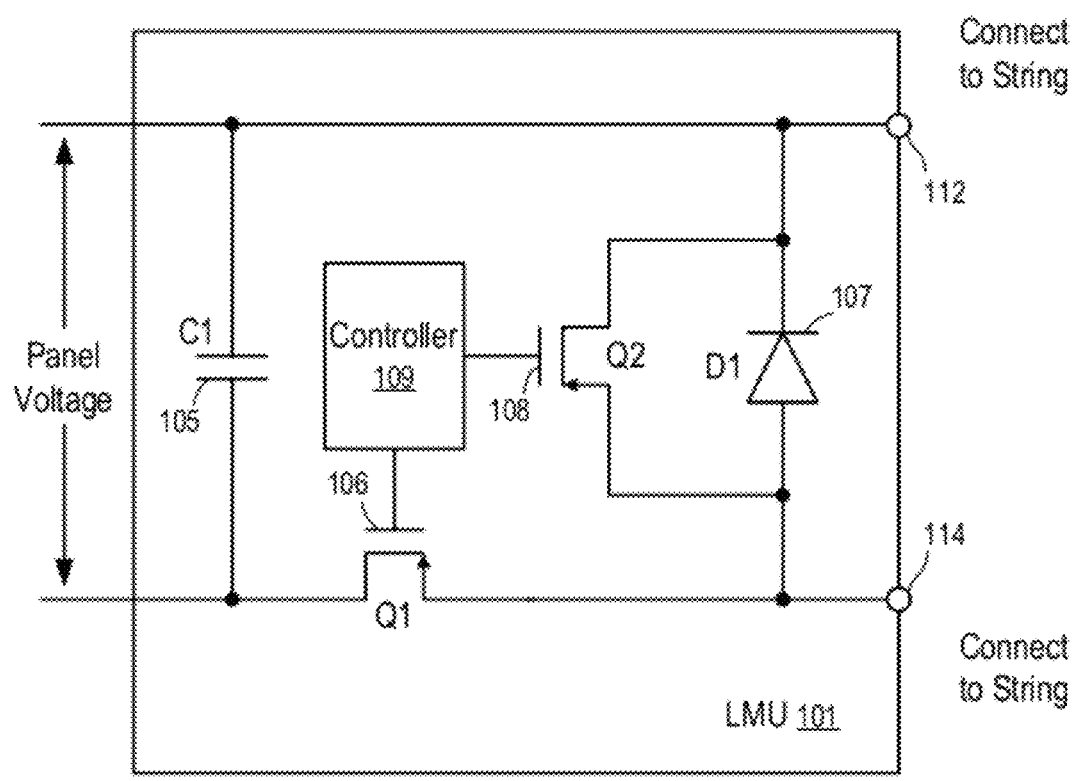

FIGS. 1-3 illustrate local management units according to some embodiments. In FIGS. 1-3, local management units (101) are used to switch on and off the solar module (102) periodically to improve the energy production performance of the photovoltaic systems connected, at least in part, in series. A local management unit may be variously referred to as a solar module controller (or converter) or link module unit. One example of a local management unit is any of the various local management units (solar module controllers) offered by Tigo Energy, Inc. of Los Gatos, Calif.

In FIG. 1, a management unit (101) is local to the solar module (102) and can be used to periodically couple the solar module (102) to the serial power bus (103) via the switch Q1 (106), to improve the total power output for the string of solar modules connected to the serial power bus in series.

The local management unit (LMU) (101) may include a solar module controller to control the operation of the solar module (102) and/or a link module unit to provide connectivity to the serial power bus (103) for energy delivery and/or for data communications.

In one embodiment, the command to control the operation of the switch Q1 (106) is sent to the local management unit (101) over the photovoltaic (PV) string bus (power line) (103). Alternatively, separate network connections can be used to transmit the data and/or commands to/from the local management unit (101).

In FIGS. 1 and 2, the inputs (104a, 104b, 104c) to the local management unit (101) are illustrated separately. However, the inputs (104a, 104b, 104c) are not necessarily communicated to local management unit (101) via separate connections. In one embodiment, the inputs are received in the local management unit via the serial power bus (103).

In FIG. 1, the solar module (102) is connected in parallel to the capacitor C1 (105) of the local management unit (101). The diode D1 (107) of the local management unit (101) is connected in series in the serial power bus (103) which may or may not be part of an overall mesh configuration of solar modules. The switch Q1 (106) of the local management unit can selectively connect or disconnect the solar module (102) and the capacitor C1 (105) from a parallel connection with the diode D1 (107) and thus connect or disconnect the solar module (102) from the serial power bus (103).

In FIG. 1, a controller (109) of the local management unit (101) controls the operation of the switch (106) according to the parameters, such as duty cycle (104a), phase (104b) and synchronization pulse (104c).

In one embodiment, the controller (109) receives the parameters (104a, 104b, 104c) from a remote management unit via the serial power bus (103) or a separate data communication connection (e.g., a separate data bus or a wireless connection). In some embodiment, the controller (109) may communicate with other local management units connected on the serial power bus (103) to obtain operating parameters of the solar modules attached to the serial power bus (103) and thus compute the parameters (e.g., 104a and 104b) based on the received operating parameters. In some embodiment, the controller (109) may determine the parameter (e.g., 104a and 104b) based on the operating parameters of the solar module (102) and/or measurements obtained by the controller (109), without communicating with other local management units of other solar modules, or a remote system management unit.

In FIG. 2, a system (100) has a local management unit (101) coupled to the solar module (102). The local management unit (101) is connected between the solar module (102) and the string bus (103) to improve the total power output for the whole string on the serial power bus (103). Commands to the local management unit (101) can be sent over the photovoltaic (PV) string bus (power line) (103). To make the figure more clear, the inputs (104a, 104b, 104c) to the controller (109) of the local management unit (101) were drawn separately, which does not necessarily indicate that the inputs (104a, 104b, 104c) are provided via separate connections and/or from outside the local management unit (101). For example, in some embodiments, the controller (109) may compute the parameters (104a, 104b, 104c) based on measurements obtained at the local management unit (101), with or without data communications over the serial power bus (103) (or a separate data communication connection with other management units).

In FIG. 2, the local management unit (101) is connected in one side to the solar module (102) in parallel and on the other side in series to a string of other modules, which may or may not be part of an overall mesh configuration. The local management unit (101) may receive, among others, three inputs or types of input data, including a) requested duty cycle (104a), which can be expressed as a percentage (e.g., from 0 to 100%) of time the solar module (102) is to be connected to the serial power bus (103) via the switch Q1 (106), b) a phase shift (104b) in degrees (e.g., from 0 degree to 180 degree) and c) a timing or synchronization pulse (104c). These inputs (e.g., 104a, 104b and 104c) can be supplied as discrete signals, or can be supplied as data on a network, or composite signals sent through the power lines or wirelessly, and in yet other cases, as a combination of any of these input types.

In FIG. 2, the local management unit (101) periodically connects and disconnects the solar module (102) to and from the string that forms the serial power bus (103). The duty cycle (104a) and the phase (104b) of the operation of the switch Q1 (106) can be computed in a number of ways to improve the performance of the system, which will be discussed further below.

In FIG. 2, the local management unit (101) includes a capacitor C1 (105) and a switch Q1 (106), as well as a diode D1 (107). In FIG. 2, the diode D1 (107) is supplemented with an additional switch Q2 (108), which acts as a synchronous rectifier to increase efficiency. In one embodiment, the additional switch Q2 (108) is open (turned off) when the switch Q1 (106) is closed (turned on) to attach the solar module (102) (and the capacitor C1 (105)) to the serial power bus (103).

In some cases, a filter (not shown), including a serial coil and a parallel capacitor, is also used. The filter may be placed at the local management unit or placed just before the fuse box or inverter, or be part of either one of those.

In FIG. 2, the controller (109) is used to process the input signals (e.g., 104a, 104b, 104c) and drive the switches Q1 (106) and Q2 (108). In one embodiment, the controller (109) is a small single chip micro controller (SCMC). For example, the controller (109) may be implemented using Application-Specific Integrated Circuit (ASIC) or Field-Programmable Gate Array (FPGA). The controller (109) can even be implemented in discrete, functionally equivalent circuitry, or in other cases a combination of SCMC and discrete circuitry. It will be generally referred to as single chip micro controller (SCMC) herein, but any implementation may be used.

In one embodiment, the controller (109) is coupled to the solar module (102) in parallel to obtain power for processing; and the controller (109) is coupled to the serial power bus (103) to obtain signals transmitted from other management units coupled to the serial power bus (103).

By switching the module (102) (or groups of cells, or a cell) on and off to the string periodically, the local management unit (101) may lower the voltage reflected to the string bus (103) (e.g., a lower average voltage contributed to the string bus) and can cause the current reflected to the string bus (103) to be higher, nearer the level it would be if the module was not weak, generating a higher total power output.

In one embodiment, it is preferable to use different phases to operate the switches in different local management units on a string to minimize voltage variance on the string.

In FIG. 3, the local management unit (101) provides two connectors (112 and 114) for serial connections with other local management unit (101) to form a serial power bus (103). The controller (109) controls the states of the switches Q1 (106) and Q2 (108).

In FIG. 3, when the controller (109) turns on the switch (106), the panel voltage and the capacitor C1 (105) are connected in parallel to the connectors (112 and 114). The output voltage between the connectors (112 and 114) is substantially the same as the output panel voltage.

In FIG. 3, during the period the switch (106) is turned off (open), the controller (109) turns on (closes) the switch (108) to provide a path around the diode D1 (107) to improve efficiency.

In FIG. 3, when the switch (106) is turned off (open), the panel voltage charges the capacitor C1 (105), such that when the switch (106) is turned on, both the solar panel and the capacitor (105) provides currents going through the connectors (112 and 114), allowing a current larger than the current of the solar panel to flow in the string (the serial power bus (103)). When the switch (106) is turned off (open), the diode D1 (107) also provides a path between the connectors (112 and 114) to sustain the current in the string, even if the switch (108) is off for some reasons.

In one embodiment, the controller (109) is connected (not shown in FIG. 3) to the panel voltage to obtain the power for controlling the switches Q1 (106) and Q2 (108). In one embodiment, the controller (109) is further connected (not shown in FIG. 3) to at least one of the connectors to transmit and/or receive information from the string. In one embodiment, the controller (109) includes sensors (not shown in FIG. 3) to measure operating parameters of the solar panel, such as panel voltage, panel current, temperature, light intensity, etc.

Figure 3A:
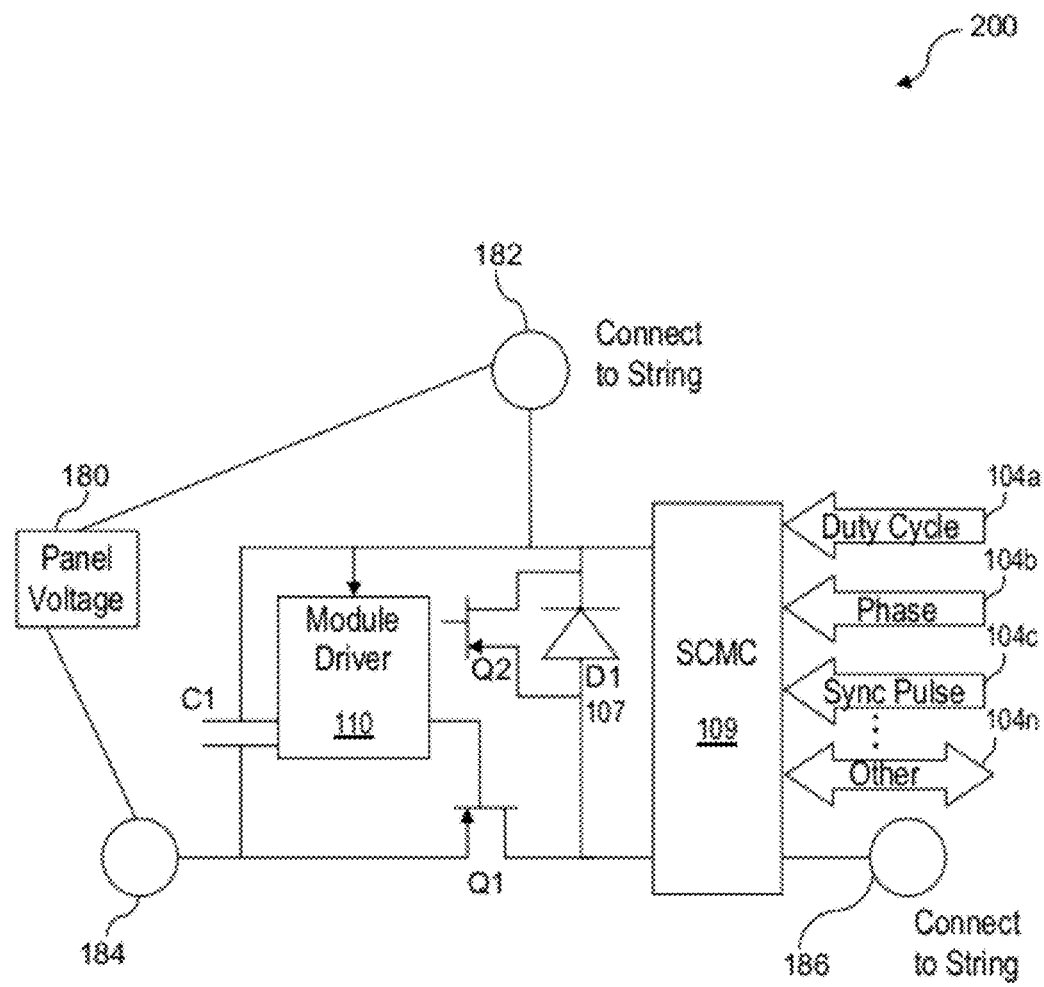

FIG. 3A shows an alternative three terminal implementation of the local management unit 101 shown in FIG. 3. In FIG. 3A, a panel voltage (180) is connected to terminals (182, 184). Terminals (182, 186) are connected to the string bus (103). A module driver (110) and a single chip micro controller (SCMC) control the switches Q1 and Q2. Under normal operating conditions, Q1 is on to allow normal operation of the system. When string current exceeds source capability, and as a result source voltage drops, Q1 and Q2 start a PWM (pulse width modulation) operation under control of the module driver (110). PWM involves modulation of duty cycle to control the amount of power sent to the load. This allows string current to remain constant, and input voltages can be maintained at the maximum power point. This implementation protects transistors during low voltage or short situations. In one embodiment, a single chip micro controller (SCMC) (109) can be connected in parallel to the diode D1 (107) to function in the manner of the SCMC 109 as described above. In one embodiment, the module driver (110) and the single chip micro controller (SCMC) (109) can be integrated in a single controller as shown in, for example, FIG. 3. As discussed above, single chip micro controller (SCMC) (109) can receive the inputs (104a, 104b, 104c). As shown in FIG. 3A, in one embodiment, the inputs (104a, 104b, 104c) are provided with a communications interface (not shown) coupled to a master controller (not shown). In one embodiment, other inputs (104n) constituting information about other operating parameters can also be communicated to the single chip micro controller (SCMC) (109) from the communications interface. In one embodiment, the other inputs (104n) can be information that is communicated bi-directionally. As discussed above, the power supply connections in the figures, including FIG. 3A, are not necessarily shown for purposes of clarity and so as not to obscure the invention.

Figure 4A:
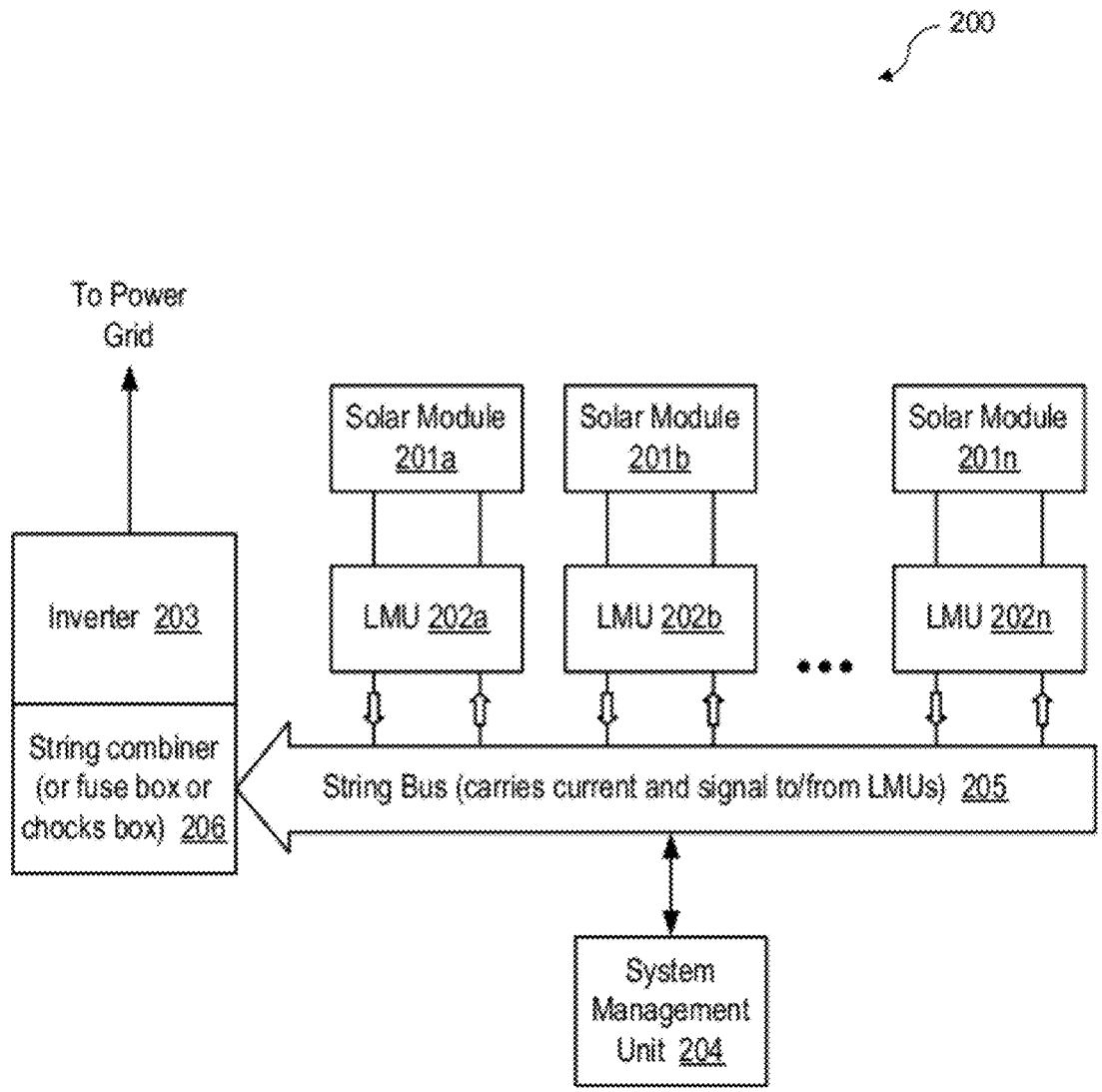
FIG. 4 illustrates a photovoltaic system according to one embodiment.
FIG. 4B illustrates an embodiment of a solar array along with an inverter and a string combiner.

FIG. 4 illustrates a photovoltaic system (200) according to one embodiment. In FIG. 4, the photovoltaic system 200 is built from a few components, including photovoltaic modules (201a, 201b, . . . , 201n), local management unit units (202a, 202b, . . . , 202n), an inverter (203), and a system management unit (204).

In one embodiment, the system management unit (204) is part of the inverter (203), the combiner box (206), a local management unit, or a stand-alone unit. The solar modules (201a, 201b, . . . , 201n) are connected in parallel to the local management units (202a, 202b, . . . , 202n) respectively, which are connected in series to form a string bus (205), which eventually is connected to an inverter (203) and the management unit (204). The solar module (201a), for example, is connected to the local management unit (202a) by the terminals (182, 184, 186) (FIG. 3A). As shown in FIG. 4, in one embodiment, the terminal (182), which connects to the panel voltage and the string voltage, is connected to the depicted left connection between the solar module (201a) and the local management unit (202a) and connected to the depicted left connection between the local management unit (202a) and the string bus (205). The terminal (184), which is connected to the panel voltage, is connected to the depicted right connection between the between the solar module (201a) and the local management unit (202a). The terminal (186), which is connected to the string voltage, is connected to the depicted right connection between the local management unit (202a) and the string bus (205).

In FIG. 4, the string bus (205) can be connected to the inverter (203) directly or as part of a mesh network or combiner boxes or fuse boxes (not shown). An isolated local management unit can be used as a combiner box (206) to adjust all voltages before connecting to the inverter (206); or, a single or multi-string inverter can be used. To limit the changes in the voltage of the bus, the management unit (204) may assign a different phase for each of the local management units (202a, 202b, . . . , 202n). In one embodiment, at any given time, a maximum of a predetermined number of solar modules (e.g., one single solar module) are disconnected from the string bus (205).

In one embodiment, beyond the module connection the local management units can have the signal inputs, including but not limited to duty cycle (104a), phase (104b) and synchronization pulse (104c) (e.g., to keep the local management units synchronized). In one embodiment, the phase (104b) and the synchronization pulse (104c) are used to further improve performance, but the local management unit (101) can work without them.

In one embodiment, the local management unit may provide output signals. For example, the local management unit (101) may measure current and voltage at the module side and optionally measure current and voltage in the string side. The local management unit (101) may provide other suitable signals, including but not limited to measurements of light, temperature (both ambient and module), etc.

In one embodiment, the output signals from the local management unit (101) are transmitted over the power line (e.g., via power line communication (PLC)), or transmitted wirelessly.

In one embodiment, the system management unit (204) receives sensor inputs from light sensor(s), temperature sensor(s), one or more each for ambient, solar module or both, to control the photovoltaic system (200). In one embodiment, the signals may also include synchronization signals. For example, a management unit can send synchronization signals periodically to set the timing values, etc.

Using the described methods the local management unit can be a very non-expensive and reliable device that can easily increase the throughput of a photovoltaic solar system by a few (e.g., signal or low double digits) percentage points. These varied controls also allow installers using this kind of system to control the VOC (open circuit voltage) by, for example by shutting off some or all modules. For example, by using the local management units of the system, a few modules can be disconnected from a string if a string is getting to the regulatory voltage limit, thus more modules can be installed in a string.

In some embodiments, local management units can also be used within the solar panel to control the connection of solar cells attached to strings of cells within the solar panel.

Figure 5:
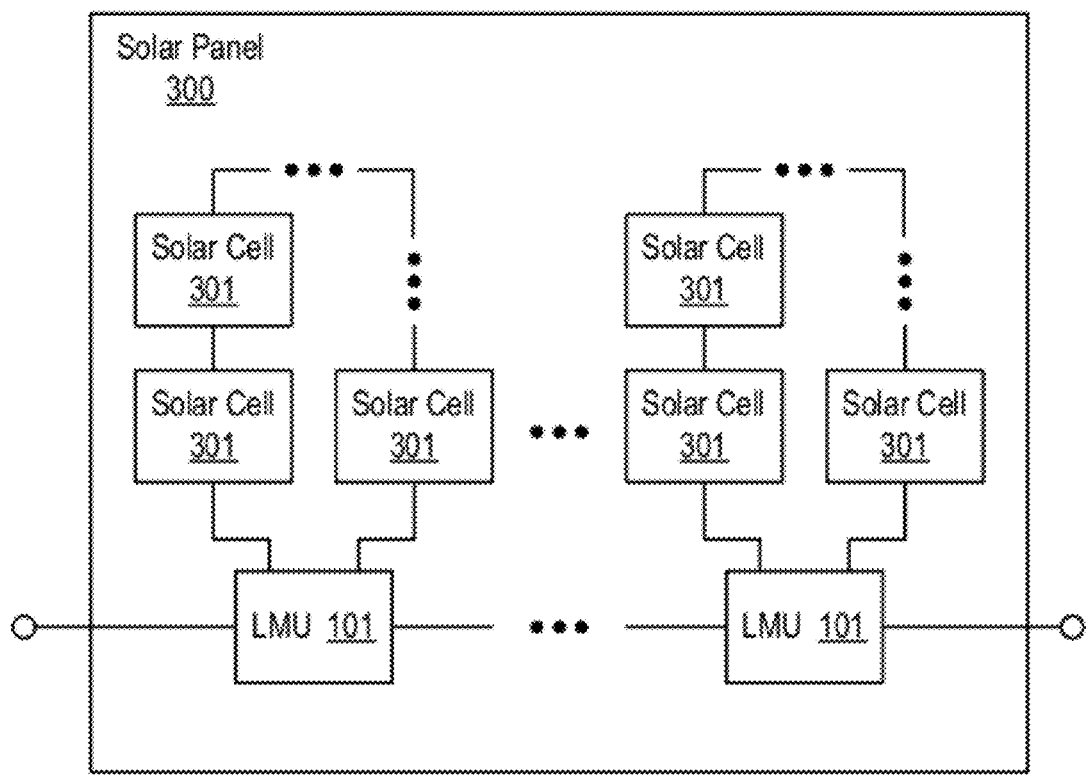
FIG. 5 illustrates a solar panel according to one embodiment.

FIG. 5 illustrates a solar panel according to one embodiment. In one embodiment, the solar panel (300) has a few strings of solar cells (e.g., three solar cell strings per module). In FIG. 5, a local management unit (101) can be applied to a group of cells (301) within a string of an individual solar panel (300), or in some cases to each cell (301) in a solar panel (300).

In FIG. 5, a group of solar cells (301) that are attached to a local management unit (101) may be connected to each other in series, in parallel, or in a mesh configure. A number of local management units (101) connect the groups of the solar cells (301) in a string to provide output for the solar panel (300).

Some embodiments of the disclosure include methods to determine the duty cycles and/or phases for local management units connected to a string or mesh of solar modules.

In some embodiments, the duty cycle of all local management units in a string or mesh can be changed, to increase or decrease the string voltage. The duty cycles may be adjusted to avoid exceeding the maximum voltage allowed. For example, the maximum voltage may be limited by the combiner box (206), the inverter (203), or any other load connected to the string bus (205), or limited by any regulations applicable to that system. In some embodiments, the duty cycles are adjusted to align the voltage of multiple strings.

In some embodiments, the duty cycle of one local management unit (101) in a string can be changed to cause higher current in that local management unit (101) and overall higher power harvesting.

In one embodiment, the duty cycles are computed for the solar modules that are connected to a string via the corresponding local management units. The duty cycles can be calculated based on the measured current and voltages of the solar modules and/or the temperatures.

After an initial set of duty cycles is applied to the solar modules, the duty cycles can be further fine tuned and/or re-adjusted to changes, such as shifting shading etc., one step a time, to improve power performance (e.g., to increase power output, to increase voltage, to increase current, etc.). In one embodiment, target voltages are computed for the solar modules, and the duty cycles are adjusted to drive the module voltage towards the target voltages.

The methods to compute the duty cycles of the solar modules can also be used to compute the duty cycles of the groups of solar cells within a solar module.

Figure 6:
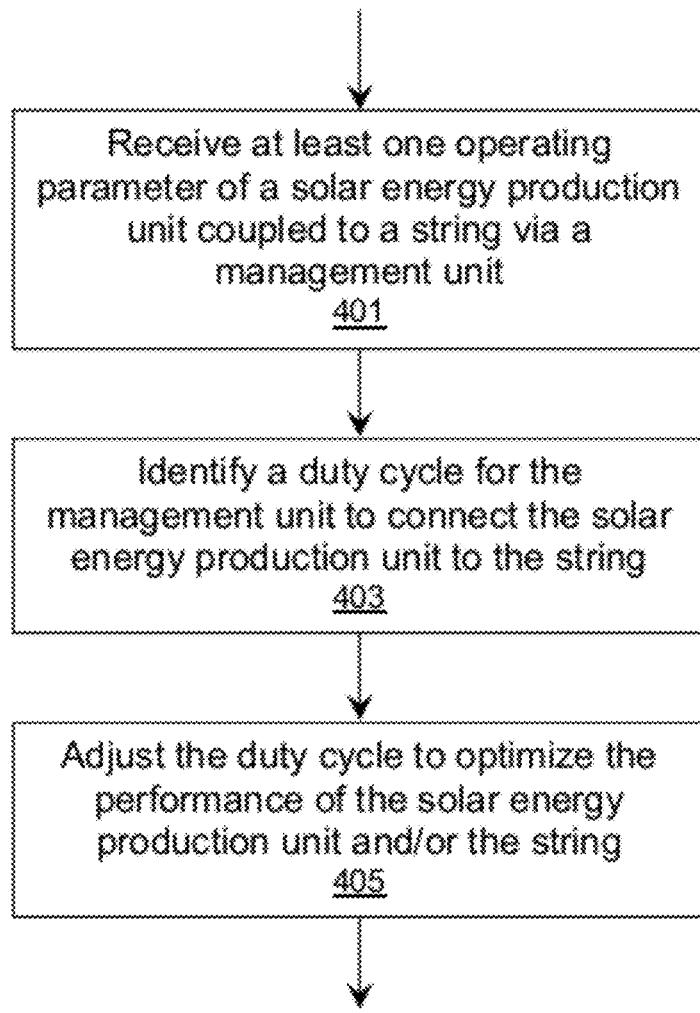
FIGS. 6-8 show methods to improve performance of a photovoltaic system according to some embodiments.
Figure 7:
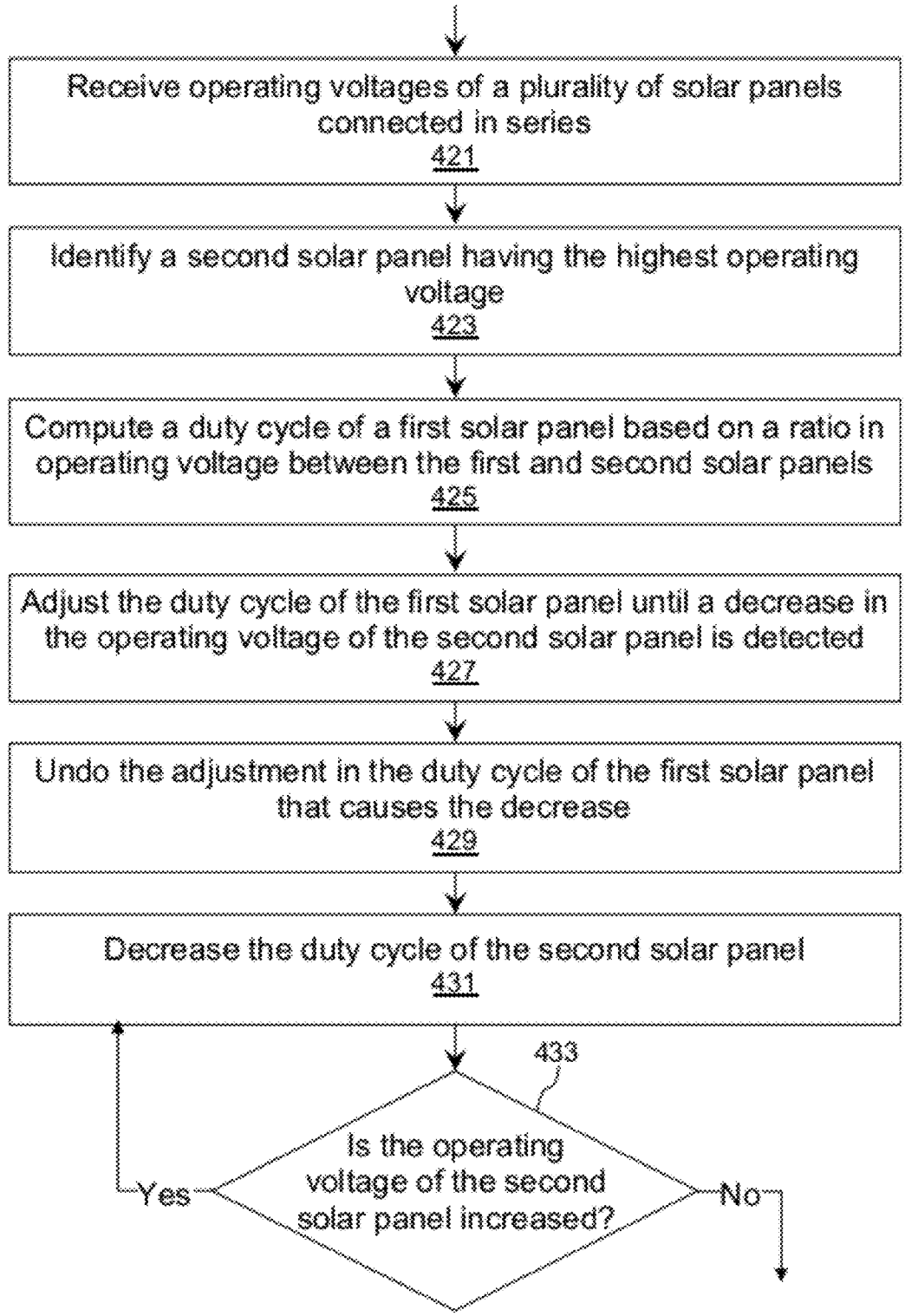
Figure 8:
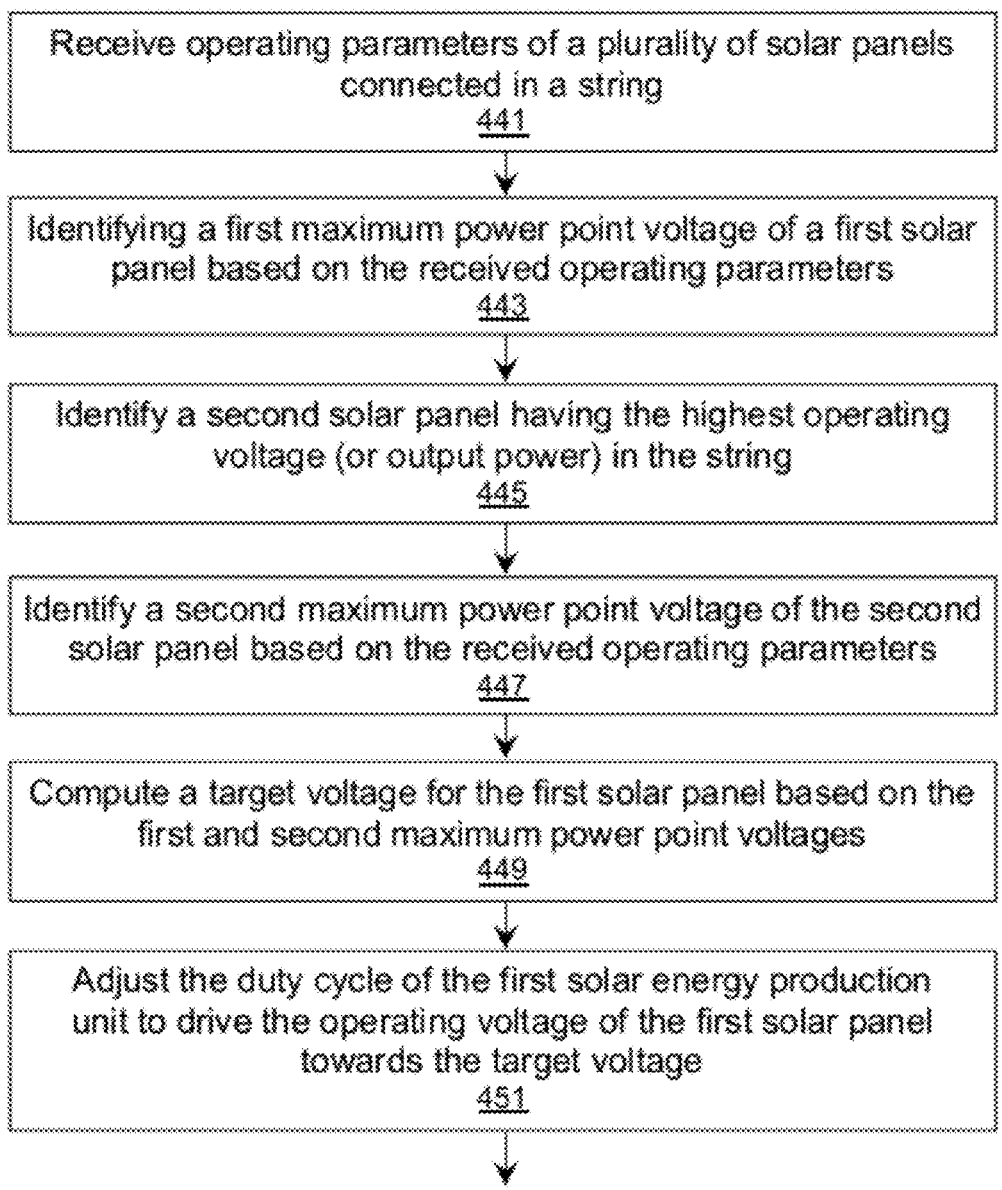

FIGS. 6-8 show methods to improve performance of a photovoltaic system according to some embodiments.

In FIG. 6, at least one operating parameter of a solar energy production unit coupled to a string via a management unit is received (401) and used to identify (403) a duty cycle for the management unit to connect the solar energy production unit to string. The solar energy production unit may be a solar module, a group of solar cells within a solar module, or a single solar cell in a string in a solar module. The duty cycle is adjusted (405) to optimize the performance of the solar energy production unit and/or the string.

For example, the duty cycle can be adjusted to increase the current in the string and/or the solar energy production unit, to increase the output power of the string and/or the solar energy production unit, to increase the voltage of the solar energy production unit, etc.

In FIG. 7, the operating voltages of a plurality of solar panels connected in series are received (421) and used to identify (423) a second solar panel having the highest operating voltage (highest output power) in the string.

In FIG. 7, a duty cycle of a first solar panel is computed (425) based on a ratio in operating voltage between the first and second solar panels. Alternatively, the duty cycle can be computed based on a ratio in output power between the first and second solar panels. Alternatively, the duty cycle can be computed based on a ratio between the first and second solar panels in estimated/computed maximum power point voltage. Alternatively, the duty cycle can be computed based on a ratio between the first and second solar panels in estimated/computed maximum power point power.

The duty cycle of the first solar panel is adjusted (427) to improve the performance of the first solar energy production unit and/or the string, until a decrease in the operating voltage of the second solar panel is detected. For example, the duty cycle of the first solar panel can be adjusted to increase the total output power of the string, to increase the current of the string, to increase the current of the first solar panel, to drive the voltage of the first solar panel towards a target voltage, such as its maximum power point voltage estimated based on its current operating parameters, such as temperature or a voltage calculated using its estimated maximum power point voltage.

In FIG. 7, in response to the detected decrease in the operating voltage of the second solar panel which had the highest operating voltage, the adjustment in the duty cycle of the first solar panel that causes the decrease is undone/reversed (429).

In FIG. 7, the duty cycle of the second solar panel is optionally decreased (431) to increase the operating voltage of the second solar panel. In some embodiments, the strongest solar panel (or strong panels within a threshold from the strongest panel) is not switched off line (e.g., to have a predetermined duty cycle of 100%).

In one embodiment, the duty cycle of the second solar panel is repeatedly decreased (429) until it is determined (431) that the decrease (429) in the duty cycle of the second solar panel cannot increase the voltage of the second solar panel.

In FIG. 8, operating parameters of a plurality of solar panels connected in a string are received (441) and used to identify (443) a first maximum power point voltage of a first solar panel. A second solar panel having the highest operating voltage (or output power) in the string is identified. A second maximum power point voltage of the second solar panel is identified (447) based on the received operating parameters and used to compute (449) a target voltage for the first solar energy production unit. In one embodiment, the target voltage is a function of the first and second maximum power point voltages and the highest operating voltage identified (445) in the second solar panel in the string. The duty cycle of the first solar energy production unit is adjusted to drive the operating voltage of the first solar panel towards the target voltage.

Alternatively, the target voltage may be set as the first maximum power point voltage of the first solar panel.

In one embodiment, to adjust voltage a same factor is applied to all modules in that string. For example, in a case of a first module A1 that is producing only 80%, and the voltage of the whole string needs to be 5% lower, the duty cycle of A1 is 80% multiplied the duty cycle applied to the whole string (which is Y in this example) so module A1 then has Y×0.8 as duty cycle.

In some embodiments, the system management unit (204) and/or the local management units (e.g., 202a, 202b, . . . , 202n) are used solely or in combination to determine the parameters to control the operations of the switches.

For example, in one embodiment, a system management unit (204) is the "brain" of the system, which decides on the duty cycle and phase parameters.

For example, in another embodiment, each local management unit broadcasts information to the other local management units on the string to allow the individual local management units to decide their own duty cycle and phase parameters.

In some embodiment, a local management unit may instruct one or more other local management units to adjust duty cycle and phase parameters. For example, the local management units on a string bus (205) may elect one local management unit to compute the duty cycle and phase parameters for other local management units on the string.

For example, in some embodiment, the system management unit (204) may determine one or more global parameters (e.g., a global duty cycle, the maximum power on the string, the maximum voltage on the string, etc.), based on which individual local management units adjust their own duty cycles.

In some embodiments, a local management unit may effectively self manage and determine its own duty cycles without relying upon communicating with other management units. For example, the local management unit may adjust its duty cycle for connecting its solar module to the string to operate the solar module at the maximum power point. No local management unit is in control over the system, and each adjusts its own duty cycle (and thus, its power and voltage.)

In one embodiment, module voltages are measured by the local management units in the same string at substantially/approximately the same time and used to identify the strongest solar module. A strongest solar module provides the most power in the string. Since the modules are connected in series, the solar module having the highest module voltage in the string can be identified as the strongest solar module. In some embodiment, the operating voltage and current of the solar module are measured to determine the power of the solar module.

Additional approaches can be implemented to control the voltage, power output, or the efficiency of one or more strings of solar module controllers as described above. In some embodiments, a system controller management unit controls the operation of a plurality of local management units in one or more strings. In some embodiments, one or more local management units controls the operation of a plurality of local management units in one or more strings. In some embodiments, the local management unit may only control its own operation, or may control the operation of itself and other local management units in the same string.

One or more local management units in a string may have the capability to control the operation of other local management units in the same string. In one embodiment, a single local management unit can be selected to be a controlling local management unit to control a plurality of panels in a string. The controlling local management unit in a string can be selected using any suitable protocol. In one embodiment, in a string of local management units, the first local management unit that announces its intent to take control of other modules in the string could become the controlling local management unit.

In one embodiment, to improve power output by a string, one or more local management units can each receive module voltage from all local management units in the same string and identify the strongest local management unit (i.e., the one with the maximum power and voltage). Each local management unit can then set its own duty cycle as a function of the received voltage.

In one embodiment, after the highest module voltage $V_m$ in the string is identified, the duty cycle for each module can be computed as a function of a ratio between the module voltage $V$ of the module and the highest module voltage $V_m$. For example, the duty cycle for a module can be computed as $1-((V_m-V)/V_m)=V/V_m$. In one embodiment, a particular local management unit receives the voltages of all other local management units at the same time or substantially same time (e.g., all voltages are received within an interval of less than one second.)

In one embodiment, the system management unit (204) may identify the highest module voltage from the module voltages received from the local management units (202a, 202b, ..., 202n), and compute the duty cycles for the corresponding local management units (202a, 202b, ..., 202n).

In one embodiment, the local management units (202a, 202b, ..., 202n) may report their module voltages on the string bus (205) to allow individual local management units (202a, 202b, ..., 202n) to identify the highest module voltage and compute the duty cycles, without relying upon the system management unit (204).

In one embodiment, one of the local management units (202a, 202b, ..., 202n) may identify the highest module voltage and/or compute the duty cycles for the other local management units (202a, 202b, ..., 202n).

In one embodiment, the duty cycles are determined and/or adjusted periodically (e.g., every 30 seconds). The intervals can take into account various environmental factors (e.g., where shadows on a solar panel are cast on different parts of the panel over the course of a day).

In one embodiment, after the duty cycles for the solar modules on the string are set based on the module voltage ratio relative to the highest module voltage in the string, the duty cycles can be fine tuned to increase the power performance. The duty cycles can be fine tuned one step a time, until a decrease of voltage of the module with the highest power is detected. In response to the detected decrease, the last change that caused the decrease can be reversed (undone). The fine tuning of the duty cycles can be used to reach the peak performance point (e.g., for maximum power point tracking).

In one embodiment, after the strongest module is identified, the duty cycles of the solar modules on the string are adjusted until the module with the highest power in the string decrease its voltage. Since decreasing the duty cycle of a solar module decreases the time period the module is connected to the string and thus increases its voltage, the duty cycle of the module with the highest power in the string can be decreased to increase its voltage, in response to the decrease in its voltage caused by the adjustment to the duty cycles of other solar modules on the string. For example, the duty cycle of the module with the highest power in the string can be decreased until its voltage is maximized.

The performance of solar modules may vary significantly with temperature. A system capable of measuring temperature can implement methods for controlling the voltage, power output, or the efficiency of one or more strings of solar module controllers using module temperature as a factor. In one embodiment, the local management unit measures module and ambient temperatures for some methods to determine the duty cycles. For example, the operating parameters measured at the local management units (e.g., 202a, 202b, ..., 202n), such as module temperature, can be used to compute the estimated voltages of the solar modules at their maximum power points. For example, a formula presented by Nalin K. Gautam and N. D. Kaushika in "An efficient algorithm to simulate the electrical performance of solar photovoltaic arrays," *Energy*, Volume 27, Issue 4, April 2002, pages 347-261, can be used to compute the voltage $V_{mp}$ of a solar module at the maximum power point. Other formulae can also be used. Once the maximum power point voltage $V_{mp}$ of a solar module is computed or estimated, the duty cycle of the solar module connected to a string can be adjusted to drive the module voltage to the computed/estimated maximum power point voltage $V_{mp}$, since decreasing the duty cycle of a solar module normally increases its voltage.

In one embodiment, a local management unit may adjust the duty cycle of the solar module connected to the local management unit to change the module voltage to the computed/estimated maximum power point voltage $V_{mp}$, without having to communicate with other management units.

In one embodiment, a local management unit (or a system management unit) may adjust the duty cycle of the solar module connected to the local management unit to perform maximum power point tracking.

In one embodiment, after identifying the strongest module and computing/estimating the maximum power point voltage $V_{mpm}$ of the strongest module, the duty cycle for each module on a string can be computed as a function of a ratio between the maximum power point voltage $V_{mp}$ of the module and the maximum power point voltage $V_{mpm}$ of the strongest module. For example, the duty cycle for a module can be computed as $1-((V_{mpm}-V_{mp})/V_{mpm})=V_{mp}/V_{mpm}$. The duty cycle can be periodically updated, based on the current operating parameters measured, and/or fine tuned until a decrease in the voltage of the strongest module is detected.

Alternatively, a target voltage for each module on the string can be computed as a function of a ratio between the maximum power point voltage $V_{mp}$ of the module and the maximum power point voltage $V_{mpm}$ of the strongest module. For example, the target voltage for a module can be computed as $V_m \times V_{mp}/V_{mpm}$, where $V_m$ is the measured voltage of the strongest module. The duty cycle of the module can be changed to drive the module voltage of the module towards the target voltage.

In one embodiment, after identifying the strongest module and computing/estimating the maximum power point power $P_{mpm}$ of the strongest module, the duty cycle for each module on a string can be computed as a function of a ratio between the maximum power point power $P_{mp}$ of the module and the maximum power point power $P_{mpm}$ of the strongest module. For example, the duty cycle for a module can be computed as $1-((P_{mpm}-P_{mp})/P_{mpm})=P_{mp}/P_{mpm}$. The duty cycle can be periodically updated, based on the current operating parameters measured, and/or fine tuned until a decrease in the voltage of the strongest module is detected, since decreasing the duty cycle normally increases the module voltage.

In one embodiment, a target voltage for each module on the string can be computed as a function of a ratio between the maximum power point power $P_{mp}$ of the module and the maximum power point power $P_{mpm}$ of the strongest module. For example, the target voltage for a module can be computed as $V_m \times P_{mp}/P_{mpm}$, where $V_m$ is the measured voltage of the strongest module. The duty cycle of the module can be changed to drive the module voltage of the module towards the target voltage, since decreasing the duty cycle normally increases the module voltage.

In one embodiment, the duty cycle for each local management unit is changed to increase the current of the solar module attached to the local management unit (e.g., based on the measurement of the voltage and current of the solar module), until the maximum current is achieved. This method assumes that string maximum power can be achieved with some accuracy by driving each local management unit to maximum current. In one embodiment, the voltages and currents of the solar modules are measured for tuning the duty cycles for maximum power point tracking for the string. The measurements of the voltages and currents of the solar modules also enable the local management units to additionally serve as a module level monitoring system.

The duty cycles can be adjusted by the system management unit (e.g., 204) based on the measurements reported by the local management units (e.g., 202a, 202b, ..., 202n), or adjusted directly by the corresponding local management units (e.g., 202a, 202b, ..., 202n).

In one embodiment, during the process of setting and/or tuning the duty cycles, the maximum power point tracking operation by the inverter (203) is frozen (temporarily stopped). Light intensity at the solar modules is monitored for changes. When the light intensity at the solar modules stabilizes, the voltage and current of the solar modules are measured for the determination of the duty cycles. Then normal operation resumes (e.g., unfreezing of maximum power point tracking operation).

In one embodiment, the local management units measure the voltages and currents of the solar modules to determine the power of the solar modules. After identifying the highest power $P_m$ of the solar module on the string, the duty cycles of the solar modules on the string are determined by the power ratio relative to the highest power $P_m$. For example, if a module produces 20 percent less power, it will be disconnected from the string bus about 20 percent of the time. For example, if a module produces power P, its duty cycle can be set to $1-((P_m-P)/P_m)=P/P_m$.

In one embodiment, a predetermined threshold is used to select the weak modules to apply duty cycles. For example, in one embodiment, when a module produces power less than a predetermine percent of highest power $P_m$, a duty cycle is calculated and applied to the solar module. If the module is above the threshold, the module is not disconnected (and thus having a duty cycle of 100%). The threshold may be based on the power, or based on the module voltage.

In one embodiment, the system management unit (204) finds the duty cycles for the local management units (202a, 202b, ..., 202n) and transmits data and/or signals representing the duty cycles to the local management units (202a, 202b, ..., 202n) via wires or wireless connections. Alternatively, the local management units (202a, 202b, ..., 202n) may communicate with each other to obtain the parameters to calculate the duty cycles.

In one embodiment, the system management unit (204) knows all the different duty cycles indicated for the local management units (202a, 202b, ..., 202n).

In one embodiment, during power fine tuning, the system management unit (204) sends the appropriate data/signal to the appropriate local management units (202a, 202b, ..., 202n), and then the system management unit (204) calculates the total power of the string and corrects the duty cycle to produce maximum power. Once maximum power is achieved, the duty cycles for the local management units (202a, 202b, ..., 202n) may be saved in a database and serve as a starting point for the corresponding local management units (202a, 202b, ..., 202n) at the same time of day on the next day. Alternatively, a local management may store the duty cycle in its memory for the next day.

The stored duty cycles can be used when there is a fixed shade on the modules, such as a chimney, a tree, etc., which will be the same shade on any day at the same time. Alternatively, historical data may not be saved, but may be recalculated from scratch on each run, for example every 30 minutes.

In one embodiment, the light intensity at the solar modules is monitored for changes. The duty cycles are calculated when the light intensity does not change significantly. If there are changes in sun light radiation at the solar modules, the system will wait until the environment stabilizes before applying or adjusting the duty cycles.

In one embodiment, the system management unit (204) can communicate with the inverter as well. When the environment is not stable (e.g., when the sun light radiation is changing), the inverter may stop maximum power point tracking. In such a situation, the inverter can be set up for its load, instead of tracking for maximum power point. Instead of using the inverter to perform maximum power point tracking, the system management unit (204) and the local management units (202a, 202b, ..., 202n) are used to set the operating parameters and balance the string.

Alternatively, when the environment is not stable but measurements and calculation are done faster than the MPPT is working, there may be no need to stop the MPPT on the inverter. Alternatively, when the environment is not stable, measurements can be taken few times for the same radiation until a stable result is achieved.

Many variations may be applied to the systems and methods, without departing from the spirit of the invention. For example, additional components may be added, or components may be replaced. For example, rather than using a capacitor as primary energy store, an inductor may be used, or a combination of inductor and capacitor. Also, the balance between hardware and firmware in the micro controllers or processors can be changed, without departing from the spirit of the invention. In some cases, only some problematic modules may have a local management unit, for example in a shaded or partially shaded or otherwise different situation. In yet other cases, local management units of strong modules may be virtually shut off. The methods for determining the duty cycles for the solar modules can also be used to determine the duty cycles of groups of cells connected via local management units in a string within a solar panel/module.

Figure 9:
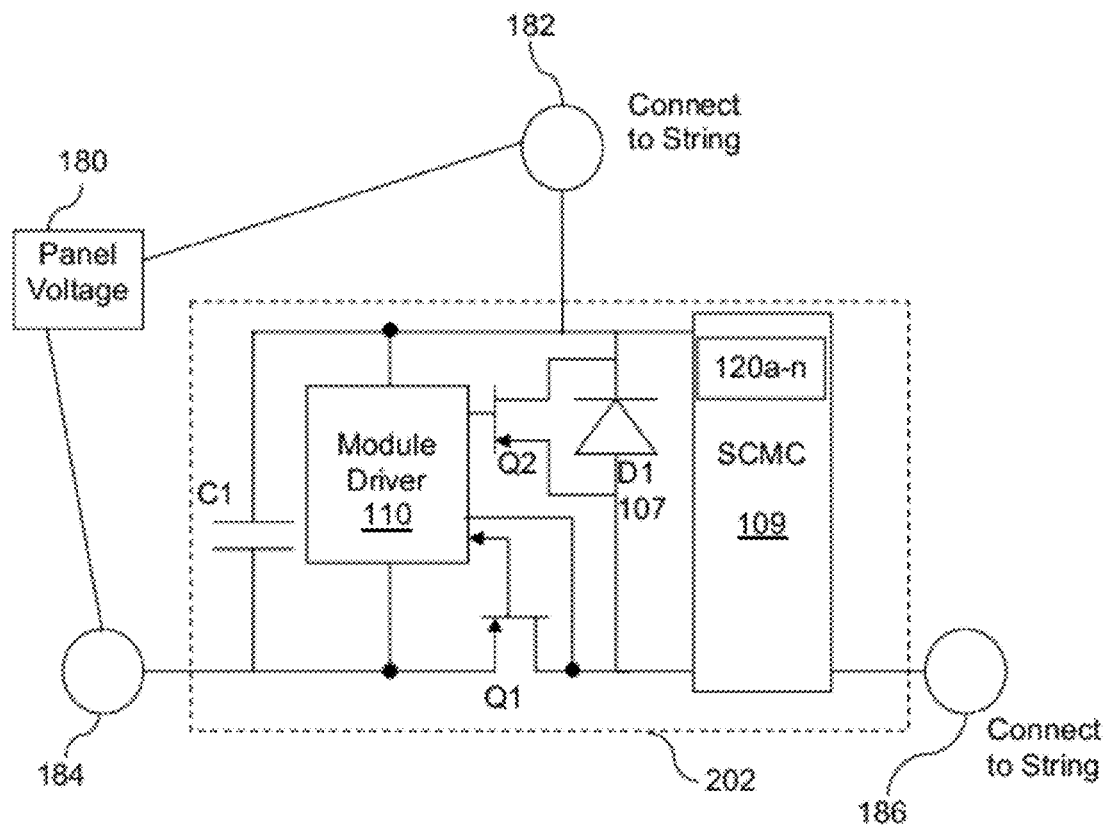
FIG. 9 illustrates a local management unit according to one embodiment.

FIG. 9 shows an overview of a local management unit (202x) that is modified from the local management unit (101) discussed above in relation to FIG. 3A. In FIG. 9, local management unit (202x) contains a single chip micro controller (SCMC) (109). In one embodiment, all of the features and details of the local management units discussed above apply to the local management unit (202x) and are not repeated for purposes of clarity. In one embodiment, some of the features and details of the local management units discussed above selectively apply to the local management unit (202x) and are not repeated for purposes of clarity. The module driver (110) is connected in parallel with the capacitor C1, and is also connected between the switches Q1 and Q2. The micro controller (109) contains various operating parameters regarding the local management unit (202x), such as the voltage, current, etc. The micro controller (109) can run suitably programmed software (120a-n) to modulate the chopping frequency of the switches Q1 and Q2. The switches Q1 and Q2 perform a duty cycle according to the formula calculated as previously described. A duty cycle would result in minor variations from cycle to cycle (i.e., in the inter cycle) that can be used to encode using MFM (modified frequency modulation), Manchester-type encoding, or other suitable time-delay type encoding technique with or without additional error correction. As discussed further below, the approach of modulating, for example, the PWM inter cycle would allow a receiver (301) at the end of the string bus (205) to measure the different variations of each of the local management units. Also, the local management units each can have a slightly different base frequency so that their respective harmonics would not cover each other, although they would move in a similar range. This approach has the added benefit of reducing overall EMI of the system.

Figure 10A:
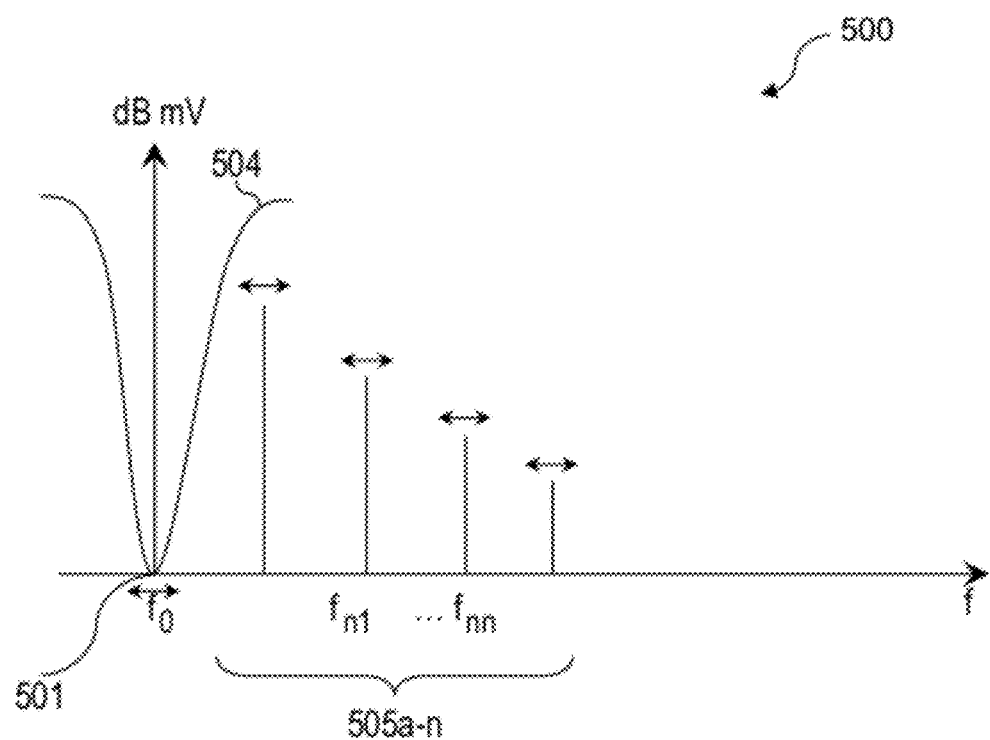
FIG. 10A is a plot of carrier frequency for a local management unit according to one embodiment.

FIG. 10A is a plot of the upper half of a frequency spectrum (500) of a carrier frequency (501) for a particular local management unit. The frequency spectrum (500) shows the harmonics fn1-fnn as elements (505a-n). Arrows above the harmonics fn1-fnn (505a-n) indicate they wobble around with the variations in pulse width modulation from cycle to cycle. Also shown is a notch filter curve (504), which can be used to remove significant noise to avoid EMI problems in the system and to comply with FCC and other regulatory agency regulations as needed.

Figure 10B:
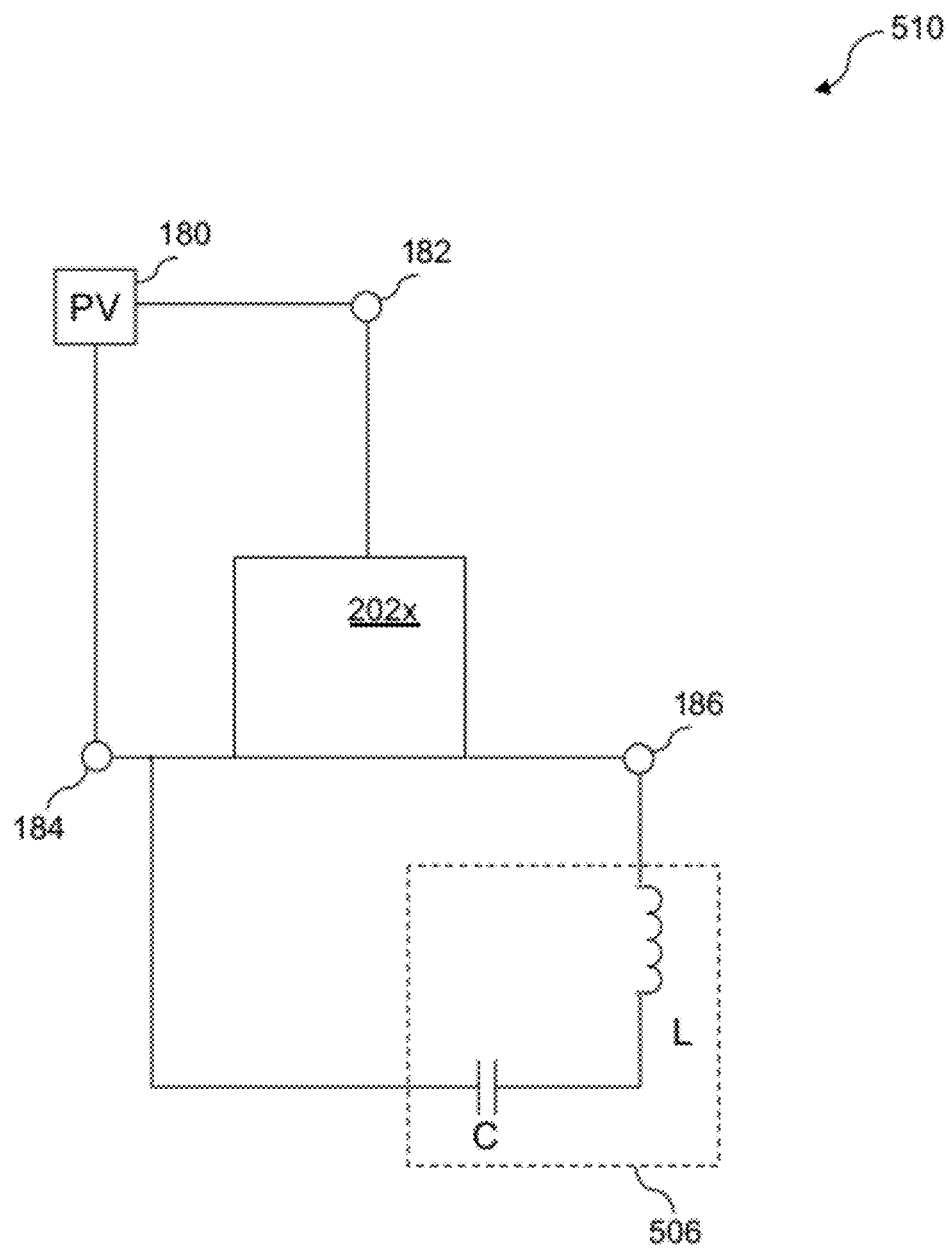
FIG. 10B illustrates a subsystem including a local management unit according to one embodiment.

FIG. 10B shows an overview of a subsystem (510) that includes the local management unit (202x), the panel voltage (180), terminals (182, 184, 186), and a notch filter (506). In one embodiment, the notch filter (506) includes an inductor Ln and a capacitor Cn. The notch filter (506) acts as a low pass filter and relies on the internal capacity of the single chip micro controller (SCMC) of the local management unit (202x). A notch frequency of the notch filter (506) sits on the switching frequency to suppress noise. In one embodiment, additional or different filters may be used.

Figure 11A:
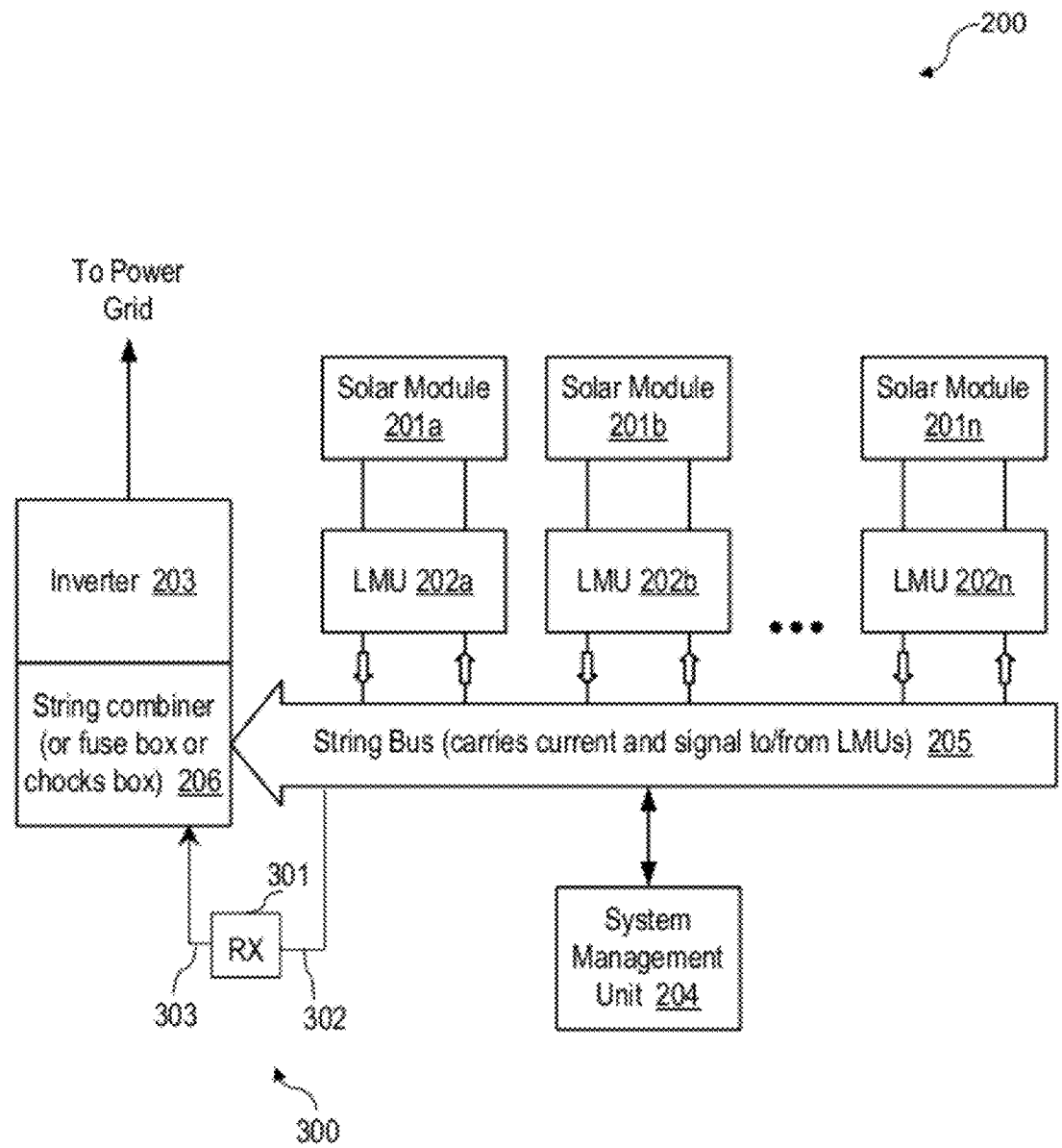
FIG. 11A illustrates a photovoltaic system according to one embodiment.

FIG. 11A shows an overview of a system (200) with a string bus (205) similar to that of system (200) previously discussed in relation to FIG. 4. In FIG. 11A, a receiver subsystem (300) is a receiving portion of a modem associated with a head end to receive modulated signals from local management units, as described in more detail below. The receiver subsystem (300) includes a receiving path separate from the string bus (205) and the combiner box (206) so that the modulated signals from the local management units can be recovered before provision to the combiner box (206) and significant noise therein. The receiver subsystem (300) includes a receiver (301), a sensing line (302), and a data output line (303). The sensing line (302) is connected to the string bus (205) and the data output line (303) connects to the combiner box (206). In one embodiment, the subsystem (300) can be inside the inverter (203). In one embodiment, the subsystem (300) is contained in the combiner box (206). The subsystem (300) is shown external to the combiner box (206) in FIG. 11A for purposes of clarity.

Figure 11B:
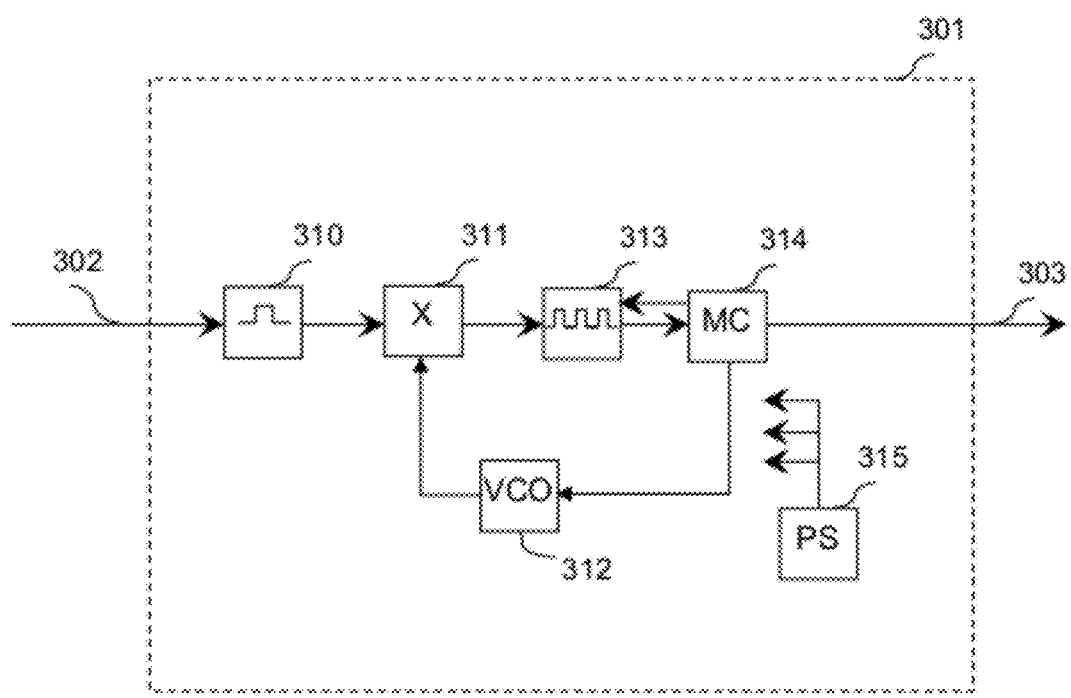
FIG. 11B illustrates a receiver of a photovoltaic system according to one embodiment.

FIG. 11B shows the receiver (301). The receiver (301) includes a band pass filter (310), a mixer (311), a beat oscillator (VCO) (312), a multiband pass filter (313), a microcontroller (314), and a power supply (315). Data from the local management unit arrives over the power bus 205 via sensing line (302), and then passes through the band pass filter (310) to improve signal-to-noise ratio. The mixer (311) mixes the output of the band pass filter (310) and the output of the VCO (312). The output of the mixer (311) is then applied to the multiband pass filter (313), where the signal is analyzed in multiple band, frequency, and time domains. The output of the multiband pass filter (313) is analyzed by the microcontroller (314). The power supply (315) can receive power from the string bus (205) or from the inverter (203) and provide it to the various elements of the receiver (301).

In one embodiment, the receiver (301) can manage communications from all the local management units. In one embodiment, each local management unit can have its own receiver. In one embodiment, a receiver can be implemented in hardware (HW) only. In one embodiment, a digital radio can be used as the receiver, in which case an analog to digital converter (ADC) samples the signals and all the processing is done in a microcontroller or a digital signal processor using software (SW), or any combination of SW and HW.

Figure 12:
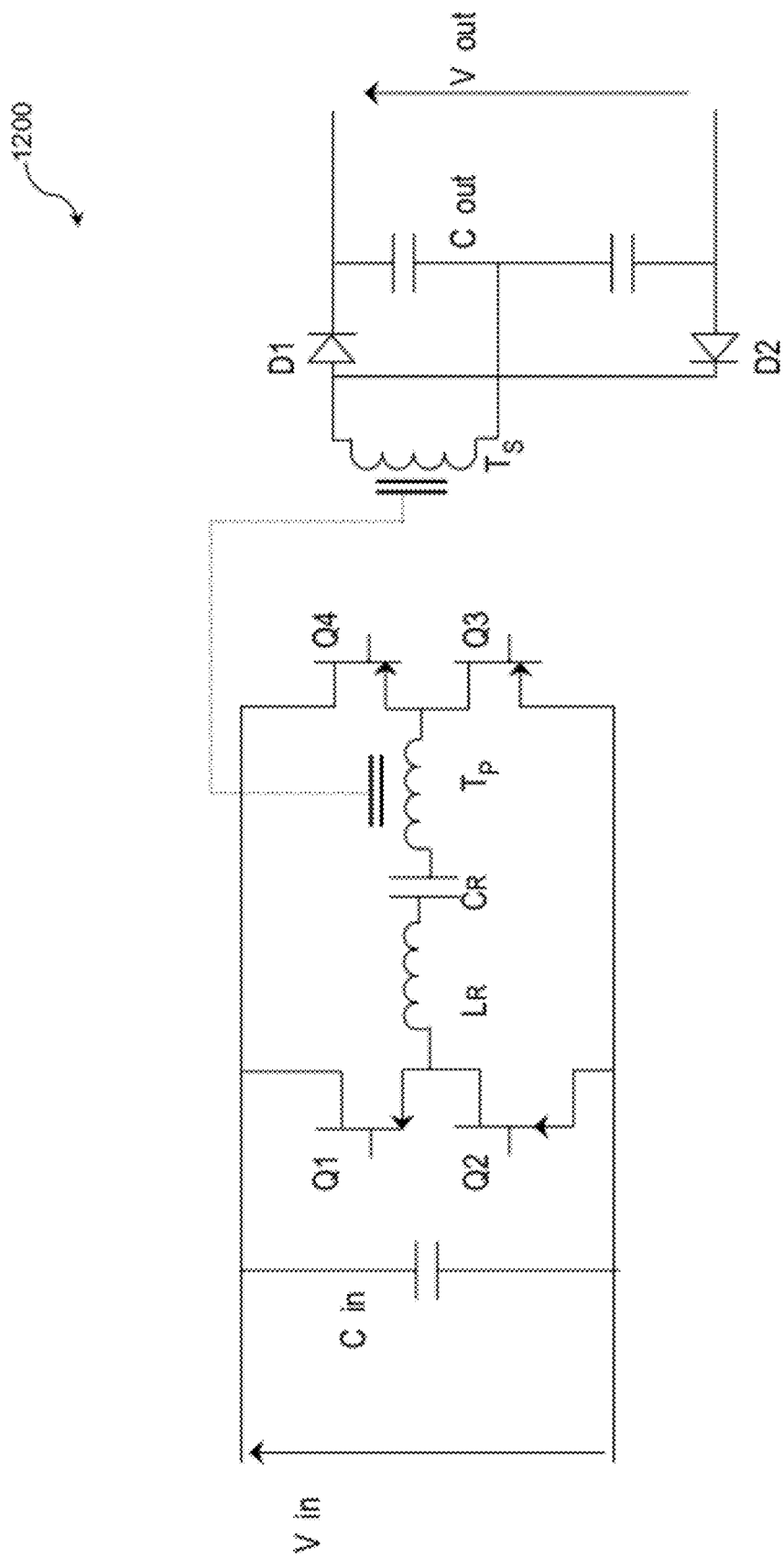
FIG. 12 illustrates a local management unit according to one embodiment.

FIG. 12 shows a novel topology of a local management unit (1200) as a distributed converter and remaining aspects of the local management unit (1200), as discussed above, are not shown for purposes of clarity. In the energy production or photovoltaic system, the local management unit (1200) in FIG. 12 can be used alternatively to the local management units discussed above. The local management unit (1200) is a series-resonant converter with phase shift operation for light load operation. The local management unit (1200) includes capacitor Cin, switches Q1, Q2, Q3, Q4, inductor LR, capacitor CR, transformer having a primary winding Tp coupled to a secondary winding Ts, diodes D1, D2, and two capacitors Cout. A typical range of input voltage Vin for the local management unit (1200) is the standard panel voltage of $V_{mp}$ plus or minus 20%. Output voltage Vout of the distributed converter is a fixed value of 375V plus or minus a few percentage points.

In operation, switch Q1 and switch Q2 are controlled oppositely, and switch Q3 and switch Q4 are controlled oppositely. When switch Q1 is on, switch Q3 is on. When switch Q2 is on, switch Q4 is on. The current can be increased or decreased by adjusting switches Q1, Q2, Q3, Q4. A controller (not shown), suitably connected to a power supply, controls the operation of the switches Q1, Q2, Q3, Q4. In one embodiment, the controller can be off the shelf and possibly modified. In one embodiment, the controller can have analog circuitry. In one embodiment, the controller can be a microcontroller. In one embodiment, the controller could be a combination of these features. As discussed below, a phase shift can be created between the currents controlled by the switches Q1, Q2, Q3, Q4. The inductor LR and the capacitor CR constitute an LC (or tank) circuit. The primary winding Tp of the transformer T is coupled to the secondary winding Ts. Diode D1, diode D2, and capacitor Cout constitute a Delon rectifier circuit. In a positive cycle, diode D1 charges the upper capacitor of capacitor Cout. In a negative cycle, diode D2 charges the lower capacitor of the capacitor Cout. Vout is effectively two times the voltage across the secondary winding Ts of the transformer T.

The local management unit (1200) requires a reliable current limit because it is required to charge a large input capacitance reflected from the inverter (203). The local management unit (1200) needs to allow operation with low input and output capacitance, because reliability does not allow the use of aluminum capacitors due to their limited life expectancy. In many instances aluminum may not be suitable for the local management unit (1200) for reasons of reliability.

Efficiency of the novel topology of the local management unit (1200) should be higher than 96 percent at the range of 20 percent to 100 percent load. The topology of the local management unit (1200) should allow direct control of input impedance for smooth MPPT control, and should minimize the need for damping networks (i.e., snubbers) in order to limit EMI emissions to improve reliability and maximize efficiency. Further, the transformer should be protected from saturation. Isolation voltage must be higher than 2000V, and switching losses reduced (i.e., zero current switching/zero voltage switching). No load condition is to be defined during inverter turn on.

Figure 13:
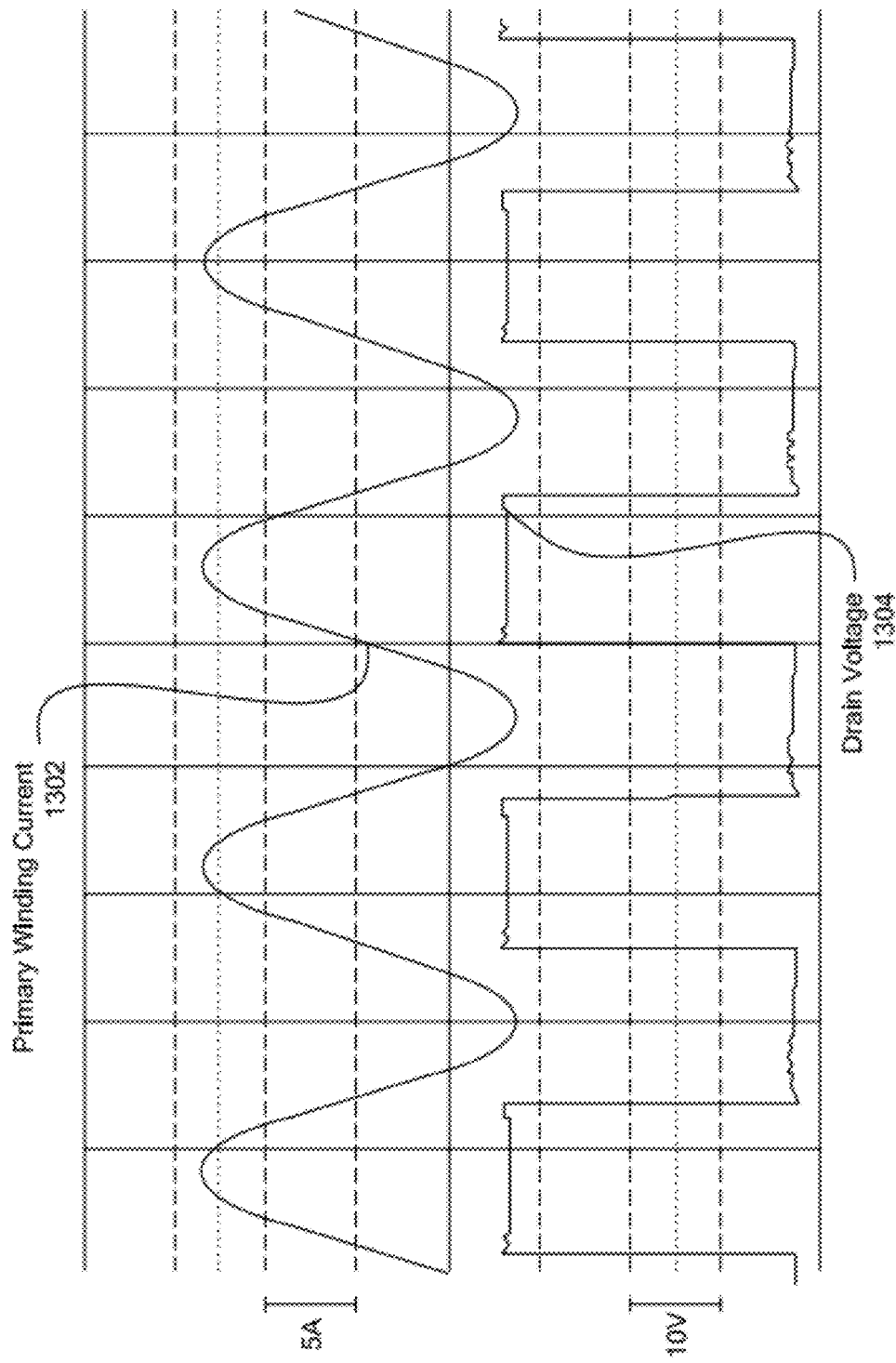
FIGS. 13-18 illustrate operation of the local management unit illustrated in FIG. 12.

The local management unit (1200) achieves the aforementioned performance goals. FIGS. 13 through 18 illustrate waveforms to show performance of the local management unit (1200) and the reduction of snub voltage transients without resort to a snubber network in the local management unit (1200). In FIG. 13, waveform 1302 shows the current through the primary winding Tp of the transformer T and waveform 1304 shows the drain voltage at the switch Q1 at the MPPT point. The waveform 1304 shows ringing on the square wave for only approximately two and a half waves at approximately one volt peak-to-peak.

Figure 14:
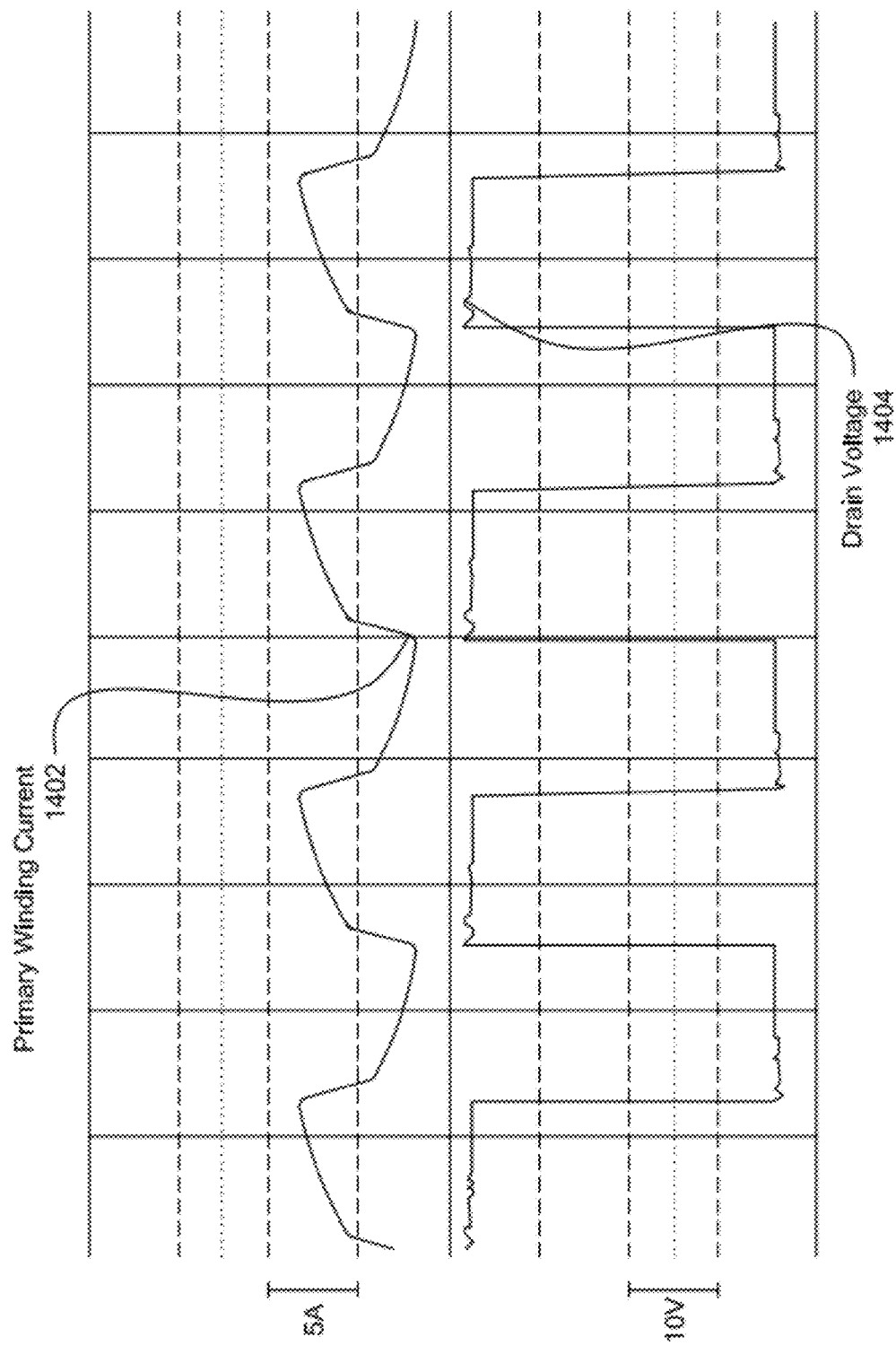

In FIG. 14, waveform 1402 shows the current through the primary winding Tp of the transformer T and waveform 1404 shows the drain voltage at the switch Q1 at 30 percent load.

Figure 15:
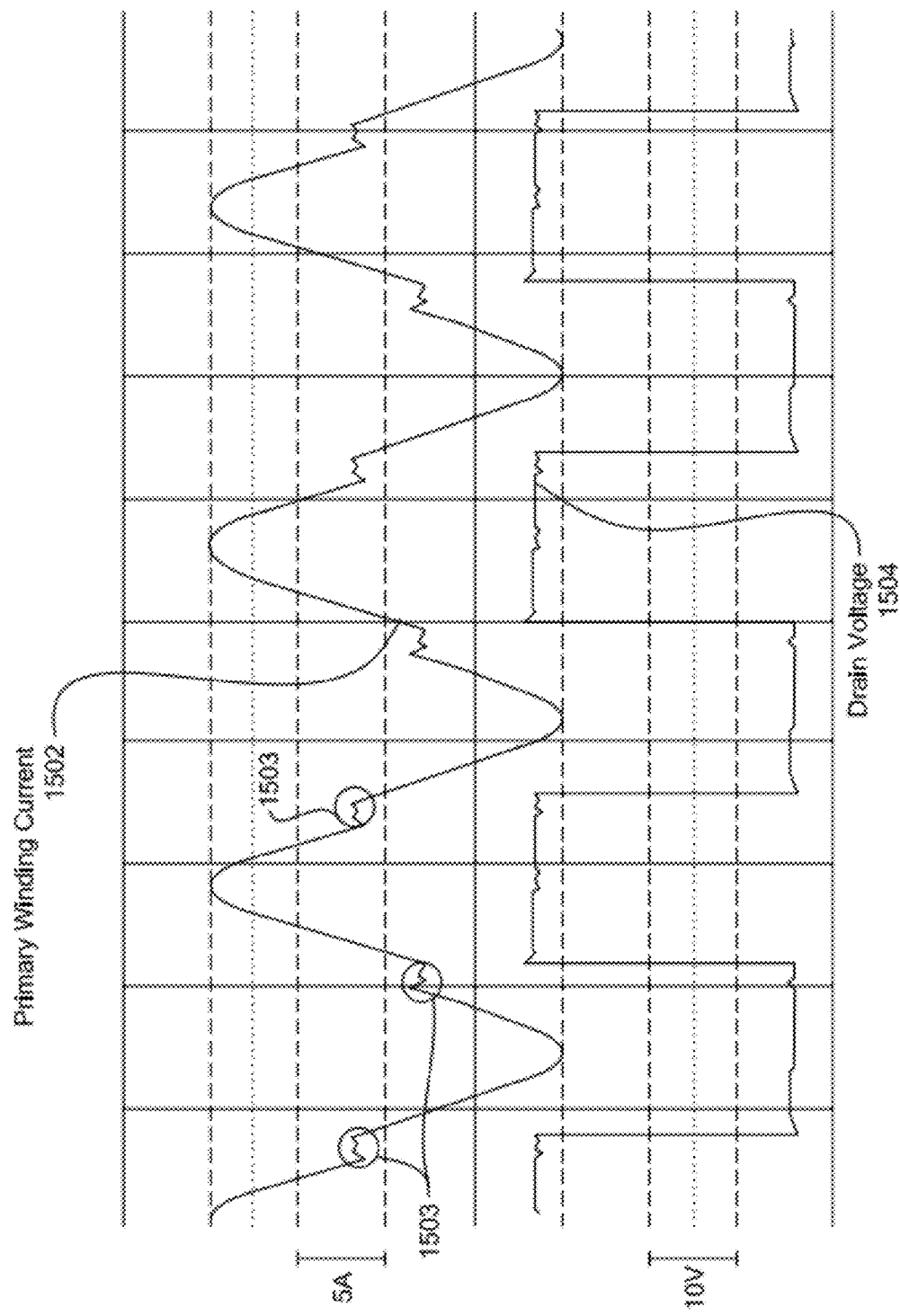

FIG. 15 shows low input voltage at full load condition. In FIG. 15, waveform 1502 shows the current through the primary winding Tp of the transformer T and waveform 1504 shows the drain voltage at the switch Q1 at full load condition. Steps (1503) in the waveform 1502 result from a phase shift between switches. The steps (1503) results is reduced undershoot and overshoot in the waveform 1504.

Figure 16:
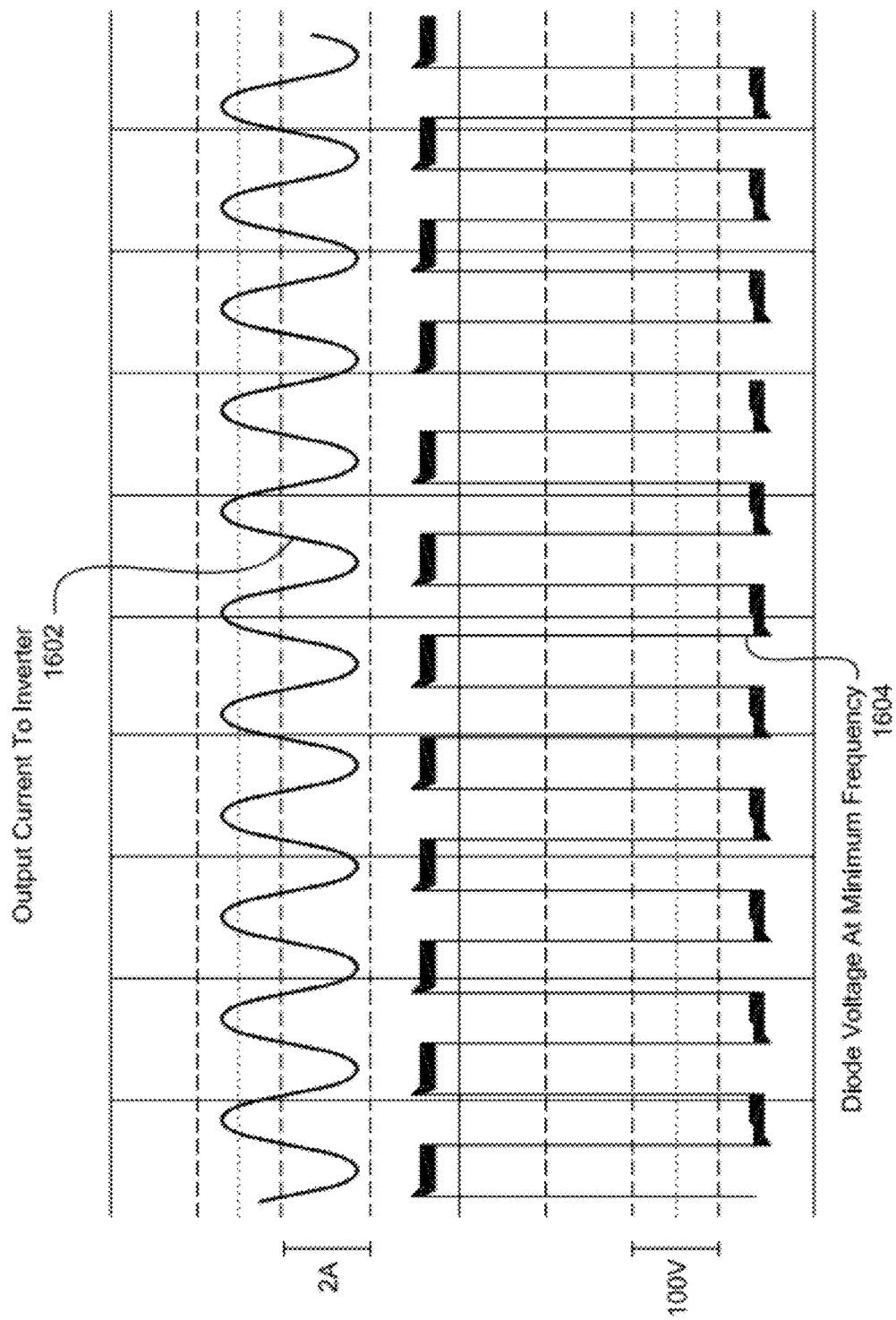

FIG. 16 shows output diode voltage at resonant frequency at maximum load. In FIG. 16, waveform 1602 shows the output current from the local management unit (1200) to the inverter (203) and waveform 1604 shows diode D1 (or diode D2) voltage at minimum frequency.

Figure 17:
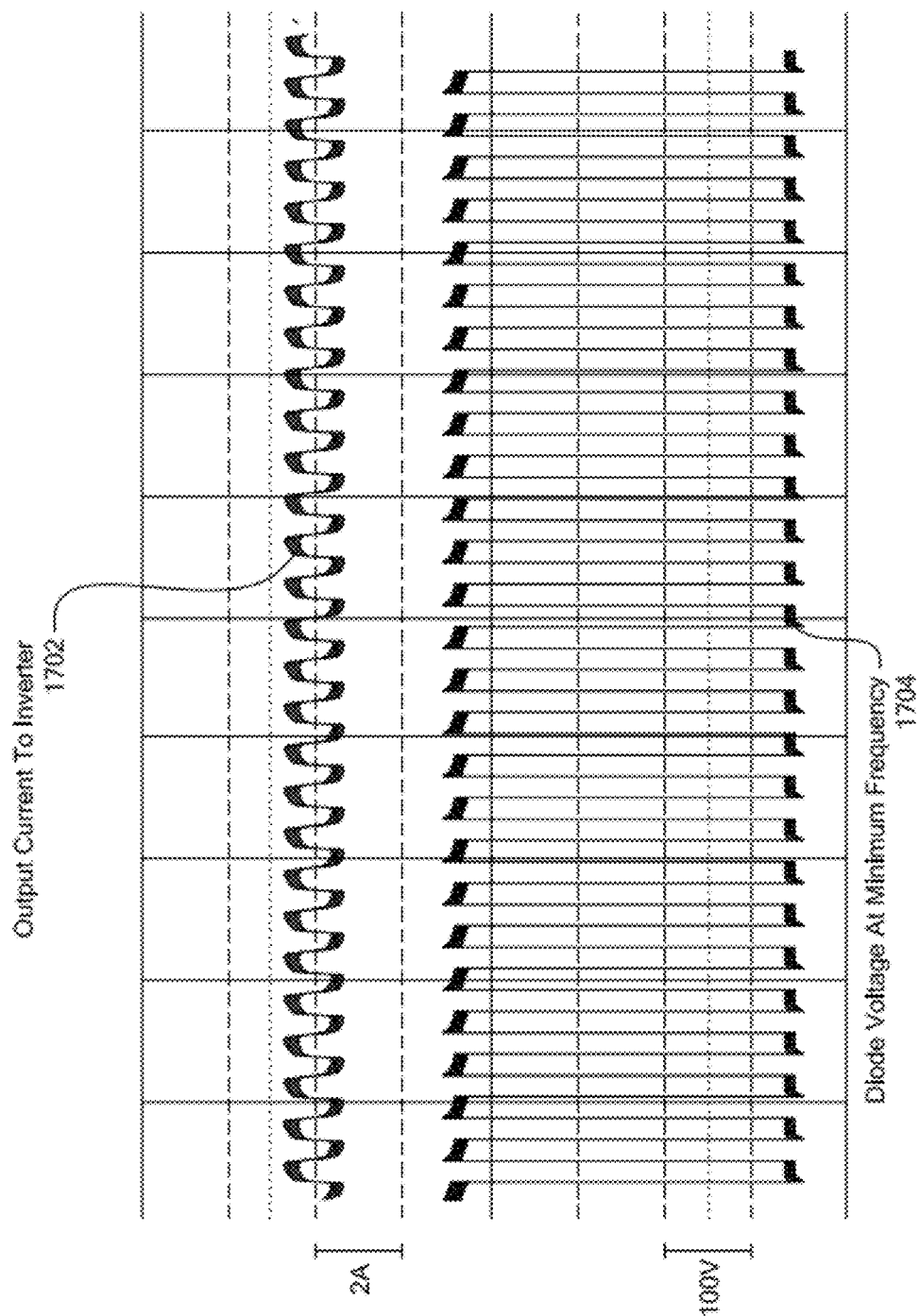

FIG. 17 shows typical output diode voltages at medium loads. In FIG. 17, waveform 1702 shows the output current from the local management unit (1200) to the inverter (203) and waveform 1704 shows diode D1 (or diode D2) voltage at minimum frequency.

For loads higher than 15 percent of the maximum load, switches Q1, Q3 are operated together at 50 percent duty cycle, while switches Q4, Q2 are operated together at 50 percent duty cycle with no phase shift. Input power is controlled by changing operating frequency of the local management unit (1200) above and below the resonant frequency. Turn ratio of the primary winding Tp and secondary winding Ts is set according to MPPT voltage because at this voltage efficiency is at the highest point (i.e., zero voltage, zero current is achieved). For other frequencies, switching is performed at zero voltage because there is current in the primary winding Tp and resonant tank that is maintained, and this current causes voltage shift that allows turn-on to be performed at zero voltage.

Below 15 percent of load, the local management unit (1200) is operated in phase shift mode. In phase shift mode, switches Q1, Q2 are reversed, and switches Q3, Q4 are reversed. However, a phase shift causes switches Q3 and Q4 to conduct together part of the time, and likewise for switches Q1, Q4. A phase shift operation allows no load and light load control. As shown in, for example, FIG. 15, steps 1503 in the waveform 1502 are caused by the phase shift. The phase shift range and frequency range are optimized for maximum efficiency by the local management unit (1200). The switches (primary transistors) do not have off spike because they are clamped to the input bus. The phase shift minimizes ringing (and overshoot and undershoot), which in turn increases efficiency, reduces EMI, and reduces heat losses. Secondary diodes D1, D2 are connected in center tap configuration to prevent voltage spikes from developing across them during turn-off and eliminating need for clamping components.

As shown in FIG. 16, a phase shift between the switches, as described above, causes a reduction in undershoot and overshoot in the diode D1 voltage without implementation of snubber networks. As a result, efficiency of the local management unit (1200) is improved both on the switch side and the diode side. In one embodiment, efficiency is improved on each side by approximately 1-2%.

In the local management unit (1200), a resonant tank provides a limit to the current through the primary winding Tp. A serial capacitor CR prevents transformer saturation. Output rectifier voltage is clamped to output voltage Vout allowing the use of 600V ultra fast diodes. There are no spikes across the switching transistors. Transformer parameters act as part of resonant tank. Input voltage range and efficiency are optimized for solar module operation by transformer turn ratio and transformer small air gap. Resonant frequency controls input impedance, which is the required control parameter for the application of separate solar modules operating against a fixed voltage inverter load in the system.

Figure 18:
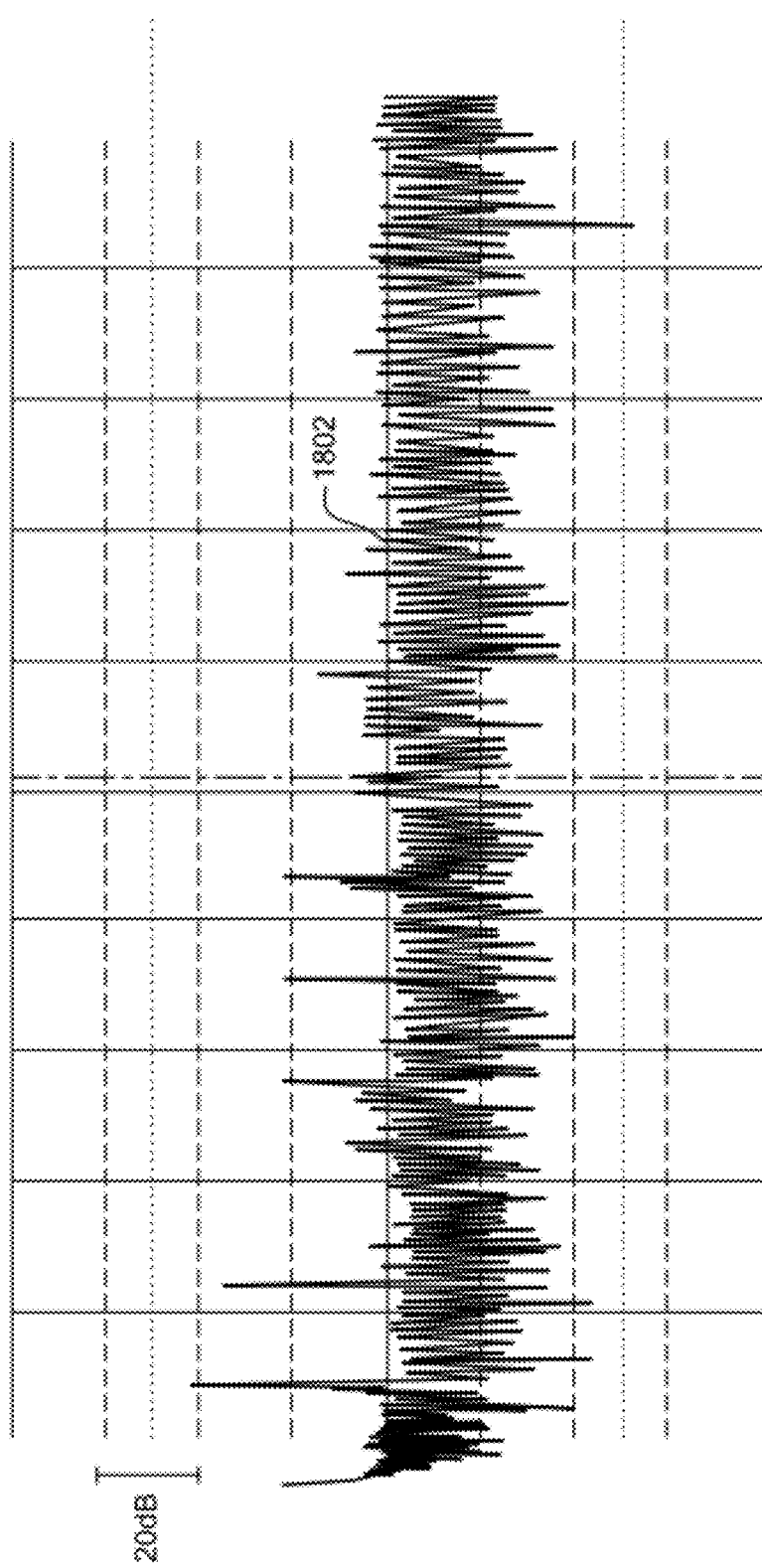

FIG. 18 shows a spectral waveform (1802) of typical emission characteristics of the local management unit (1200). Current ripple of the local management unit (1200) is measured with a current probe. Most of the current ripple comes from the inverter (203). In one embodiment, the inverter (203) is an off the shelf item. From the spectral waveform (1802), it can be seen that data transmission is possible but needs to be in the same level or higher level than the noise level. It can be seen that the maximum noise level value is approximately 35 dB. Switching frequency is clearly seen and can be detected in the spectral waveform (1802).

Figure 19:
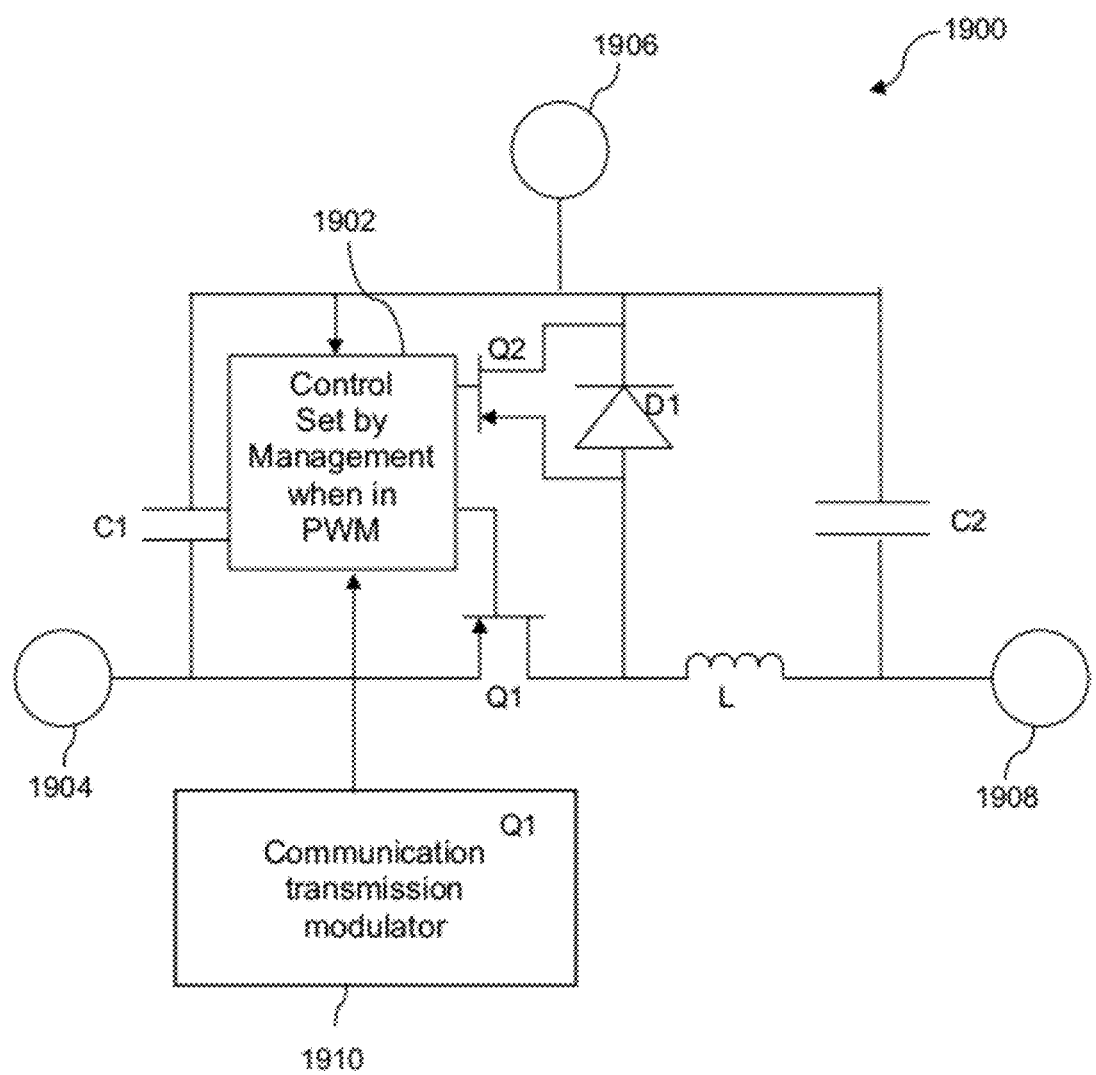
FIG. 19 illustrates a local management unit and transmission modulator according to one embodiment.

FIG. 19 shows a local management unit (1900) that can be used in accordance with the present invention. The local management unit (1900) can be used in place of the local management units discussed above. The local management unit (1900) includes a capacitor C1, switches Q1, Q2, diode D1, inductor L, capacitor C2, controller 1902, terminals 1904, 1906, 1908, and communication transmission modulator 1910. Operation of the local management unit (1900) is similar to the operation of the local management units, as discussed above. Data transmission by the local management unit (1900) involves modulating the switching frequency of the local management unit (1900) and transferring data by using the solar module itself as power amplifier (PA).

Operation of the local management units in FIGS. 1-3A and FIG. 12 involve pulse width modulation (PWM), as discussed above. The PWM technique creates noise, as shown in, for example, FIG. 18. The created noise can be modulated to transmit data over the string bus (205) from a solar module (or slave node) to a head unit (master) in the energy production or photovoltaic system. The use of noise in this way avoids the need to provide a costly separate, dedicated communications channel from the solar module to the head unit.

The communication transmission modulator (1910) modulates switching of the pulse width modulation (PWM) operation to transmit data from the local management unit (1900). Various modulation encoding schemes can be used, such as, for example, modified FM (MFM) and Manchester coding. In one embodiment, another modulating and encoding scheme can be used. In one embodiment, the communication transmission modulator (1910) represents the transmission portion of a modem (not shown) that is associated with the local management unit (1900). In one embodiment, the communication transmission modulator (1910) is part of the local management unit (1900). In one embodiment, the communication transmission modulator (1910) is external to the local management unit (1900).

This system allows the use of full duplex (two-way) communications. The receiver at the module side can be implemented within the module circuitry. The limitation of transmit and receive within same circuit does not exist. Transmission from management unit can be used to synchronize modules. Reliability is not affected by transmission. The effect on overall performance is very small because the transmission duty cycle from the module is low.

Weak solar modules in a string bus, and weak string buses in a solar array can bring down the total output power of the solar array. Traditional solar arrays may not be able to overcome this problem since the output of individual solar modules and string buses may not be controllable independently of other solar modules and string buses. The systems and methods herein disclosed monitor and adjust individual solar module outputs such that weak solar modules are balanced with strong solar modules in a string bus, and strong string buses are balanced with weak string buses in a solar array. Once balancing within string buses and between string buses has been accomplished, an inverter using maximum power point tracking (MPPT) can determine the maximum power point for the solar array.

Figure 27:
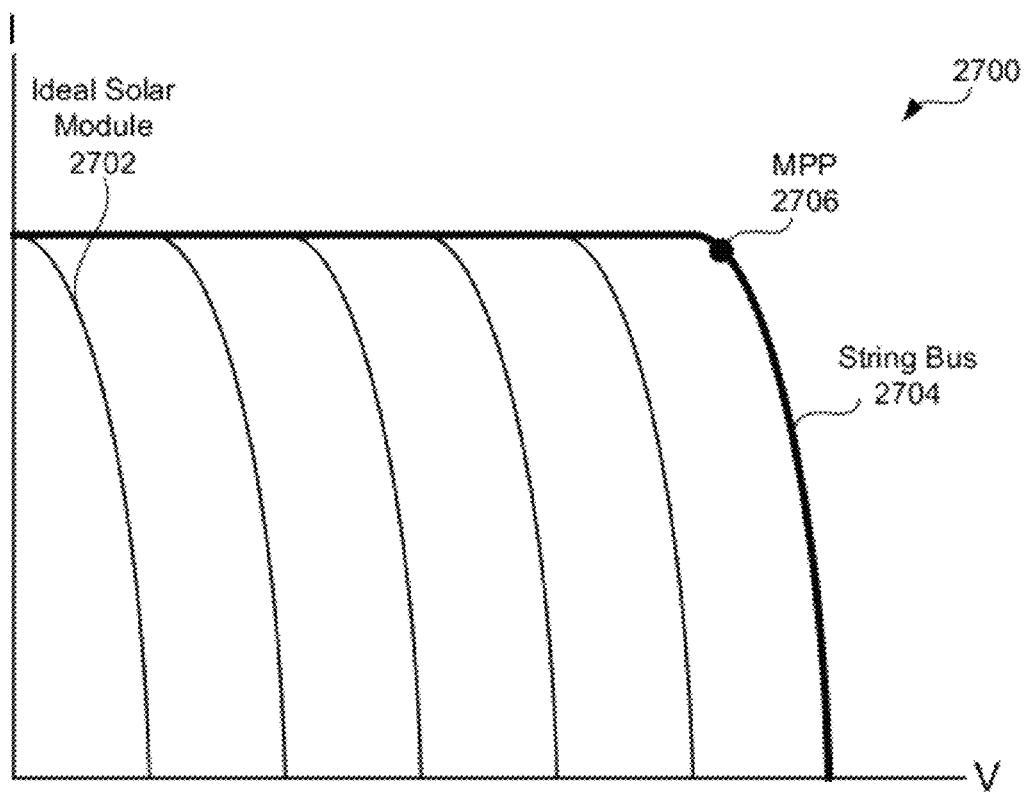
FIG. 27 illustrates an I-V curve (2700) for a string bus where all solar modules (2702) are operating at their ideal outputs.

Three I-V curves for a string bus will now be used to describe balancing solar modules on a string bus. FIG. 27 illustrates an I-V curve (2700) for a string bus where all solar modules (2702) are operating at their ideal outputs. There are six solar modules (2702) in the illustrated string bus. A string bus I-V curve (2704) is derived from a composite of all six ideal solar module I-V curves (2702). The voltage of the string bus (2704) is derived by adding the voltages provided by each solar module (2702). The MPP (2706) is the point on the string bus I-V curve (2704) where current times voltage is maximized.

Figure 28:
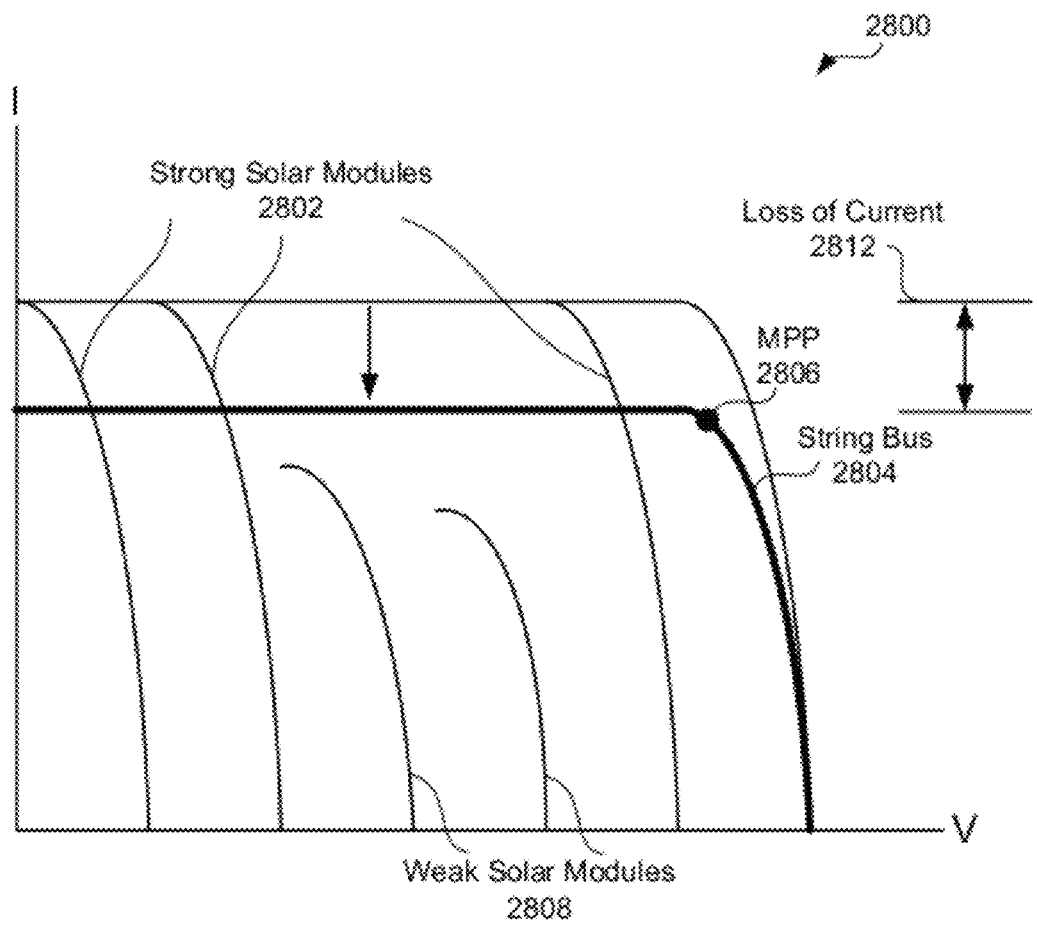
FIG. 28 illustrates an I-V curve (2800) for a string bus where two solar modules are operating as weak solar modules.

FIG. 28 illustrates an I-V curve (2800) for a string bus where two solar modules are operating as weak solar modules. The weak solar modules (2808) produce the same voltage as the strong solar modules (2802), but cannot produce as large of currents. The string bus sees a loss of current (2812), since the string bus (2804) cannot produce the maximum current of the strong solar modules (2802). The MPP (2806) is lower than that seen in the ideal string bus illustrated in FIG. 27. In this operating region, the strong solar modules (2902) are operating at maximum voltage, but are incapable of operating at their maximum current. The string bus is thus producing less energy than what it is capable of.

Figure 29:
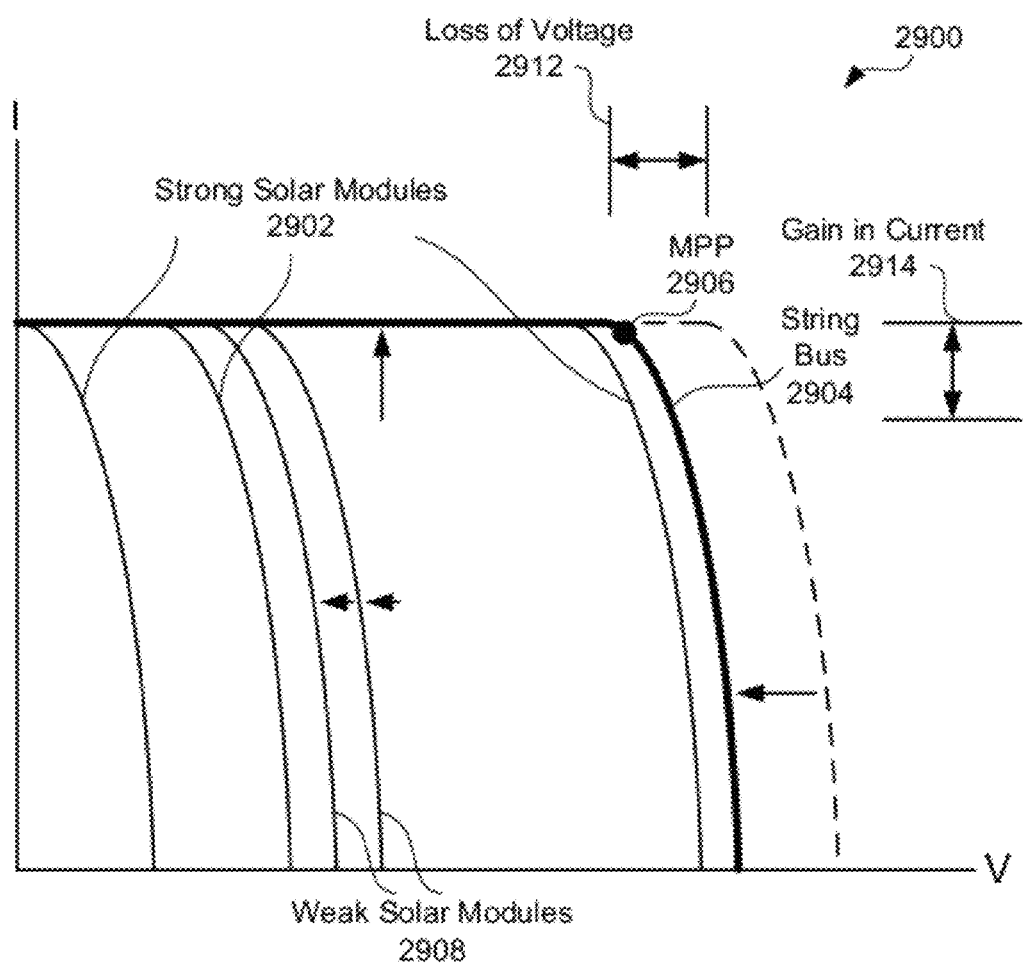
FIG. 29 illustrates an I-V curve (2900) for a string bus implementing the systems and methods of this disclosure.

FIG. 29 illustrates an I-V curve (2900) for a string bus implementing the systems and methods of this disclosure. The voltage of the two weak solar modules (2908) can be decreased, which in turn increases their current. The voltage can be decreased until the current balances with the current from the strong solar modules (2902). This is what is meant by balancing solar modules on a string bus. As a result, the string bus voltage output decreases by a small value (2912) equal to the decrease in voltage for the two weak solar modules (2908). However, the string bus current rises by a larger value (2914) to the level of what the strong solar modules (2902) are capable of producing. The maximum power produced from the MPP (2906) of this I-V curve (2900) is greater than the maximum power produced when the weak solar modules are holding down the current of the strong solar modules (FIG. 28). Stated differently, the sacrifice in voltage is more than compensated for by the increased current.

Figure 30:
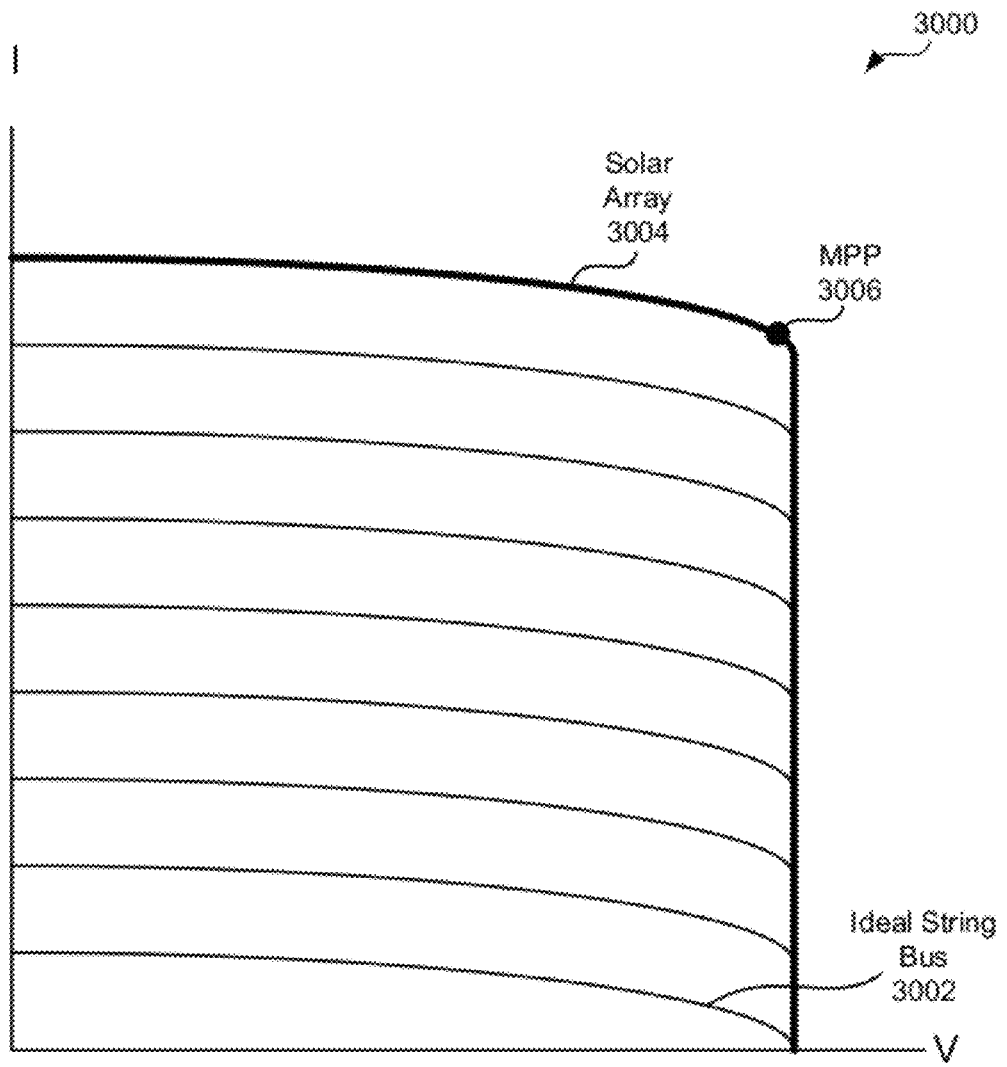
FIG. 30 illustrates an I-V curve (3000) for a solar array where all string buses (3002) are operating at their ideal outputs.

Three I-V curves for a solar array will now be used to describe balancing string buses in a solar array. FIG. 30 illustrates an I-V curve (3000) for a solar array where all string buses (3002) are operating at their ideal outputs. There are nine string buses (3002) in the illustrated solar array. A solar array I-V curve (3004) is derived from a composite of all nine ideal string bus I-V curves (3002). The current of the solar array (3004) is derived by adding the currents provided by each string bus (3002). The MPP (3006) is the point on the solar array I-V curve (3004) where current times voltage is maximized.

Figure 31:
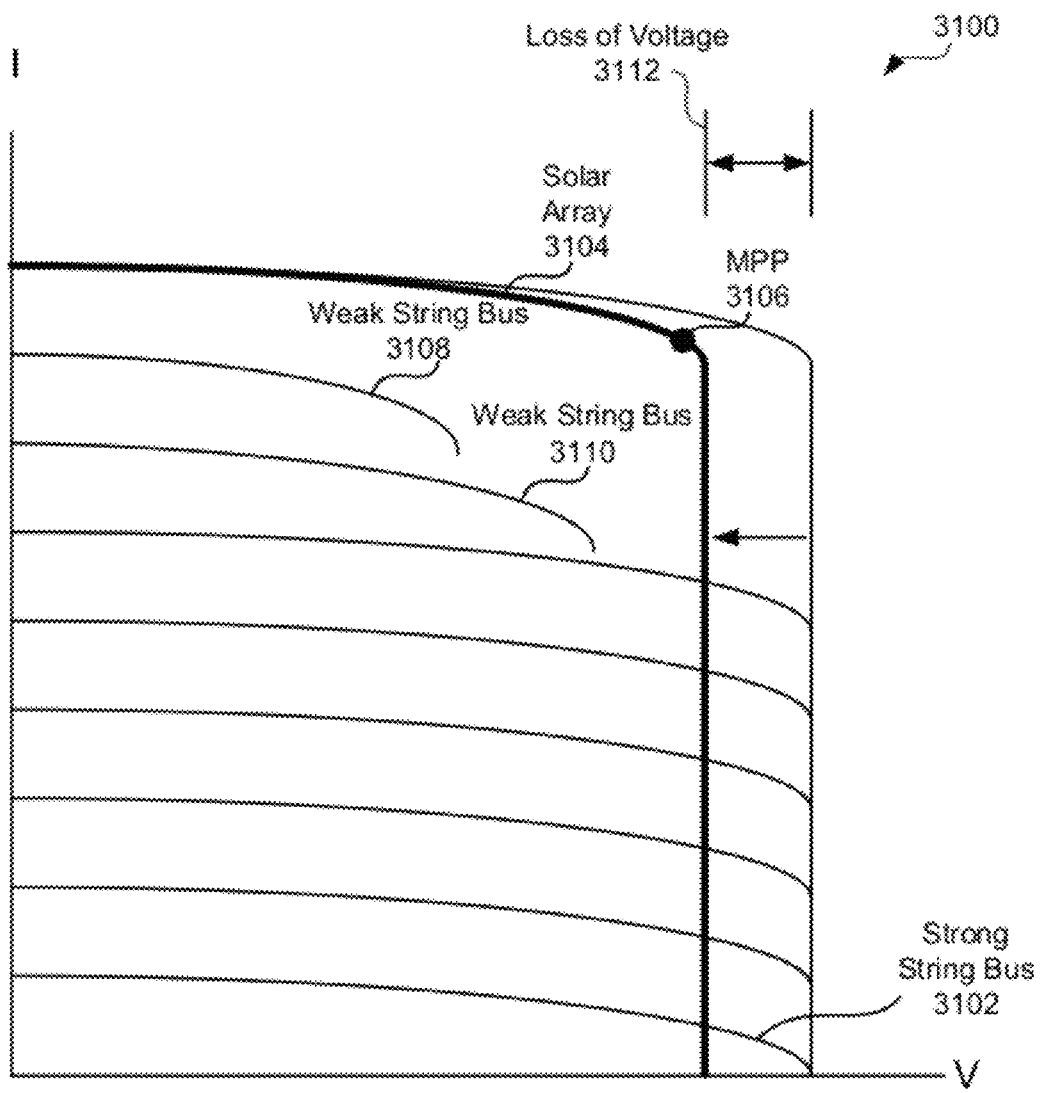
FIG. 31 illustrates an I-V curve (3100) for a solar array where two string buses are operating as weak string buses.

FIG. 31 illustrates an I-V curve (3100) for a solar array where two string buses are operating as weak string buses. The weak string buses (3108, 3110) produce the same current as the strong string buses (3102), but cannot produce as large of voltages. The solar array sees a loss of voltage (3112), since the solar array (3104) cannot produce the maximum voltage of the strong string buses (3102). The MPP (3106) is lower than that seen in the ideal solar array illustrated in FIG. 30. In this operating region, the strong string buses (3102) are operating at maximum current, but are incapable of operating at their maximum voltage. The solar array is thus producing less energy than what it is capable of.

Figure 32:
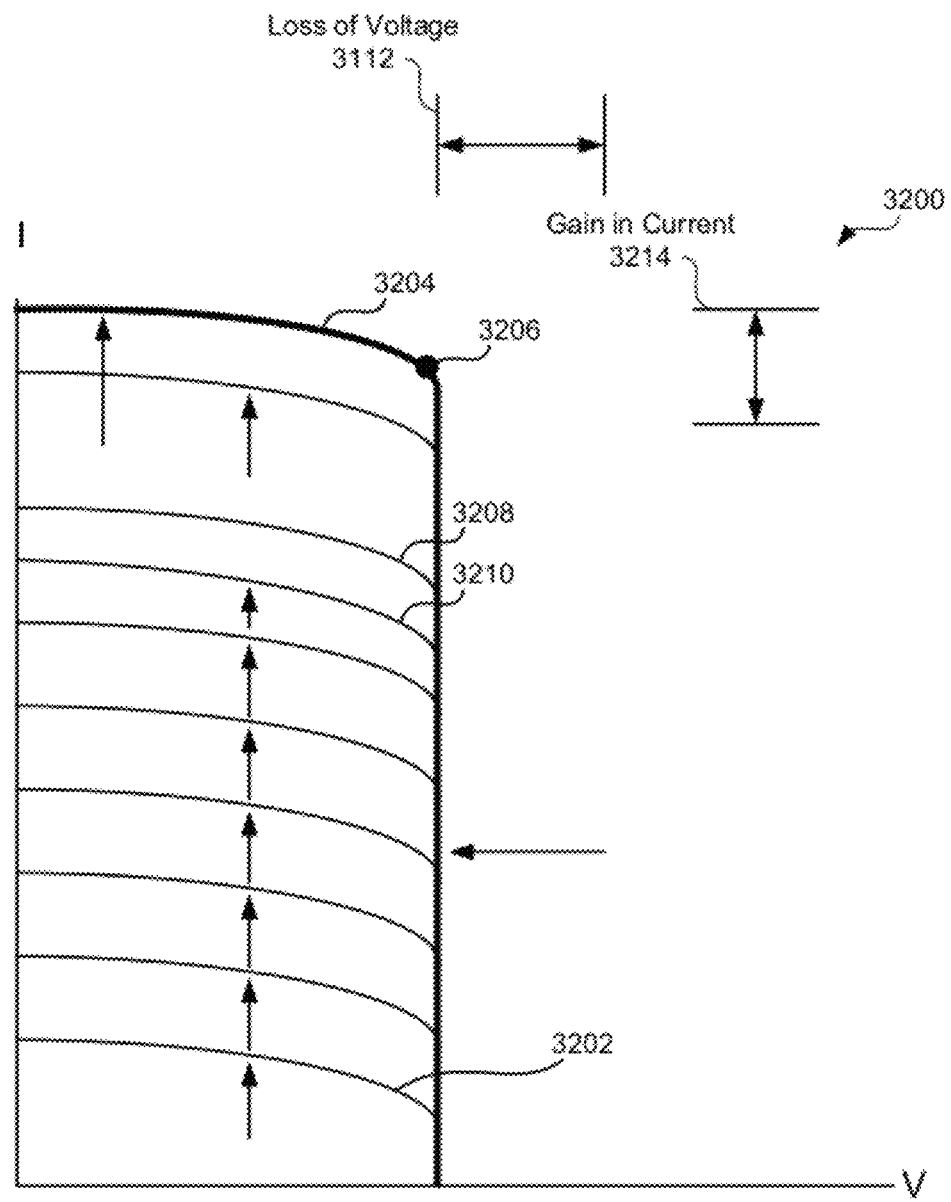
FIG. 32 illustrates an I-V curve (3200) for a solar array implementing the systems and methods of this disclosure.

FIG. 32 illustrates an I-V curve (3200) for a solar array implementing the systems and methods of this disclosure. Voltages of strong string buses (3202) can be decreased, which in turn increases the current output from strong string buses (3202). The voltages can be decreased until all string bus voltages balance with the voltage of the weakest string bus (3208). This is what is meant by balancing string buses in a solar array. As a result, the solar array voltage output decreases by a value (3112) equal to the decrease in voltage for the strong string buses (3202). However, the solar array gain in current (3214) is equal to the sum of the increased currents from all of the strong string buses (3202) whose voltages were decreased. The maximum power produced from the MPP (3206) of this I-V curve (3200) is greater than the maximum power produced when the weak string buses (3208) were holding down the voltage of the strong string buses (3202). Stated differently, the sacrifice in voltage is more than compensated for by the increased current, even when conversion losses are accounted for.

In an embodiment, the voltages of the strong string buses (3202) can be decreased until the string bus voltage balances with the voltage of the one or more weak string buses (3208, 3210). Since the weak string buses (3208, 3210) may not operate at the same maximum voltage (e.g., (3210)>(3208)), strong string buses (3202) may be balanced with an average of the weak string buses (3208), (3210)

It should be understood that FIGS. 27-32 are not drawn to scale, and are illustrative only. The curvatures of the I-V curves are also merely illustrative and can vary significantly depending on the actual systems that the I-V curves represent. Although six solar modules and nine string buses were described, these numbers are illustrative only. Any number of solar modules and string buses can be used.

Balancing solar modules in a string bus means that the solar module currents converge. In an embodiment, balancing solar modules in a string bus means that weak solar module currents converge on strong solar module currents. Balancing string buses in a solar array means that string bus voltages converge. In an embodiment, balancing string buses in a solar array means that strong string bus voltages converge on weak string bus voltages. It should be understood that balancing need not mean an exact balance. Two values may only converge to within a threshold value of each other—a relative equivalency. For instance, two currents that are to be balanced by causing them to converge on 1 amp, may be considered balanced if they come within 0.1 amp of the 1 amp goal. Two currents that are to be balanced by causing them to converge may be considered balanced when they are within five percent of each other. However, even when balanced, the process is iterative and will continue indefinitely. This is because the solar module performance changes, the load changes, and local conditions (e.g., clouds, leaves, dirt, to name a few). Furthermore, every balancing of a string bus may require a balancing of solar modules on each string bus, and every balancing of solar modules on each string bus may require a balancing of string buses.

Figure 4B:
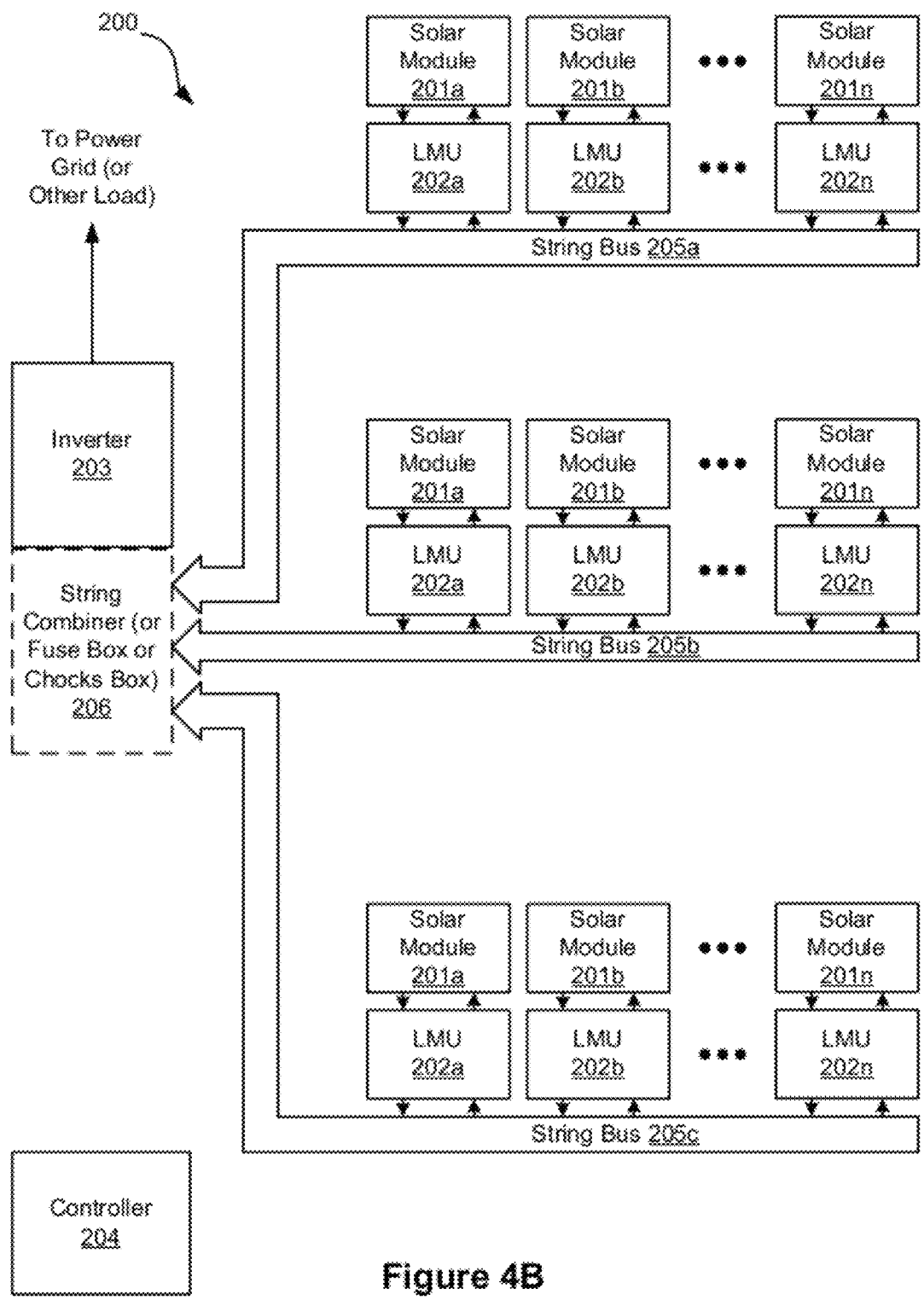

FIG. 4B illustrates an embodiment of a solar array along with an inverter and a string combiner. In the illustrated embodiment the solar array 200 includes three string buses (205a, 205b, 205c), although one or more string buses (205a, 205b, 205c) can also be used. The string buses enable a series connection of solar modules (201a, 201b, . . . , 201n). Coupled between each solar module (201a, 201b, . . . 201n) and its corresponding string bus (205a, 205b, 205c), is a local management unit (LMU) (202a, 202b, . . . , 202n). The LMU's (202a, 202b, . . . , 202n) are controlled by a controller (204). The controller (204) can communicate wirelessly with the LMU's (202a, 202b, . . . , 202n) or via wireless repeaters. In an embodiment (not illustrated), wired connections between the controller (204) and the LMU's (202a, 202b, . . . , 202n) can be implemented. String bus (205a, 205b, 205c) outputs are connected at an inverter (203) or in an optional string combiner (206). The controller (204) may be configured to balance current outputs from the solar modules on a string bus (205a, 205b, 205c). This can be done for each string bus (205a, 205b, 205c). Once, the current outputs from solar modules (201a, 201b, . . . , 201n) on a string bus (205a, 205b, 205c) are balanced (weak solar module currents are raised to the level of strong solar module currents within a string), the controller (204) may balance the current outputs from the string buses (205a, 205b, 205c) (strong string bus voltages are lowered to the level of weak string bus voltages, which in turn raise strong string bus currents and hence the solar array current). This process can be repeated or an inverter (203) can then attempt to determine the MPPT for the solar array (200).

A "solar array" typically comprises two or more solar modules series-connected via a string bus where the output voltage is a sum of the voltages of the series-connected solar modules. In larger solar arrays, string buses can be connected in parallel such that their currents add. A combiner and inverter are not part of the solar array.

Balancing current outputs of solar modules (201a, 201b, . . . , 201n) on a string bus (205a, 205b, 205c) will now be discussed in more depth. The controller (204) may be configured to balance the currents produced by the solar modules (201a, 201b, . . . , 201n) on a given string bus (205a, 205b, 205c), and perform this balancing for each string bus (205a, 205b, 205c). As a result, the currents from the solar modules (201a, 201b, . . . , 201n) on a string bus (205a, 205b, 205c) may be balanced.

In order to balance solar modules (201a, 201b, . . . , 201n) on a string bus (205a, 205b, 205c), it can be useful to identify strong solar modules (201a, 201b, . . . , 201n) and weak solar modules (201a, 201b, . . . , 201n). This is done by varying the current on a string bus (205a, 205b, 205c), monitoring the resulting change in voltage in each solar module (201a, 201b, . . . , 201n), and comparing the changes in voltage on each solar module (201a, 201b, . . . , 201n) to identify strong solar modules (201a, 201b, . . . , 201n) and weak solar modules (201a, 201b, . . . , 201n).

Varying the current on the string bus (205a, 205b, 205c) may involve the inverter (203) pulling a different current from the string bus (205a, 205b, 205c). It may involve varying an impedance seen by the string bus (205a, 205b, 205c). For instance, the inverter (203) can vary the impedance that the string bus (205a, 205b, 205c) sees, and in doing so the current and voltage produced by the solar modules (201a, 201b, . . . , 201n) on the string bus (205a, 205b, 205c) will vary. In other words, pulling a different current or changing the impedance changes where on the I-V curve each solar module (201a, 201b, . . . , 201n) operates at. Since current for devices connected in series is the same, a change in current on the string bus (205a, 205b, 205c) causes the same change in current for each solar module (201a, 201b, . . . , 201n) on the string bus (205a, 205b, 205c). However, the changes in voltage may not be the same, since the solar modules (201a, 201b, . . . , 201n) may operate at different operating points on the I-V curve.

Figure 22:
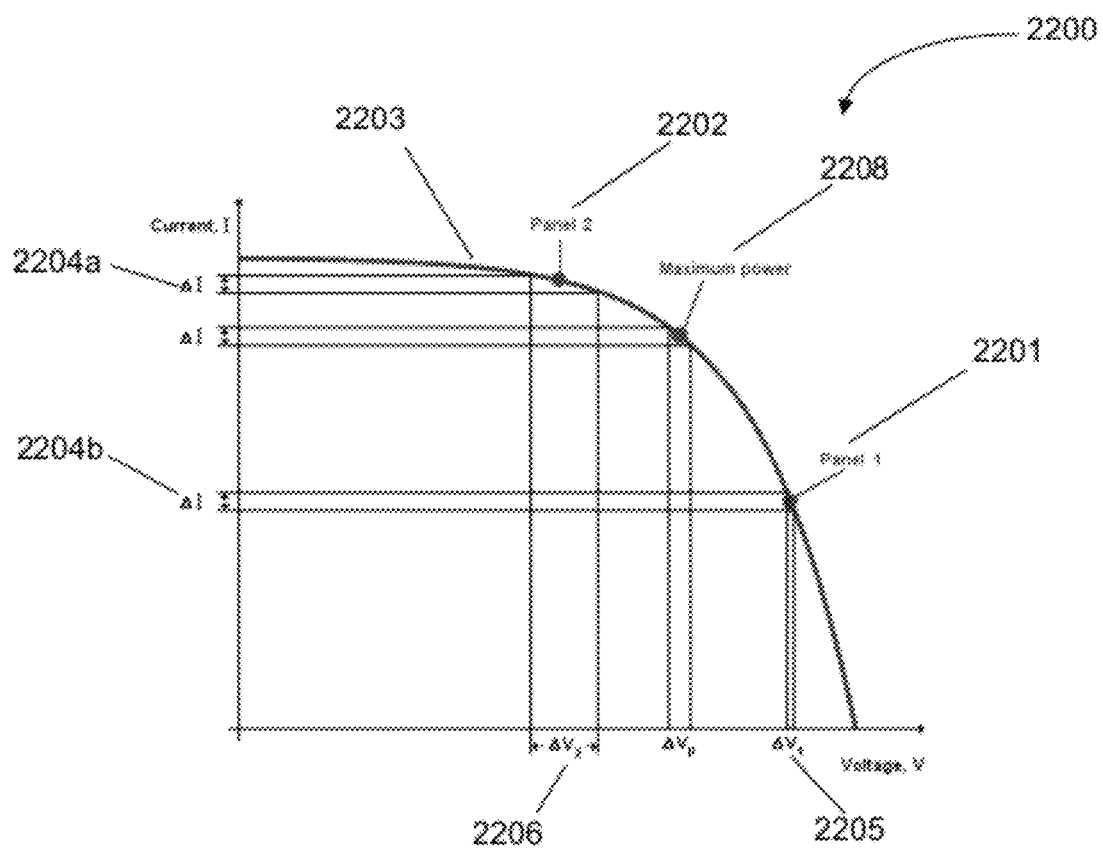
FIG. 22 illustrates an exemplary composite I-V curve for solar modules in a solar array.

This can be seen in FIG. 22, which illustrates an example of a composite I-V curve (2203) for solar modules on a string bus. This composite I-V curve (2203) is not drawn to scale. Working points for two different solar modules can be seen in FIG. 22. The working point (2202) has a lower-angled slope and represents a weak solar module. The working point (2201) has a higher-angled slope and represents a strong solar module. The variation in string bus current (2204a) for the weak solar module is the same as the variation in string bus current (2204b) for the strong solar module since the solar modules are connected in series, and thus must operate at the same current. However, since the two solar modules are at different working points on the I-V curve (2203), the resulting change in voltage (2206, 2205) for each is not the same. The change in voltage $dV_2$ (2206) for the weak solar module is greater than the change in voltage $dV_1$ (2205) for the strong solar module.

By identifying strong and weak solar modules, based on the changes in voltage $dV_1$, $dV_2$, one can determine which solar module(s) (201a, 201b, . . . , 201n) to adjust. Strong solar modules (201a, 201b, . . . , 201n) can be used as a reference. Strong solar modules (201a, 201b, . . . , 201n) may not be adjusted, while weak solar module (201a, 201b, . . . , 201n) voltages can be decreased until their current outputs converge on the strong solar module (201a, 201b, . . . , 201n) outputs (or an average strong solar module (201a, 201b, . . . , 201n) current output). This raises the current output of the string bus (205a, 205b, 205c), while decreasing the string bus (205a, 205b, 205c) voltage output. However, the net effect is greater power output from the string bus since the loss in voltage is more than compensated for by the increased current. The end result may preferably be working points that are proximal for all solar modules (201a, 201b, . . . , 201n), that is balanced or near balanced current outputs. An indication that balancing has been achieved and that the solar modules (201a, 201b, . . . , 201n) are operating near the maximum current output of the strong solar modules (201a, 201b, . . . , 201n), is that a variation in the current along the string bus (205a, 205b, 205c) will cause a nearly equivalent change in voltage for each solar module (201a, 201b, . . . , 201n).

In an embodiment, instead of using strong solar modules (201a, 201b, . . . , 201n) as the reference, an average of all solar modules (201a, 201b, . . . , 201n) on a string bus (205a, 205b, 205c) can be used as a reference. In this embodiment, all solar modules (201a, 201b, . . . , 201n) on the string bus (205a, 205b, 205c) can be adjusted, including strong solar modules (201a, 201b, . . . , 201n), until their current outputs converge on the average. In an embodiment, the controller (204) can identify strong and weak solar modules (201a, 201b, . . . , 201n) of all solar modules (201a, 201b, . . . , 201n) on a string bus (205a, 205b, 205c).

In an embodiment, the change in voltage $dV_i$ for each solar module (201a, 201b, . . . , 201n) can be checked for anomalies, and those measurements appearing to be erroneous can be ignored or eliminated and replaced with a new measurement of $dV_i$. In an embodiment, at least one solar module (201a, 201b, . . . , 201n) can be identified as a strong solar module (201a, 201b, . . . , 201n). In an embodiment, the solar modules (201a, 201b, . . . , 201n) identified as strong solar modules (201a, 201b, . . . , 201n) may be left out of the other steps involved in balancing a string bus (205a, 205b, 205c) (e.g., strong solar module (201a, 201b, . . . , 201n) current outputs may not be changed while the current outputs of weak solar modules (201a, 201b, . . . , 201n) are changed).

String buses (205a, 205b, 205c) may be connected in parallel and have an output that is optionally connected to a string combiner (206) (or fuse box or chocks box). In an embodiment, the output of the string buses (205a, 205b, 205c) can be connected to the inverter (203).

Figure 21:
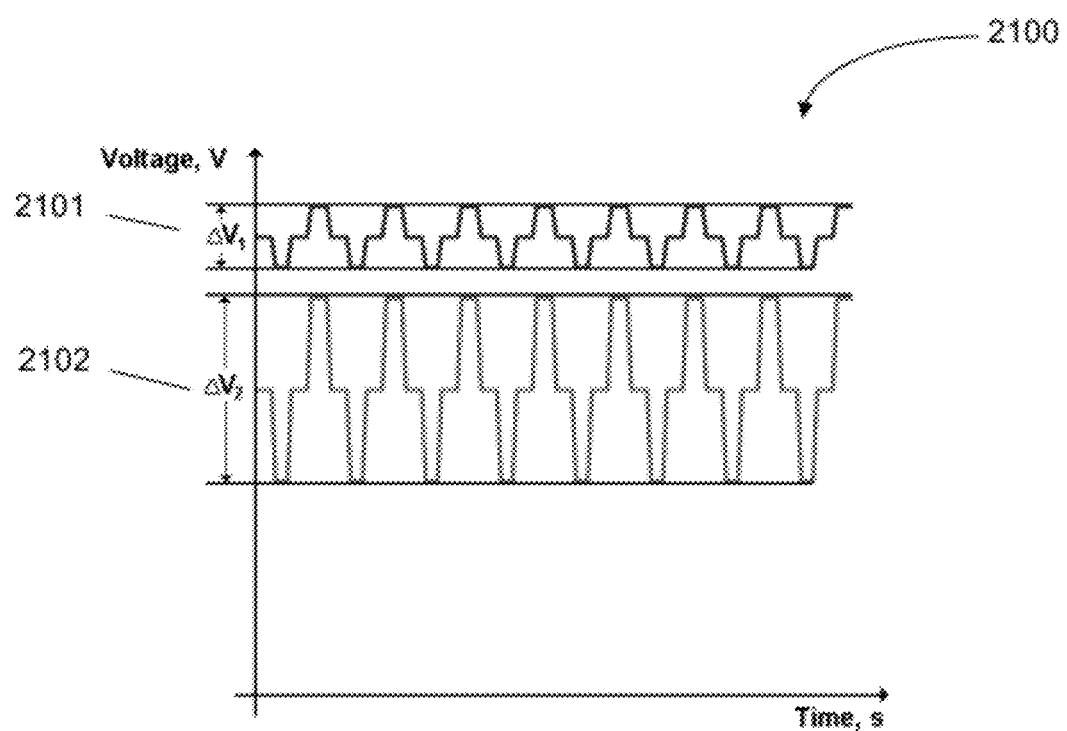
FIG. 21 illustrates exemplary solar module voltages for strong and weak solar modules.

FIG. 21 illustrates exemplary solar module voltages for strong and weak solar modules. Peaks and troughs are caused by changes in current on a string bus that the two solar modules are coupled to. Since the two solar modules may not operate at the same working point on the I-V curve, the resulting changes in voltage $dV_1$ (2101) and $dV_2$ (2102) may not be the same. Here, the stronger solar module has a smaller $dV_1$ (2101) since its working point corresponds to higher voltage and lower current. The weaker solar module has a larger $dV_2$ (2102) since its working point corresponds to lower voltage and higher current. By monitoring these voltage fluctuations, a controller or LMU can decrease the voltage, and increase the current of the weak solar modules in order to shift $dV_2$ towards $dV_1$.

In an embodiment, the LMU's (202a, 202b, ..., 202n) control the voltage and current provided to the string buses (205a, 205b, 205c) from the solar modules (201a, 201b, ... 201n). In an embodiment, one LMU may control the voltage and current output for more than one solar module (201a, 201b, ..., 201n). In an embodiment, the number of solar modules (201a, 201b, ..., 201n) may exceed the number of LMU's (202a, 202b, ..., 202n). For instance, LMU's (202a, 202b, ..., 202n) may only be used to control the current and voltage output from solar modules (201a, 201b, ..., 201n) identified as weak solar modules.

In an embodiment, a controller (204) may control the LMU's (202a, 202b, ..., 202n). The controller (204) may also monitor the string buses (205a, 205b, 205c) and the solar modules (201a, 201b, ... 201n) via the LMU's (202a, 202b, ..., 202n). Data regarding the solar modules (201a, 201b, ... 201n) and LMU's (202a, 202b, ..., 202n) can be transmitted via the string buses (205a, 205b, 205c) to the controller (204). In an embodiment, the controller (204) can transmit instructions or commands to the LMU's (202a, 202b, ..., 202n) via the string buses (205a, 205b, 205c). In another embodiment, the controller (204) can perform the above-noted communications with the LMU's (202a, 202b, ..., 202n) via wireless communication paths. The controller (204) may also be in communication with the inverter (203). In the illustrated embodiment, the controller (204) is a standalone device. However, in other embodiments, the controller (204) may be a part of other devices (e.g., the inverter (203), or LMU's (202a, 202b, ..., 202n). In an embodiment, the controller (204) can be a part of one of the LMU's (202a, 202b, ..., 202n). The algorithm for a single string of solar modules 201a, 201b, ... 201n may be embedded as software and/or hardware in controllers inside one or more of the LMUs 202a, 202b, ..., 202n, discussed above. Such an exemplary algorithm consists of the steps shown below:
- (a) Identify one or more strong modules or panel(s) (201a, 201b, ..., 201n). These panels should have 100% duty cycle and must not be adjusted on the following steps. At least one panel must be identified as strong. Delta voltages for these panels are very close to each other.
- (b) For every panel, calculate the difference between the minimum and the maximum panel voltage ($dV_i$) over a period of time.
- (c) Check ($dV_i$) for extreme values; invalidate all entries with potential measurement errors or non-patterned changes.
- (d) Calculate the average delta voltage for strong panels ($dV_1$).
- (e) Adjust the PWM for all other panels. The PWM value is changed proportionally to the difference between $dV_1$ and $dV_i$ (decrease if $dV_i > dV_1$, increase otherwise).
- (f) One may wait some time to allow the inverter to run several MTTP cycles or do the above continuously.
- (g) If a strong panel is noted to be weaker, or a timeout expires, go to step (a).
- (h) Go to step (b).

In an embodiment, operation of the controller (204) can be based on historical current and voltage data to help in pattern identification. For example, where the controller (204) notices that certain solar modules (201a, 201b, ..., 201n) become weak solar modules (201a, 201b, ..., 201n) at a specified time every day, this may be an indication of an object casting a predictable shadow over those solar modules (201a, 201b, ..., 201n). As a result, instructions can be sent to the affected LMU's (202a, 202b, ..., 202n) at the time when those LMU's (202a, 202b, ..., 202n) regularly become weak.

Balancing current outputs of string buses (205a, 205b, 205c) will now be discussed in more depth. Although solar module (201a, 201b, ... 201n) output current can be balanced on each string bus as described above, each string bus (205a, 205b, 205c) may produce different voltages (i.e., weak string buses may produce less-than-ideal or less-than-maximum voltages).

Figure 23:
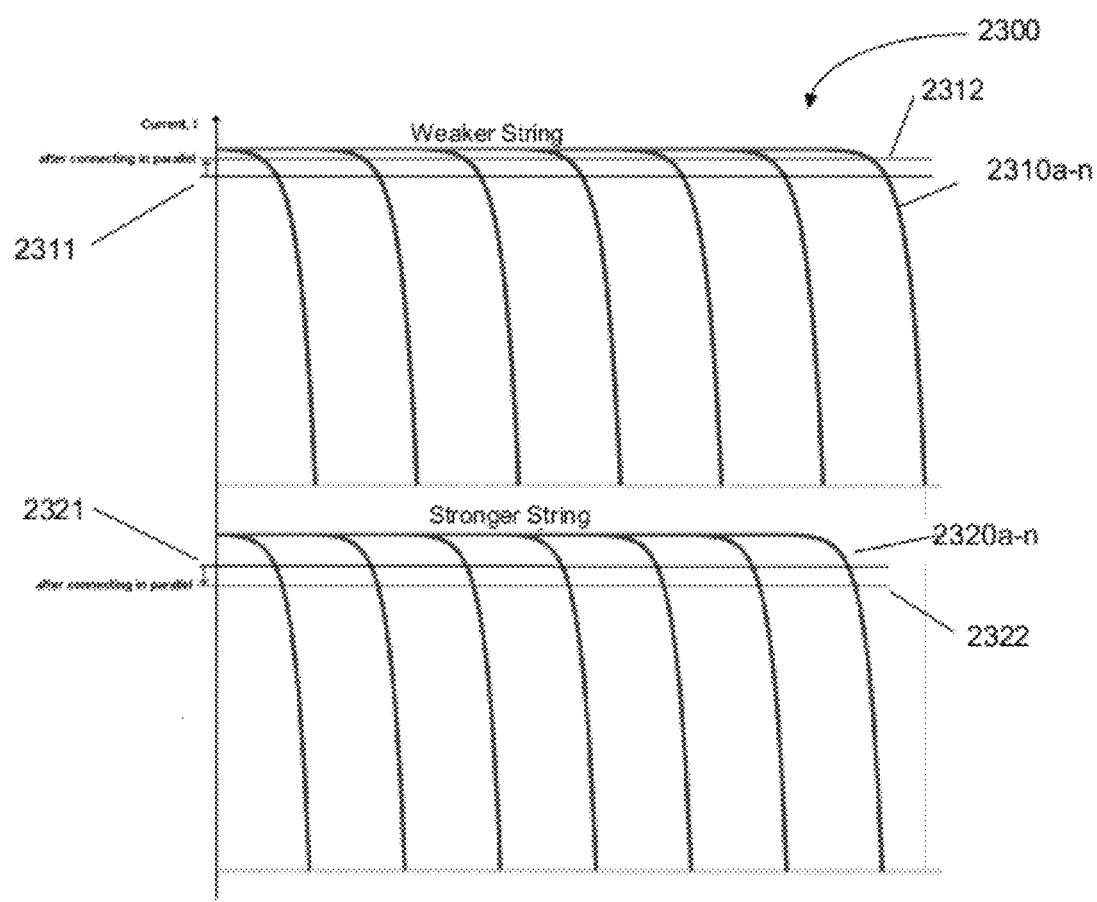
FIG. 23 illustrates exemplary plots of current changes seen on two string buses when connected in parallel.

Since string buses (205a, 205b, 205c) may be connected in parallel, the voltages produced by the string buses (205a, 205b, 205c) may converge. This voltage convergence causes the working points of the solar modules (201a, 201b, ... 201n) in each string bus (205a, 205b, 205c) to change. FIG. 23 shows exemplary plots of the resulting change in current seen on two string buses when connected in parallel. The stronger string sees a decrease in current while the weak string sees an increase in current.

In an embodiment, varying the voltage of the string buses in the solar array involves varying the current drawn from the string buses (205a, 205b, 205c) or varying an impedance seen by the string buses (205a, 205b, 205c). For instance, an inverter (203) connected to the string buses (205a, 205b, 205c) can vary the impedance that the string buses (205a, 205b, 205c) see, and in doing so the current and voltage produced by the solar modules (201a, 201b, ... 201n) on the string bus (205a, 205b, 205c) will change. In other words, changing the impedance changes where on the I-V curve each string bus (205a, 205b, 205c), and the solar modules (201a, 201b, ... 201n) on each string bus, (205a, 205b, 205c) operate at. A change in voltage on the string buses (205a, 205b, 205c) causes a change in the current output from each of the string buses (205a, 205b, 205c). However, since the string buses (205a, 205b, 205c) may not operate at the same operating point on the I-V curve, the change in voltage will cause differing changes in current for some or all of the string buses (205a, 205b, 205c).

Figure 25:
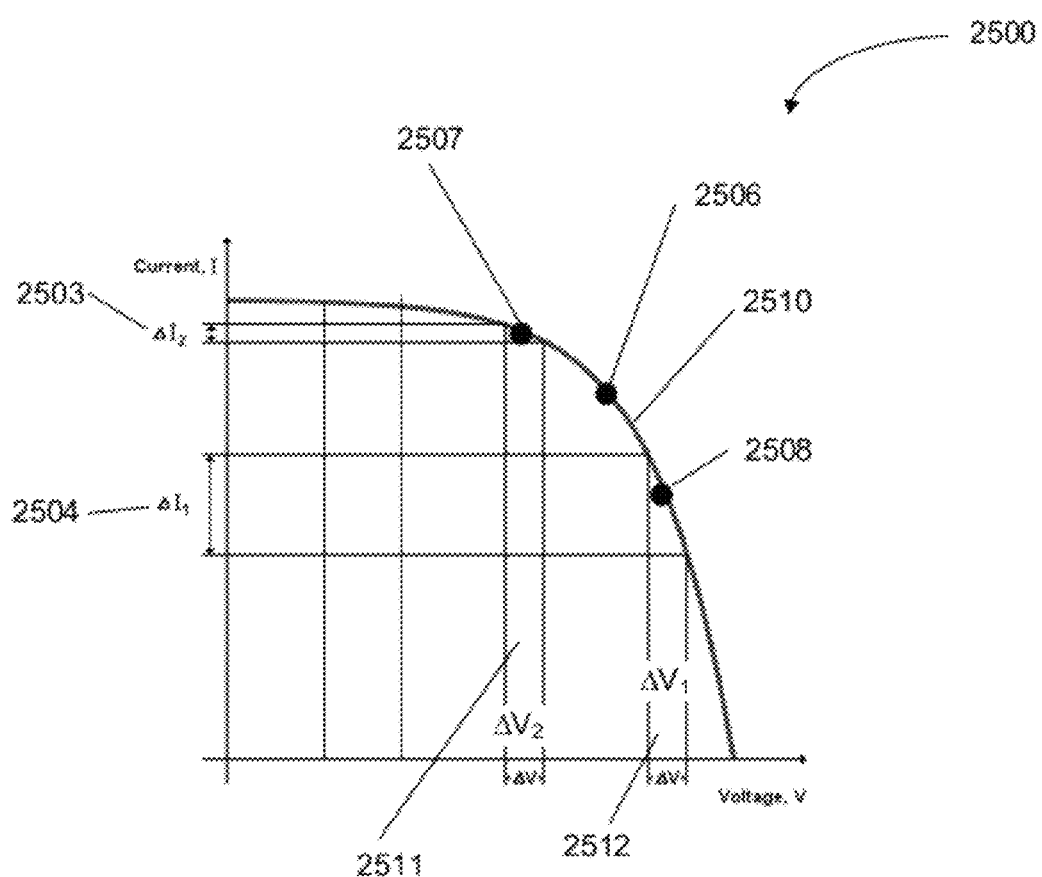
FIG. 25 illustrates an exemplary composite I-V curve for string buses in a solar array.

This can be seen in FIG. 25, which illustrates a composite I-V curve (2510) for string buses in the solar array (200). The I-V curve is not drawn to scale. An operating point for two different string buses can be seen in FIG. 25. Working point (2508) represents a weak string bus and working point (2507) represent a strong string bus. The variation in string bus voltage $dV_1$ (2512) is the same variation as seen for string bus voltage variation $dV_2$ (2511) since the string buses are connected in parallel. However, since the two string buses are at different working points on the I-V curve (2510), the resulting change in current $dI_1$ (2503) and $dI_2$ (2504) are not the same. The change in voltage $dI_2$ (2503) for the strong string bus is smaller than the change in voltage $dI_1$ (2504) for the weak string bus.

By comparing the change in currents $dI_1$, $dI_2$ one can determine which string buses (205a, 205b, 205c) to adjust. Adjusting string bus voltage output involves equally decreasing the voltage output of all solar modules on a string bus (205a, 205b, 205c), resulting in an increase of the current from the string bus (205a, 205b, 205c). In an embodiment, one or more weak string buses (205a, 205b, 205c) can be used as references such that all other string bus voltages are balanced with that of the one or more weak string buses (205a, 205b, 205c). In another embodiment, an average of weak string buses (205a, 205b, 205c) can be used as the reference. In an embodiment, an average of all string buses (205a, 205b, 205c) can be used as the reference.

Not all solar modules may be adjusted. For instance, if two or more string buses (205a, 205b, 205c) are producing about the same current, then those string buses (205a, 205b, 205c) can be used as references (the outputs from solar modules (201a, 201b, . . . 201n) on those string buses (205a, 205b, 205c) will not be changed). Solar module output currents on all other string buses (205a, 205b, 205c) can be such that the string bus output currents converge on the output from the reference string buses (205a, 205b, 205c).

Having identified weak string buses (205a, 205b, 205c), an average change in current $dI_w$ for the weak string buses (205a, 205b, 205c) can be determined. The average change in current $dI_w$ for the weak string buses (205a, 205b, 205c) can be a reference value. The change in current $dI_i$ for each strong string bus (205a, 205b, 205c) can be compared to the average change in current $dI_w$ for the weak string buses (205a, 205b, 205c). The difference between $dI_i$ for a string bus (205a, 205b, 205c) and $dI_w$ indicates by how much the string bus (205a, 205b, 205c) output current should be decreased in order to match the output current of the weak string buses (205a, 205b, 205c) (to push the strong string bus (205a, 205b, 205c) working point (2507) towards the weak string bus (205a, 205b, 205c) working point (2508).

For instance, and referring to FIG. 25, the weak string bus (205a, 205b, 205c) change in current (2503) $dI_2$ is greater than the strong string bus (205a, 205b, 205c) change in current (2504) $dI_1$. Thus, the strong string bus (205a, 205b, 205c) current could be increased, which would reduce the voltage. The string bus (205a, 205b, 205c) working point (2508) for the strong string bus (205a, 205b, 205c) would thus shift towards the working point (2507) of the weak string bus (205a, 205b, 205c). Similarly, the change in current $dI_i$ for each string bus (205a, 205b, 205c) can be compared to the average change in current of the weak string buses $dI_w$ and the current outputs for the strong string buses (205a, 205b, 205c) adjusted such that all the string buses (205a, 205b, 205c) in the solar array (200) have working points that converge on those of the weak string buses. The end result may preferably be working points that are proximal for all string buses (205a, 205b, 205c)—balanced or near balanced current outputs. An indication that balancing has been achieved and that the string buses (205a, 205b, 205c) are operating at nearly identical working points on the I-V curve, is that a variation in the voltage for all string buses (205a, 205b, 205c) will cause a nearly equivalent change in current for each string bus (205a, 205b, 205c).

In an embodiment, before weak string bus (205a, 205b, 205c) outputs are adjusted, one or more weak string buses (205a, 205b, 205c) can be disconnected from the other string buses (205a, 205b, 205c) to determine if disconnecting the one or more weak string buses (205a, 205b, 205c) increases the power output from the solar array (200).

The inverter (203) can convert the direct current (DC) outputs from the string buses (205a, 205b, 205c) to an alternating current (AC) output that can be supplied, for example to a power grid or other load (e.g., a home or business). The inverter (203) can control the current and voltage drawn from the string buses (205a, 205b, 205c), and thus control where on the I-V curve the string buses (205a, 205b, 205c) operate at. For instance, as the inverter (203) can increase impedance seen by the solar array (200), which will cause the current drawn from the string buses (205a, 205b, 205c) to decrease and the voltage to increase, and the working point will shift along the I-V curve to the right towards where the I-V curve meets the x-axis (voltage). Thus, if the string buses (205a, 205b, 205c) are operating at a working point having a higher current and lower voltage than the MPP for the solar array (200), then the inverter (203) may increase the impedance causing the string bus (205a, 205b, 205c) working points to shift towards the MPP. Balancing can be carried out via the methods described with reference to FIG. 26.

Figure 20:
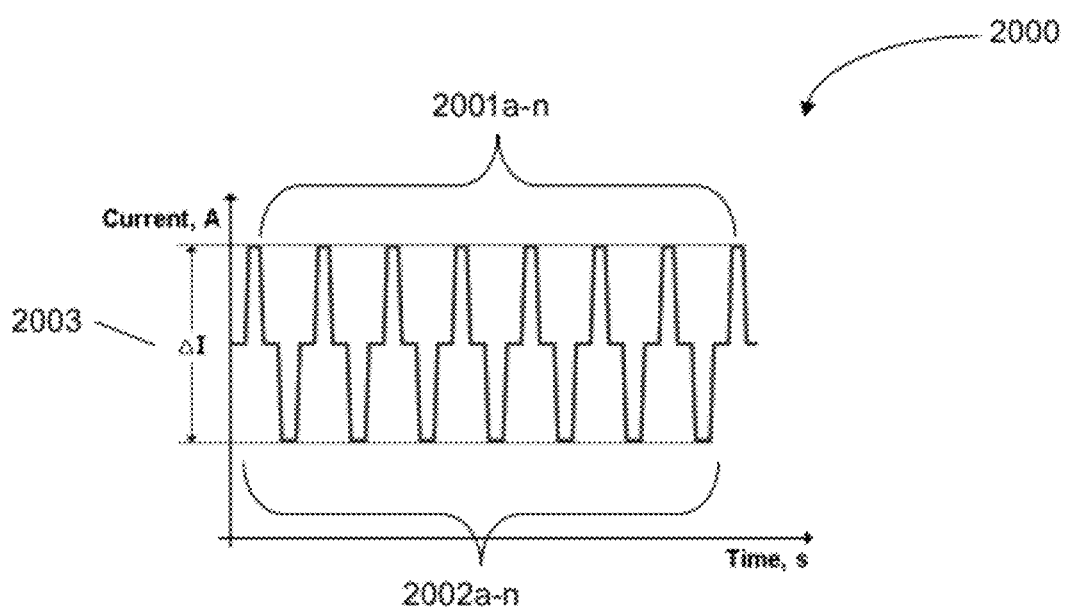
FIG. 20 illustrates an exemplary inverter current controlled by a maximum power point tracking algorithm.

FIG. 20 illustrates an exemplary inverter current controlled by a maximum power point tracking algorithm. Such a current may occur when a solar array is connected to an MPPT-enabled inverter such as, but not limited to, SB300 made by SMA America, Inc., and IG2000 made by Fronius USA, LLC. A typical MPPT algorithm pulls and pushes the current (2003) in the solar array (for example, by increasing and decreasing the impedance seen by the solar array) causing I to fluctuate into peak current spikes (2001a-n) and valley current spikes (2002a-n). These fluctuations cause solar module voltage fluctuations. These fluctuations can be used to determine the MPP for solar modules.

Figure 24:
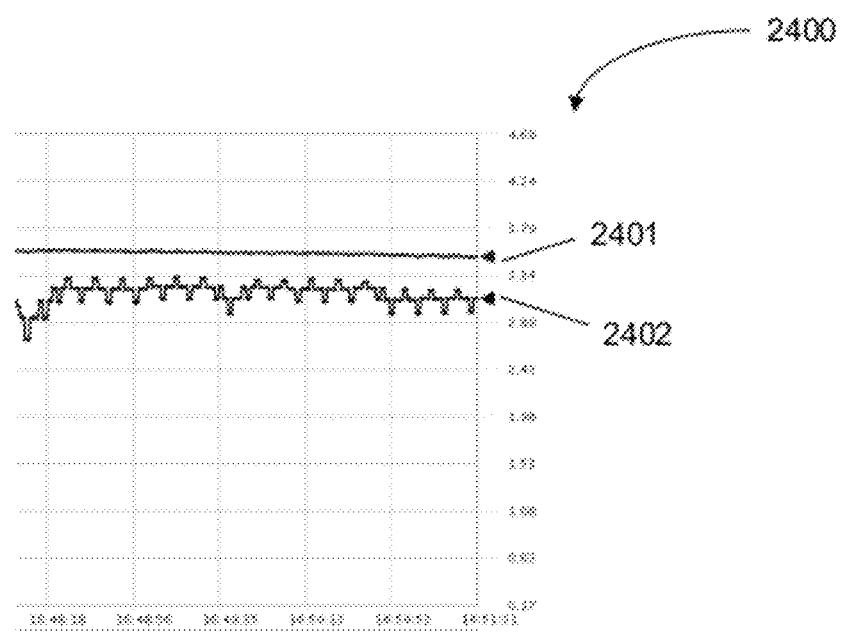
FIG. 24 illustrates an exemplary current versus time diagram for a stronger and weaker string bus when the voltage to the string buses fluctuates.

FIG. 24 illustrates an exemplary current versus time diagram for a stronger and weaker string bus when the voltage to the string buses fluctuates. The stronger string bus has a smaller current change (2401) since the working point is closer to the closed-circuit current (where the I-V curve meets the Y-axis). The weaker string bus has a larger current change (2402) since the working point is closer to the open-circuit voltage (where the I-V curve meets the X-axis).

Figure 26:
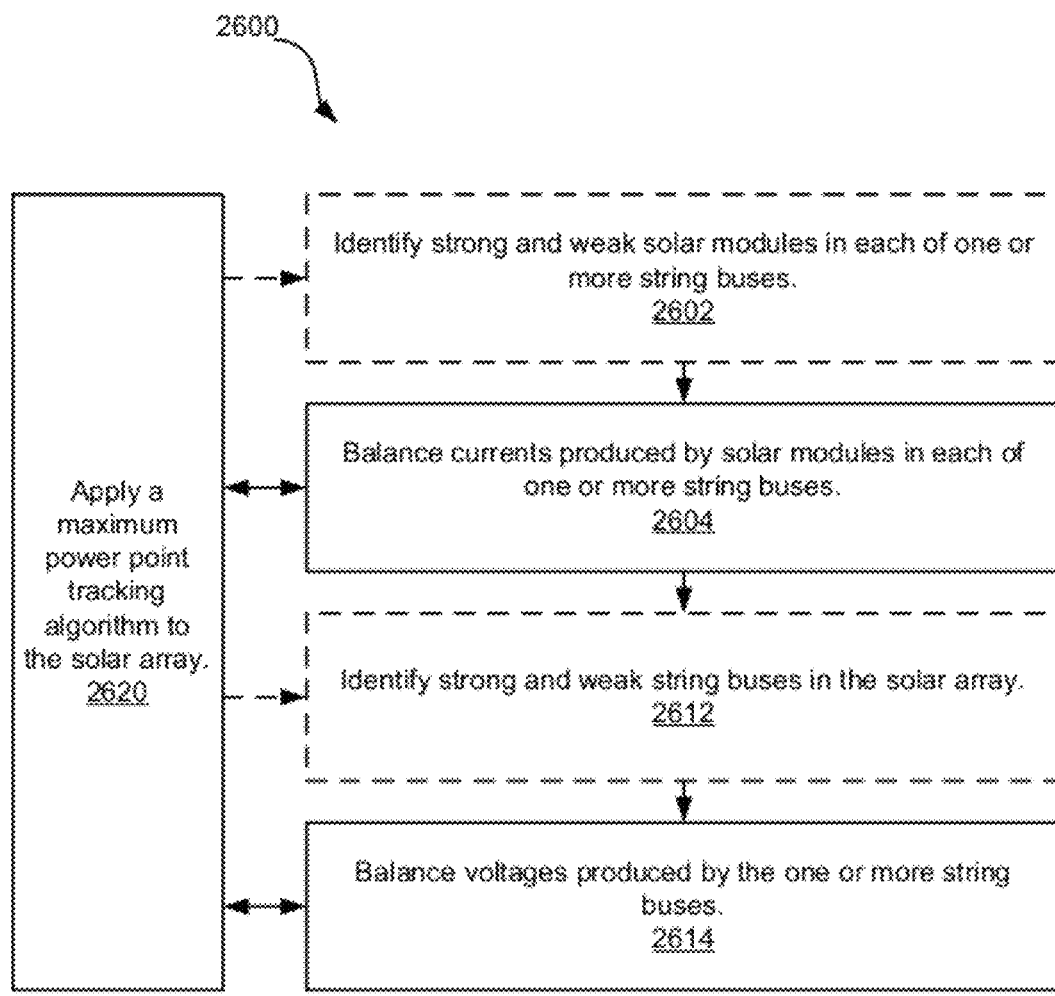
FIG. 26 illustrates an embodiment of a method of maximizing the power output of a solar array by (1) balancing current outputs of solar modules, (2) balancing voltage outputs of string buses, and (3) applying an MPPT algorithm to the solar array.

FIG. 26 illustrates an embodiment of a method (2600) of maximizing the power output of a solar array by (1) balancing current outputs of solar modules, (2) balancing voltage outputs of string buses, and (3) applying an MPPT algorithm to the solar array. The method (2600) may also maximize power by identifying strong and weak solar modules before balancing current outputs of solar modules and by identifying strong and weak string buses before balancing voltage outputs of string buses. The method (2600) can be carried out via an optional first identify operation (2602), a first balance operation (2604), an optional second identify operation (2612), a second balance operation (2614), and an apply operation (2620).

The order that balancing operations and the applying operation occur in can vary. For instance, currents produced by solar modules in each of one or more string buses may be balanced in a first balance operation (2604). Voltages produced by the one or more string buses may then be balanced in a second balance operation (2614). An MPPT algorithm may then be applied to the solar array in an apply operation (2620). In another embodiment, the method (2600) may begin with the first balance operation (2604) followed by one or more loops of the apply operation (2620). The second balance operation (2614) may then occur followed by one or more further loops of the apply operation (2620). It should be understood that the first and second balance operations (2604, 2614) and the apply operation (2620) can operate in any order or pattern, with each operation repeating one or more times before another operation operates. The first and second balance operation (2604, 2614) can pause between operations to allow the apply operation (2620) to repeat numerous times. In an embodiment, the balance operations (2604, 2614) can run simultaneously with the apply operation (2620). In an embodiment, the applying an MPPT algorithm is not a part of the method (2600). Rather, the method (2600) may merely include balancing the solar modules and the string buses.

As noted above, the method (2600) includes the balance currents produced by solar modules in each of one or more string buses operation (2604). The solar modules may be connected by a string bus of the solar array, for instance in series. In an embodiment, balancing involves (1) varying the current on the string bus, (2) monitoring changes in voltage output for each solar module on the string bus, (3) comparing the monitored changes in voltage output for the solar modules on the string bus, and (4) adjusting the current output of one or more of the solar modules such that the current outputs from all solar modules on the string bus converge (see FIG. 29).

In an embodiment, before the first balance operation (2604), strong and weak solar modules can be identified via a first identify operation (2602). The first identify operation (2602) identifies, for each string bus, one or more strong solar modules and one or more weak solar modules. Weak solar modules can be adjusted such that their outputs converge on those of the strong solar modules.

In an embodiment, the first identify operation (2602) may be carried out by: (1) varying the current on the string bus (or impedance seen by the string bus), (2) monitoring changes in voltage output for each solar module, and (3) comparing the changes in voltage output. Strong solar modules may be those having the smallest change in voltage. Strong solar modules may also be characterized as operating at relatively the same current (indicated by similar changes in voltage). Strong solar modules may be those having working points furthest to the right on the I-V curve (e.g., working point (2201) in FIG. 22).

Having identified strong solar modules, an average change in voltage $dV_s$ for the strong solar modules can be determined. The average change in voltage $dV_s$ for the strong solar modules can be a reference value. The change in voltage $dV_i$ for each solar module can be compared to the average change in voltage $dV_s$ for the strong solar modules. The difference between $dV_i$ for a solar module and $dV_s$ indicates by how much the solar module output current should be decreased in order to match the output current of the strong solar modules (to push the weak solar module working point (2202) towards the working point (2201) of the strong solar modules).

In an embodiment, once the first identify and balance operations (2602, 2604) have been performed, strong and weak solar modules can again be identified via the first identify operation (2602). This may be done since some strong solar modules may have become weak while the weak solar modules were being adjusted. If a weak solar module is identified that was previously a strong solar module, then its current output may be adjusted in the next loop of the first balance operation (2604).

The method (2600) may also include a second balance operation (2614). In an embodiment, the second balance operation (2614) includes (1) varying the voltage of the string buses in the solar array, (2) monitoring changes in current of each string bus, (3) comparing the monitored changes in current, and (4) adjusting the voltage output of the string buses (by changing the voltage output of all solar modules in a string bus) such that the string bus output voltages converge (see FIG. 32).

In an embodiment, before the second balance operation (2614), strong and weak string buses can be identified via a second identify operation (2612). The second identify operation (2612) identifies strong and weak string buses in the solar array. Strong string buses can be adjusted such that their outputs converge on those of the weak string buses. In an embodiment, the second identify operation (2612) may be carried out by: (1) varying impedance seen by the string buses (or the voltage on the string buses), (2) monitoring changes in current output for each string bus, and (3) comparing the changes in current output. Weak string buses may be those having the smallest change in current. Weak string buses may also be characterized as operating at relatively the same current (indicated by similar changes in current). Weak string buses may be those having working points furthest towards the left of the I-V curve (e.g., working point (2507) in FIG. 25).

The method (2600) also includes an apply operation (2620) wherein the maximum power point tracking algorithm is applied. Maximum power point tracking (MPPT) is a procedure or algorithm used to determine the maximum power point (MPP) of a system—in this case the maximum power point of a solar array (see, e.g., "Maximum power" in FIG. 22 and working point (2506) in FIG. 25). In other words, an MPPT algorithm can adjust the current and voltage produced by the solar array until the voltage times current is maximized. A variety of algorithms and devices can be used to carry out MPPT. For instance, in an embodiment, an inverter connected to an output of the solar array can change the impedance that the solar array sees, thus causing the voltage and current produced by the solar array to change. By sweeping or fluttering the impedance over one or more ranges of values, an MPPT algorithm can determine what impedance corresponds with the MPP, and set the impedance to that value such that the solar array operates at the MPP. In another embodiment, MPPT can include the steps of (1) adjusting the impedance that the solar array sees (or adjusting the solar array voltage or causing the working point to move along the I-V curve), (2) monitoring the solar array's reaction to the adjusting impedance (or current or working point), (3) continuing to adjust the impedance (or current or working point) and monitoring the solar array's response, (4) based on the monitoring, determine a maximum power point for the solar array, and (5) set the impedance (or current or working point) to a value that corresponds to the solar array's MPP.

The apply operation (2620) can operate after either of the balance operations (2604, 2614). The apply operation (2620) can also operate after any number of repetitions or loops of either or both of the balance operations (2604, 2614). In an embodiment, the apply operation 2620 may operate after any number of repetitions or loops of the first identify operation (2602) and the first balance operation (2604); after any number of repetitions or loops of the second identify operation (2612) and the second balance operation (2614); and after any number of repetitions or loops of a combination of the first and second identify and apply operations (2602, 2604, 2612, 2614). For instance, strong and weak solar modules in each of one or more string buses can be identified in the first identify operation (2602). Currents produced by solar modules in each of the one or more string buses may be balanced in the first balance operation (2604). Strong and weak string buses in each of the one or more string buses can be identified in the second identify operation (2612). Voltages produced by the one or more string buses may then be balanced in the second balance operation (2614). An MPPT algorithm may then be applied to the solar array in the apply operation (2620).

In another embodiment, the method (2600) may begin with the first identify operation (2602) and the first balance operation (2604) followed by one or more loops of the apply operation (2620). The second identify operation (2612) and the second balance operation (2614) may then occur followed by one or more further loops of the apply operation (2620). It should be understood that the first and second identify operation (2602, 2612), the first and second balance operations (2604, 2614), and the apply operation (2620) can operate in any order or pattern, with each operation repeating one or more times. In an embodiment, the apply operation (2620) can operate multiple times before the first or second identify operations (2602, 2612) resume. Alternatively, the identify and balance operations (2602, 2604, 2612, 2614) can run simultaneously with the apply operation (2620). In an embodiment, the applying an MPPT algorithm is not a necessary part of the method (2600). Rather, the method (2600) may merely include balancing the solar modules and the string buses.

It is clear that many modifications and variations of this embodiment may be made by one skilled in the art without departing from the spirit of the novel art of this disclosure. For example, the systems and method herein disclosed may be applied to energy generating systems besides solar photovoltaics (e.g., windmills, water turbines, hydrogen fuel cells). These modifications and variations do not depart from the broader spirit and scope of the invention, and the examples cited here are to be regarded in an illustrative rather than a restrictive sense.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A solar array comprising:
    a plurality of string buses connected in parallel in the solar array;
    a plurality of solar modules, wherein
        each respective solar module of the solar modules has a local management unit configured to provide, to one of the string buses, electrical power generated by the respective solar module, and
        each respective string bus of the string buses connects in series electrical power provided by local management units of a subset of the solar modules in the respective string bus;
    a controller configured to communicate with local management units of the solar modules to:
        adjust current-voltage output characteristics of at least one solar module in the respective string bus to cause the at least one solar module to have a maximum module current output that matches with maximum module current outputs of the other solar modules in the respective string bus; and
        adjust current-voltage output characteristics of at least one string bus to cause the at least one string bus to have a maximum string voltage output that matches with maximum string voltage outputs of the other string buses connected in parallel in the solar array; and
    a maximum power point tracker coupled with the string buses to receive electrical power from the string buses in parallel, the maximum power point tracker configured to track a maximum power point of the plurality of string buses by varying a current passing through the maximum power point tracker at a time when the solar modules in the respective string bus are configured via the local management units to have the maximum module current output in current-voltage output characteristics and the string buses in the solar array are configured via the local management units to have the maximum string voltage output in current-voltage output characteristics.

2. The solar array of claim 1, wherein the controller is part of one of the local management units of the solar modules.

3. The solar array of claim 1, wherein an operation of the controller is based on historical current and voltage data.

4. The solar array of claim 1, wherein the respective solar module of the solar modules provides, via the local management unit, the electrical power generated by the respective solar module solely to the respective string bus.

5. A method of operating a plurality of solar modules, the method comprising:
    communicating, by a controller, with local management units of the plurality of solar modules in a plurality of string buses, the string buses connected in parallel in a solar array, wherein
        each respective solar module of the solar modules has a local management unit configured to provide, to one of the plurality of string buses, electrical power generated by the respective solar module,
        each respective string bus of the string buses connects in series electrical power provided by local management units of a subset of the solar modules in the respective string bus, and
        a maximum power point tracker is coupled with the string buses to receive electrical power from the plurality of string buses in parallel, the maximum power point tracker configured to track a maximum power point of the plurality of string buses;
    wherein the communicating includes:
        communicating with the local management units of the solar modules to adjust current-voltage output characteristics of at least one solar module in the respective string bus to cause the at least one solar module to have a maximum module current output that matches with maximum module current outputs of the other solar modules in the respective string bus; and
        communicating with the local management units of the solar modules to adjust current-voltage output characteristics of at least one string bus to cause the at least one string bus to have a maximum string voltage output that matches with maximum string voltage outputs of the other string buses connected in parallel in the solar array;
    wherein the maximum power point tracker tracks the maximum power point of the plurality of string buses by varying a current passing through the maximum power point tracker at a time when the solar modules in the respective string bus are configured via the local management units to have the maximum module current output in current-voltage output characteristics and the string buses in the solar array are configured via the local management units to have the maximum string voltage output in current-voltage output characteristics.

6. The method of claim 5, further comprising applying by the maximum power point tracker, a maximum power point tracking algorithm to the plurality of string buses as a whole.

7. The method of claim 5, wherein the respective solar module of the solar modules provides, via the local management unit, the electrical power generated by the respective solar module solely to the respective string bus.

8. A method of operating a plurality of solar modules, the method comprising:
    communicating, by a controller, with local management units of the plurality of solar modules connected in a string bus, wherein
        each respective solar module of the solar modules has a local management unit configured to provide electrical power generated by the respective solar module to the string bus,
        the string bus connects in series electrical power provided by local management units in the string bus, and
        a maximum power point tracker is coupled with the string bus to receive electrical power from the string bus, the maximum power point tracker configured to track a maximum power point of a solar array including the string bus;

wherein the communicating includes:
    communicating with the local management units of the solar modules to adjust current-voltage output characteristics of at least one of the solar modules in the string bus to cause the at least one solar module to have a maximum module current output that matches with maximum module current outputs of the other solar modules connected in the string bus;

wherein the maximum power point tracker tracks the maximum power point of a solar array including the string bus by varying a current passing through the maximum power point tracker at a time when the solar modules in the string bus are configured via the local management units to have the maximum module current output in current-voltage output characteristics.

9. The method of claim 8, wherein the respective solar module of the solar modules provide via the local management unit, the electrical power generated by the respective solar module solely to the string bus.

10. A solar array comprising:
    a plurality of solar modules, each of the solar modules having a local management unit;
    a string bus configured to receive electrical power generated by the solar modules via series-connected local management units of the solar modules; and
    a controller configured to communicate with the local management units of the solar modules to balance currents produced by the solar modules via adjusting current-voltage output characteristics of at least one of the solar modules in the string bus to have a matching maximum module current output with the other solar modules connected in the string bus;

wherein each of the solar modules provides electrical energy only to the string bus via a corresponding one of the series-connected local management units.

11. The solar array of claim 10, wherein the local management units control voltage outputs from the solar modules.

12. A solar array system having a plurality of solar modules, the system comprising:
    a plurality of string buses, each respective string bus of the plurality of string buses configured to receive electrical power from at least one solar module, wherein each respective solar module of the plurality of solar modules includes a local management unit configured to provide electrical power generated by the respective solar module to the respective string bus;
    a maximum power point tracker coupled with the plurality of string buses to receive electrical power from the string buses in parallel; and
    a controller configured to communicate with local management units of the solar modules to adjust current-voltage output characteristics of at least one of the string buses to have a matching maximum string voltage output with the other string buses in the plurality of string buses.

13. The solar array system of claim 12, wherein the respective solar module of the plurality of solar modules provides, via the local management unit, the electrical power generated by the respective solar module solely to the respective string bus.

* * * * *